United States Patent
Kurokawa et al.

(10) Patent No.: US 9,286,848 B2
(45) Date of Patent: Mar. 15, 2016

(54) METHOD FOR DRIVING LIQUID CRYSTAL DISPLAY DEVICE

(75) Inventors: Yoshiyuki Kurokawa, Sagamihara (JP); Takayuki Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 286 days.

(21) Appl. No.: 13/160,865

(22) Filed: Jun. 15, 2011

(65) Prior Publication Data
US 2012/0001878 A1 Jan. 5, 2012

(30) Foreign Application Priority Data

Jul. 1, 2010 (JP) .................................. 2010-150885
Jul. 1, 2010 (JP) .................................. 2010-150908
Sep. 3, 2010 (JP) .................................. 2010-197806

(51) Int. Cl.
*G09G 3/36* (2006.01)
*G06F 3/042* (2006.01)
(Continued)

(52) U.S. Cl.
CPC .............. *G09G 3/3677* (2013.01); *G06F 3/042* (2013.01); *G06F 3/0412* (2013.01);
(Continued)

(58) Field of Classification Search
CPC . G09G 3/3677; G09G 3/3688; G09G 3/3655; G09G 3/3413; G09G 2320/0242; G09G 2310/02018; G09G 2310/0235; G09G 2300/0426; G09G 2310/0205; G09G 2320/0241; H01L 29/7869; G06F 3/0412; G06F 3/042

USPC ............. 345/87–90, 102–103, 104, 175, 204, 345/690, 173, 207; 348/285; 349/96
See application file for complete search history.

(56) References Cited

U.S. PATENT DOCUMENTS 5,128,782 A 7/1992 Wood
5,225,823 A 7/1993 Kanaly
(Continued)

FOREIGN PATENT DOCUMENTS

EP 0571214 A 11/1993
EP 2151811 A 2/2010
(Continued)

OTHER PUBLICATIONS

Baron et al., "36.4: Can Motion Compensation Eliminate Color Breakup of Moving Objects in Field-Sequential Color Displays?" SID Digest '96: SID International Symposium Digest of Technical Papers, 1996, vol. 27, pp. 843-846.
(Continued)

*Primary Examiner* — Matthew Fry
(74) *Attorney, Agent, or Firm* — Eric J. Robinson; Robinson Intellectual Property Law Office, P.C.

(57) ABSTRACT

In a field-sequential liquid crystal display device, image quality and detection accuracy in image capture are improved by increasing the frequency of input of image signals and securing a sufficient imaging period. Image signals are concurrently supplied to pixels provided in a plurality of rows among pixels arranged in matrix. Further, image capture is concurrently performed in pixels provided in a plurality of rows among pixels arranged in matrix. Thus, the frequency of input of an image signal to each pixel of the liquid crystal display device can be increased and a sufficient imaging period can be secured. As a result, in the liquid crystal display device, display deterioration such as color break which is caused in a field-sequential liquid crystal display device can be suppressed and improvements in image quality and detection accuracy in image capture can be realized.

12 Claims, 43 Drawing Sheets

(51) Int. Cl.
*G06F 3/041* (2006.01)
*G09G 3/34* (2006.01)
*H01L 29/786* (2006.01)

(52) U.S. Cl.
CPC ........... *G09G 3/3688* (2013.01); *G09G 3/3413* (2013.01); *G09G 3/3655* (2013.01); *G09G 2300/0426* (2013.01); *G09G 2310/0205* (2013.01); *G09G 2310/0218* (2013.01); *G09G 2310/0235* (2013.01); *G09G 2320/0242* (2013.01); *H01L 29/7869* (2013.01)

(56) References Cited

U.S. PATENT DOCUMENTS

| | | | |
|---|---|---|---|
| 5,337,068 A | | 8/1994 | Stewart et al. |
| 5,416,496 A | | 5/1995 | Wood |
| 5,585,817 A | | 12/1996 | Itoh et al. |
| 5,977,942 A | | 11/1999 | Walker et al. |
| 6,229,516 B1 | * | 5/2001 | Kim et al. ..................... 345/103 |
| 6,243,069 B1 | | 6/2001 | Ogawa et al. |
| 6,448,951 B1 | * | 9/2002 | Sakaguchi et al. ............. 345/88 |
| 6,570,554 B1 | | 5/2003 | Makino et al. |
| 6,590,553 B1 | | 7/2003 | Kimura et al. |
| 6,597,348 B1 | | 7/2003 | Yamazaki et al. |
| 6,873,311 B2 | | 3/2005 | Yoshihara et al. |
| 6,882,012 B2 | | 4/2005 | Yamazaki et al. |
| 6,903,731 B2 | | 6/2005 | Inukai |
| 7,113,164 B1 | | 9/2006 | Kurihara |
| 7,145,536 B1 | | 12/2006 | Yamazaki et al. |
| 7,161,573 B1 | | 1/2007 | Takatori et al. |
| 7,193,593 B2 | | 3/2007 | Koyama et al. |
| 7,224,339 B2 | | 5/2007 | Koyama et al. |
| 7,268,756 B2 | | 9/2007 | Koyama et al. |
| 7,317,438 B2 | | 1/2008 | Yamazaki et al. |
| 7,362,304 B2 | | 4/2008 | Takatori et al. |
| 7,385,579 B2 | | 6/2008 | Satake |
| 7,403,177 B2 | | 7/2008 | Tanada et al. |
| 7,425,937 B2 | | 9/2008 | Inukai |
| 7,564,443 B2 | | 7/2009 | Takatori et al. |
| 7,652,648 B2 | | 1/2010 | Takatori et al. |
| 7,702,705 B2 | | 4/2010 | Suzuki |
| 7,773,066 B2 | | 8/2010 | Yamazaki et al. |
| 7,791,571 B2 | | 9/2010 | Ohtani et al. |
| 7,834,830 B2 | | 11/2010 | Yamazaki et al. |
| 7,855,770 B2 | | 12/2010 | Egi et al. |
| 7,941,471 B2 | | 5/2011 | Katz et al. |
| 8,797,304 B2 | | 8/2014 | Koyama et al. |
| 8,907,881 B2 | * | 12/2014 | Koyama .............. G06F 1/13452 345/211 |
| 2002/0000960 A1 | | 1/2002 | Yoshihara et al. |
| 2002/0044140 A1 | | 4/2002 | Inukai |
| 2002/0075249 A1 | | 6/2002 | Kubota et al. |
| 2004/0008172 A1 | * | 1/2004 | Nakamura ............ G06F 3/0412 345/89 |
| 2004/0056831 A1 | | 3/2004 | Takatori et al. |
| 2004/0113906 A1 | | 6/2004 | Lew et al. |
| 2004/0257324 A1 | | 12/2004 | Hsu |
| 2005/0012097 A1 | | 1/2005 | Yamazaki |
| 2005/0275616 A1 | * | 12/2005 | Park ..................... G06F 3/0412 345/102 |
| 2006/0007102 A1 | | 1/2006 | Yasuoka et al. |
| 2006/0214892 A1 | * | 9/2006 | Harada ................ G06F 3/0412 345/81 |
| 2007/0120810 A1 | * | 5/2007 | You ..................... G09G 3/3666 345/103 |
| 2007/0139354 A1 | | 6/2007 | Kim et al. |
| 2007/0216616 A1 | | 9/2007 | Stessen |
| 2007/0279359 A1 | | 12/2007 | Yoshida et al. |
| 2007/0279374 A1 | | 12/2007 | Kimura et al. |
| 2008/0121442 A1 | * | 5/2008 | Boer et al. ................. 178/18.09 |
| 2008/0158140 A1 | | 7/2008 | Takatori et al. |
| 2008/0238336 A1 | | 10/2008 | Peng et al. |
| 2009/0028460 A1 | | 1/2009 | Jung et al. |
| 2009/0096724 A1 | | 4/2009 | Ichikawa et al. |
| 2009/0167670 A1 | | 7/2009 | Peng et al. |
| 2009/0219243 A1 | | 9/2009 | Chen |
| 2009/1023700 | | 9/2009 | Ploquin et al. |
| 2009/0321737 A1 | | 12/2009 | Isa et al. |
| 2010/0148177 A1 | | 6/2010 | Koyama et al. |
| 2010/0149084 A1 | | 6/2010 | Chida |
| 2010/0182282 A1 | | 7/2010 | Kurokawa et al. |
| 2010/0235418 A1 | | 9/2010 | Dong |
| 2010/0238135 A1 | * | 9/2010 | Brown et al. ................. 345/175 |
| 2010/0321420 A1 | | 12/2010 | Ohtani et al. |
| 2011/0001725 A1 | | 1/2011 | Kurokawa |
| 2011/0025729 A1 | | 2/2011 | Yamazaki et al. |
| 2011/0051034 A1 | | 3/2011 | Egi et al. |
| 2011/0157216 A1 | | 6/2011 | Yamazaki et al. |
| 2011/0157253 A1 | | 6/2011 | Yamazaki et al. |
| 2011/0248970 A1 | | 10/2011 | Koyama et al. |
| 2011/0248978 A1 | | 10/2011 | Koyama et al. |
| 2011/0249037 A1 | | 10/2011 | Koyama et al. |
| 2011/0310132 A1 | | 12/2011 | Kurokawa et al. |
| 2014/0340365 A1 | | 11/2014 | Koyama et al. |

FOREIGN PATENT DOCUMENTS

| | | |
|---|---|---|
| JP | 05-323275 A | 12/1993 |
| JP | 11-008741 | 1/1999 |
| JP | 11-258573 A | 9/1999 |
| JP | 11-337904 | 12/1999 |
| JP | 2001-133746 A | 5/2001 |
| JP | 2006-178126 A | 7/2006 |
| JP | 2006-220685 A | 8/2006 |
| JP | 2006-227458 A | 8/2006 |
| JP | 2007-193362 A | 8/2007 |
| JP | 2009-042405 | 2/2009 |
| JP | 2010-061647 A | 3/2010 |
| WO | WO-2006/067750 | 6/2006 |

OTHER PUBLICATIONS

Kurita et al., "Evaluation and Improvement of Picture Quality for Moving Images on Field-sequential Color Displays," IDW '00: Proceedings of the 17th International Display Workshops, 2000, pp. 69-72.

Taira et al., "A 15" Field-Sequential Display without Color Break-Up using an AFLC Color Shutter," IDW '00: Proceedings of the 17th International Display Workshops, 2000, pp. 73-76.

Jarvenpaa, "7.2: Measuring Color Breakup of Stationary Images in Field-Sequential-Color Displays," SID Digest '04: SID International Symposium Digest of Technical Papers, 2004, vol. 35, pp. 82-85.

* cited by examiner

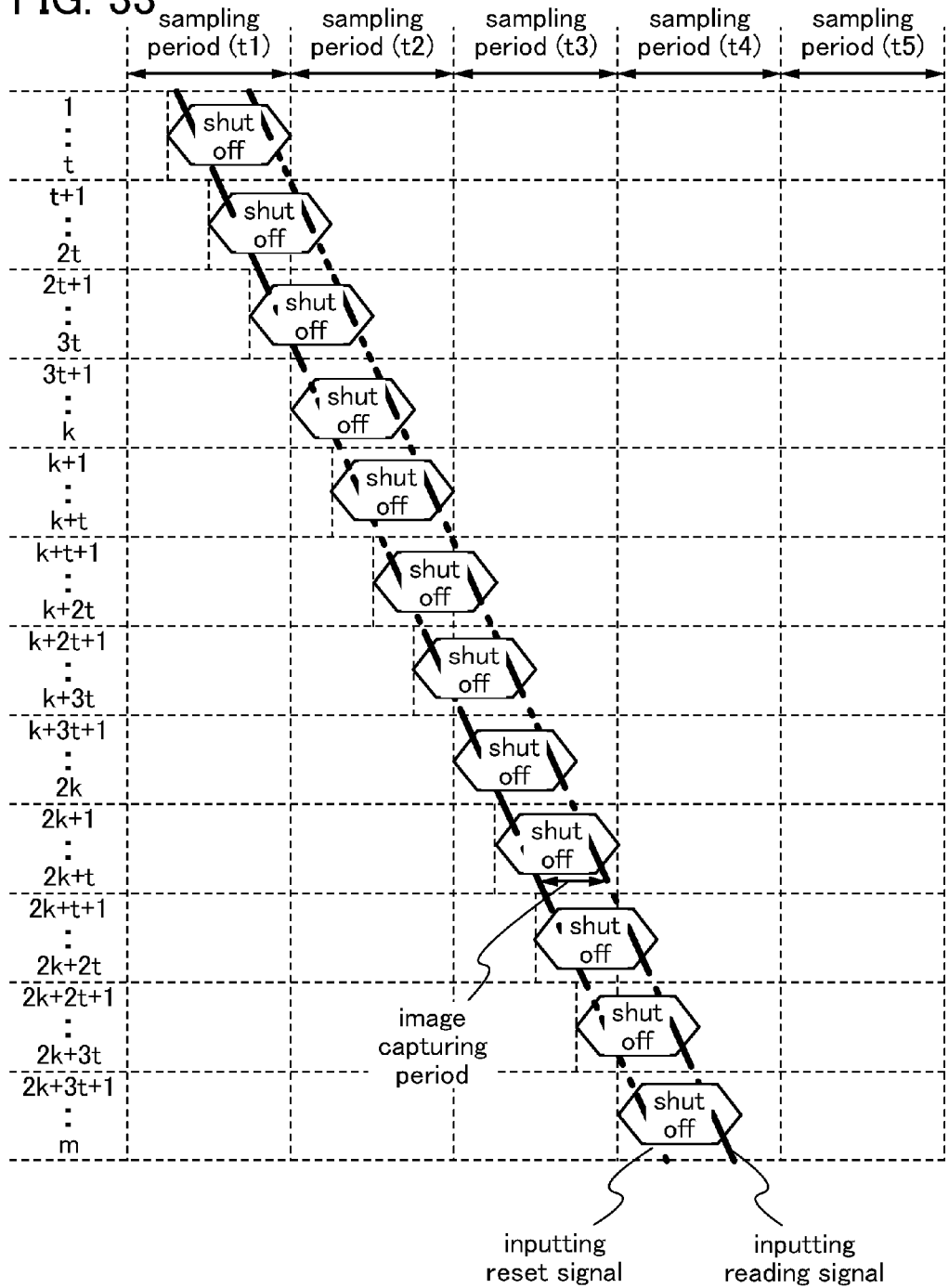

METHOD FOR DRIVING LIQUID CRYSTAL DISPLAY DEVICE

BACKGROUND OF THE INVENTION

1. Field of the Invention

The present invention relates to methods for driving liquid crystal display devices. In particular, the present invention relates to a field sequential liquid crystal display device capable of image capture by measure of the amount of light which is used for displaying images and reflected by an object to be read.

2. Description of the Related Art

As display methods of liquid crystal display devices, a color filter method and a field sequential method are known. In a color-filter liquid crystal display device, a plurality of subpixels which have color filters for transmitting only light with wavelengths of given colors (e.g., red (R), green (G), and blue (B)) are provided in each pixel. A desired color is expressed by control of transmission of white light in each subpixel and mixture of a plurality of colors in each pixel. In contrast, in a field-sequential liquid crystal display device, a plurality of light sources that emit light of different colors (e.g., red (R), green (G), and blue (B)) are provided. A desired color is expressed by repeatedly blinking each of the plurality of light sources and controlling transmission of light of each color in each pixel. In other words, a color filter method is a method in which a desired color is expressed by division of the area of one pixel among given colors, and a field sequential method is a method in which a desired color is expressed by division of a display period among given colors.

The field-sequential liquid crystal display device has the following advantages over the color-filter liquid crystal display device. First, in the field-sequential liquid crystal display device, it is not necessary to provide subpixels in each pixel. Thus, the aperture ratio can be improved or the number of pixels can be increased. Further, in the field-sequential liquid crystal display device, it is not necessary to provide color filters. That is, light loss caused by light absorption in the color filters does not occur. Therefore, transmittance can be improved and power consumption can be reduced.

Field-sequential liquid crystal display devices whose pixel portions are capable of not only displaying images but also image capture have also been developed. For example, Patent Document 1 discloses a liquid crystal display device capable of displaying images by a field sequential method and taking color images by measure of the amount of light reflected by an object to be read.

REFERENCE

Patent Document

[Patent Document 1] Japanese Published Patent Application No. H11-008741

SUMMARY OF THE INVENTION

In a field-sequential liquid crystal display device, it is necessary to increase the frequency of input of an image signal to each pixel. For example, in the case where images are displayed by a field sequential method in a liquid crystal display device including the light sources emitting light of any of red (R), green (G), and blue (B), the frequency of input of an image signal to each pixel needs to be at least three times as high as that of a color-filter liquid crystal display device. Specifically, in the case where the frame frequency is 60 Hz, an image signal needs to be input to each pixel 60 times per second in the color-filter liquid crystal display device; whereas an image signal needs to be input to each pixel 180 times per second in the case where images are displayed by a field sequential method in the liquid crystal display device including the three light sources.

In addition, when image capture is performed by measure of the amount of light reflected by an object to be read in a pixel portion of a liquid crystal display device, adverse effects of external light are desirably reduced as much as possible. Thus, in the case where the liquid crystal display device displays images by a field sequential method, it is preferable that an imaging period be shortened so that image capture is completed within a period in which a light source that emits light of a given color is lit.

Note that, for an increase in the frequency of input of image signals and a reduction in the length of the imaging period, each element included in the liquid crystal display device needs to have high response speed. Specifically, a transistor provided in each pixel needs to have higher mobility, for example. However, it is not easy to improve the characteristics of the elements. Moreover, shortening an imaging period may cause a reduction in detection accuracy in image capture.

It is possible to reduce the frequency of input of image signals and secure a sufficient imaging period by reducing the frame frequency in the liquid crystal display device. However, display deterioration such as color break becomes obvious in that case, which is a problem.

In view of the above, one object of one embodiment of the present invention is to improve image quality and detection accuracy in image capture of the liquid crystal display device by increasing the frequency of input of image signals and securing a sufficient imaging period.

The object can be achieved by concurrent supply of image signals to pixels provided in a plurality of rows among pixels arranged in matrix and by concurrent image capture in pixels provided in a plurality of rows among the pixels arranged in matrix, in a pixel portion of a liquid crystal display device.

That is, one embodiment of the present invention is a method for driving a liquid crystal display device. The liquid crystal display device is configured to produce an image in a pixel portion by repeatedly blinking each of a plurality of light sources emitting light of different colors and controlling transmission of the light of the plurality of colors by using a liquid crystal element in which an orientation state is controlled depending on applied voltage in each of a plurality of display pixels provided in m rows and n columns (m and n are natural numbers of 4 or more) and to perform image capture by using a photodiode in which photocurrent is generated by irradiation with light in a visible light range in each of a plurality of image-capture pixels provided in x rows and y columns (x and y are natural numbers of 4 or more). The method includes the following steps: a step of, in a first sampling period, concurrently performing supply of an image signal for controlling transmission of light of a first color for n display pixels provided in the first row to n display pixels provided in the k-th row (k is a natural number of less than m/2) which are included in a first region and supply of an image signal for controlling transmission of the light of the first color for n display pixels provided in the (k+1)-th row to n display pixels provided in the 2k-th row which are included in a second region; a step of, in a lighting period that is a period after the first sampling period, emitting light of the first color to the pixel portion by lighting at least one of the plurality of light sources emitting the light of the different colors; and a step of, in an imaging period that is a period included in the lighting period, concurrently performing image capture in y image-capture pixels provided in the first row to y image-capture pixels provided in the z-th row (z is a natural number of less than x/2) which are included in the first region and image capture in y image-capture pixels provided in the (z+1)-th row to y image-capture pixels provided in the 2z-th row which are included in the second region.

One embodiment of the present invention is another method for driving a liquid crystal display device. The liquid crystal display device is configured to produce an image in a pixel portion by repeatedly blinking each of a plurality of light sources emitting light of different colors and controlling transmission of the light of the plurality of colors by using a liquid crystal element in which an orientation state is controlled depending on applied voltage in each of a plurality of display pixels provided in m rows and n columns (m and n are natural numbers of 4 or more) and to perform image capture by using a photodiode in which photocurrent is generated by irradiation with light in a visible light range in each of a plurality of image-capture pixels provided in x rows and y columns (x and y are natural numbers of 4 or more). The method includes the following steps: a step of, in a sampling period, concurrently performing supply of an image signal for controlling transmission of light of a first color for n display pixels provided in the first row to n display pixels provided in the k-th row (k is a natural number of less than m/2) and supply of an image signal for controlling transmission of light of a second color for n display pixels provided in the (k+1)-th row to n display pixels provided in the 2k-th row; a step of, in a lighting period that is a period in the sampling period and after finishing supply of the image signal for controlling transmission of the light of the first color for the n display pixels provided in the first row to n display pixels provided in the s-th row (s is a natural number of k/2 or less) which are included in a first region and supply of the image signal for controlling transmission of the light of the second color for the n display pixels provided in the (k+1)-th row to n display pixels provided in the (k+s)-th row which are included in a second region, controlling transmission of the light of the first color emitted from a light source for the first to s-th rows in each of the n display pixels provided in the first row to the n display pixels provided in the s-th row and controlling transmission of the light of the second color emitted from a light source for the (k+1)-th to (k+s)-th rows in each of the n display pixels provided in the (k+1)-th row to the n display pixels provided in the (k+s)-th row; and a step of, in an imaging period that is a period included in the lighting period, concurrently performing image capture in y image-capture pixels provided in the first row to y image-capture pixels provided in the v-th row (v is a natural number of x/4 or less) which are included in the first region and image capture in y image-capture pixels provided in the (w+1)-th row (w is a natural number greater than or equal to 2v and less than or equal to x/2) to y image-capture pixels provided in the (w+v)-th row which are included in the second region.

In the liquid crystal display device according to one embodiment of the present invention, image signals can be concurrently supplied to pixels provided in a plurality of rows among pixels arranged in matrix. Further, image capture can be concurrently performed in pixels provided in a plurality of rows among pixels arranged in matrix. Thus, the frequency of input of an image signal to each pixel of the liquid crystal display device can be increased and a sufficient imaging period can be secured. As a result, in the liquid crystal display device, display deterioration such as color break which is caused in a field-sequential liquid crystal display device can be suppressed and improvements in image quality and detection accuracy in image capture can be realized.

BRIEF DESCRIPTION OF THE DRAWINGS

In the accompanying drawings:

FIG. 33 illustrates an example of operation of a liquid crystal display device;

DETAILED DESCRIPTION OF THE INVENTION

Embodiments of the present invention will be described below in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments.

Embodiment 1

In this embodiment, a liquid crystal display device in one embodiment of the present invention will be described with reference to FIG. 1, FIGS. 2A to 2C, FIGS. 3A and 3B, FIGS. 4A and 4B, FIG. 5, FIG. 6, FIG. 7, FIGS. 8A and 8B, FIGS. 9A and 9B, FIGS. 10A and 10B, and FIG. 11.

<Structure Example of Liquid Crystal Display Device>

Figure 1:
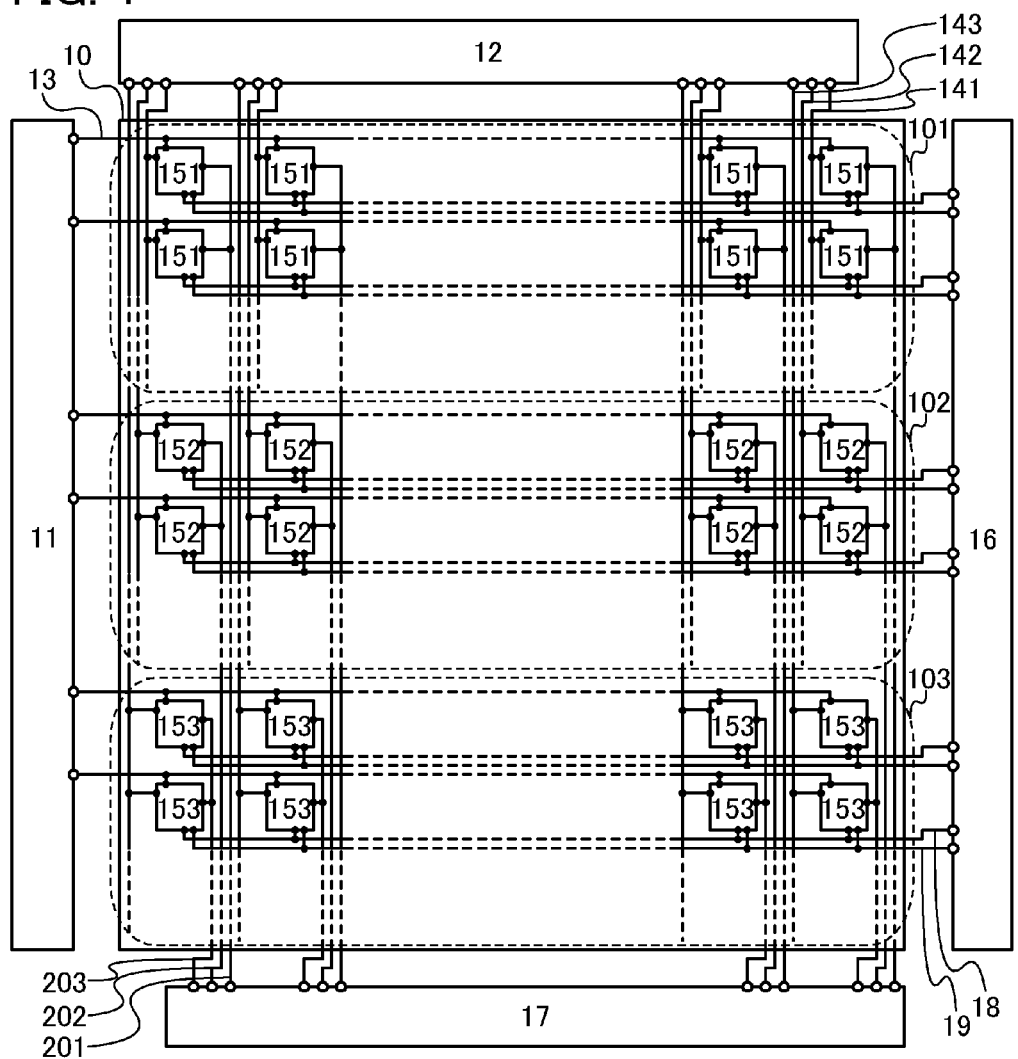
FIG. 1 illustrates a structure example of a liquid crystal display device.

FIG. 1 illustrates a structure example of a liquid crystal display device. The liquid crystal display device illustrated in FIG. 1 includes a pixel portion 10; a scan line driver circuit 11; an image signal line driver circuit 12; an image sensor driver circuit 16; a detection circuit 17; m (m is a natural number of 3 or more) scan lines 13 which are arranged parallel or almost parallel to each other and whose potentials are controlled by the scan line driver circuit 11; n (n is a natural number of 2 or more) image signal lines 141, n image signal lines 142, and n image signal lines 143 which are arranged parallel or almost parallel to each other and whose potentials are controlled by the image signal line driver circuit 12; m reset signal lines 18 which are arranged parallel or almost parallel to each other and whose potentials are controlled by the image sensor driver circuit 16; m reading signal lines 19 which are arranged parallel or almost parallel to each other and whose potentials are controlled by the image sensor driver circuit 16; and n image-capture signal lines 201, n image-capture signal lines 202, and n image-capture signal lines 203 which are arranged parallel or almost parallel to each other and whose potentials are determined by the detection circuit 17.

The pixel portion 10 is divided into three regions (regions 101 to 103) and includes a plurality of pixels which are arranged in matrix in each region. Note that the region 101 is a region including the scan lines 13 which are provided in the first to k-th (k is a natural number of less than m/2) rows, the reset signal lines 18 which are provided in the first to k-th rows, and the reading signal lines 19 which are provided in the first to k-th rows; the region 102 is a region including the scan lines 13 which are provided in the (k+1)-th to 2k-th rows, the reset signal lines 18 which are provided in the (k+1)-th to 2k-th rows, and the reading signal lines 19 which are provided in the (k+1)-th to 2k-th rows; and the region 103 is a region including the scan lines 13 which are provided in the (2k+1)-th to m-th rows, the reset signal lines 18 which are provided in the (2k+1)-th to m-th rows, and the reading signal lines 19 which are provided in the (2k+1)-th to m-th rows. Note that the scan line 13, the reset signal line 18, and the reading signal line 19 each are electrically connected to n pixels provided in a corresponding row among the plurality of pixels arranged in matrix (m rows by n columns) in the pixel portion 10. In addition, the image signal line 141 and the image-capture signal line 201 each are electrically connected to a plurality of pixels provided in a corresponding column among the plurality of pixels arranged in matrix in the region 101. Furthermore, the image signal line 142 and the image-capture signal line 202 each are electrically connected to a plurality of pixels provided in a corresponding column among the plurality of pixels arranged in matrix in the region 102. In addition, the image signal line 143 and the image-capture signal line 203 each are electrically connected to a plurality of pixels provided in a corresponding column among the plurality of pixels arranged in matrix in the region 103.

Figure 2A:
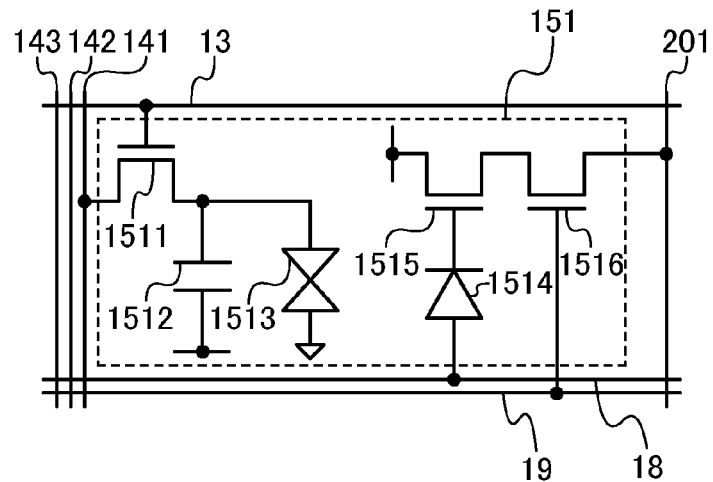
FIGS. 2A to 2C illustrate structure examples of a pixel.
Figure 2B:
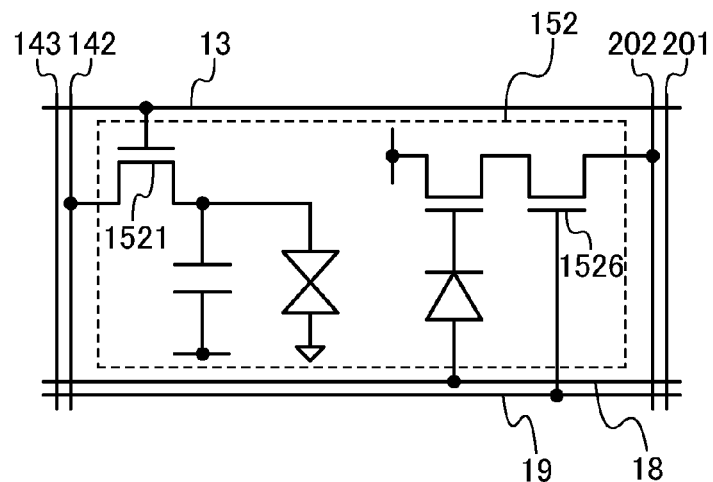
Figure 2C:
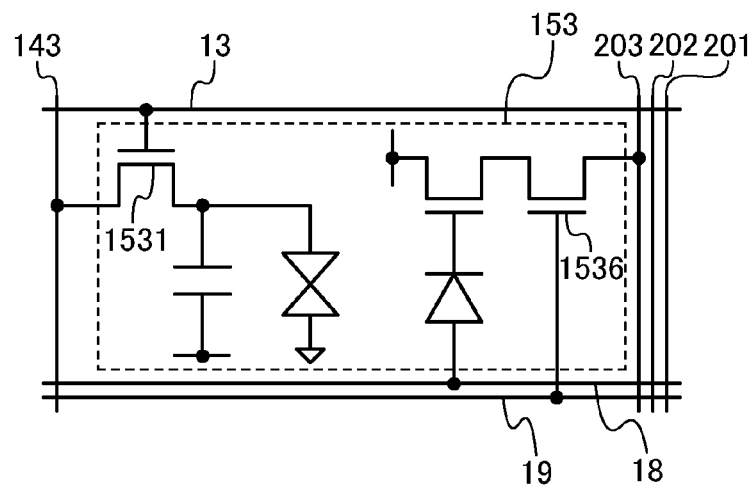

FIGS. 2A to 2C illustrate examples of the circuit structures of pixels. Specifically, FIG. 2A illustrates an example of the circuit structure of a pixel 151 provided in the region 101; FIG. 2B illustrates an example of the circuit structure of a pixel 152 provided in the region 102; and FIG. 2C illustrates an example of the circuit structure of a pixel 153 provided in the region 103.

The pixel 151 illustrated in FIG. 2A includes a transistor 1511, a capacitor 1512, a liquid crystal element 1513, a photodiode 1514, a transistor 1515, and a transistor 1516. A gate of the transistor 1511 is electrically connected to the scan line 13. One of a source and a drain of the transistor 1511 is electrically connected to the image signal line 141. One electrode of the capacitor 1512 is electrically connected to the other of the source and the drain of the transistor 1511. The other electrode of the capacitor 1512 is electrically connected to a wiring (also called a capacitor wiring) for supplying a capacitor potential. One electrode (also called a pixel electrode) of the liquid crystal element 1513 is electrically connected to the other of the source and the drain of the transistor 1511 and the one electrode of the capacitor 1512. The other electrode (also called a counter electrode) of the liquid crystal element 1513 is electrically connected to a wiring for supplying a counter potential. An anode of the photodiode 1514 is electrically connected to the reset signal line 18. A gate of the transistor 1515 is electrically connected to a cathode of the photodiode 1514 and one of a source and a drain of the transistor 1515 is electrically connected to a wiring (also called a fixed potential line) for supplying a fixed potential. A gate of the transistor 1516 is electrically connected to the reading signal line 19, one of a source and a drain of the transistor 1516 is electrically connected to the other of the source and the drain of the transistor 1515, and the other of the source and the drain of the transistor 1516 is electrically connected to the image-capture signal line 201. Note that in the pixel 151, a display element includes the transistor 1511, the capacitor 1512, and the liquid crystal element 1513 and an image sensor includes the photodiode 1514, the transistor 1515, and the transistor 1516.

The circuit structures of the pixel 152 illustrated in FIG. 2B and the pixel 153 illustrated in FIG. 2C are the same as that of the pixel 151 illustrated in FIG. 2A. Note that the pixel 152 illustrated in FIG. 2B differs from the pixel 151 illustrated in FIG. 2A in that one of a source and a drain of a transistor 1521 is electrically connected to the image signal line 142 instead of the image signal line 141 and in that the other of a source and a drain of a transistor 1526 is electrically connected to the image-capture signal line 202 instead of the image-capture signal line 201; and the pixel 153 illustrated in FIG. 2C differs from the pixel 151 illustrated in FIG. 2A in that one of a source and a drain of a transistor 1531 is electrically connected to the signal line 143 instead of the signal line 141 and in that the other of a source and a drain of a transistor 1536 is electrically connected to the image-capture signal line 203 instead of the image-capture signal line 201.

<Structure Example of Scan Line Driver Circuit 11>

Figure 3A:
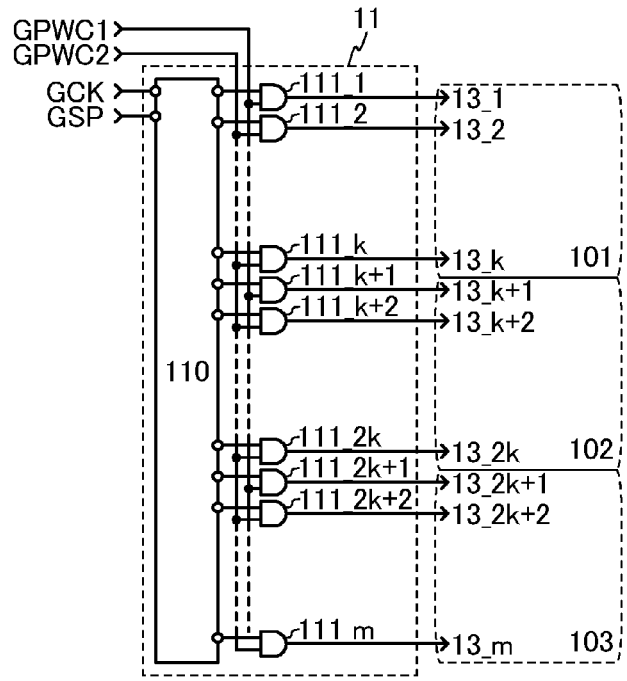
FIG. 3A illustrates a structure example of a scan line driver circuit.

FIG. 3A illustrates a structure example of the scan line driver circuit 11 included in the liquid crystal display device illustrated in FIG. 1. The scan line driver circuit 11 illustrated in FIG. 3A includes a shift register 110 having m output terminals and AND gates 111_1 to 111_m each having a first input terminal, a second input terminal, and an output terminal. Note that the first input terminal of the AND gate 111_a (a is an odd number of m or less) is electrically connected to the a-th output terminal of the shift register 110; the second input terminal of the AND gate 111_a is electrically connected to a wiring for supplying a first pulse-width control signal (GPWC1) for the scan line driver circuit; and the output terminal of the AND gate 111_a is electrically connected to the scan line 13_a that is provided in the a-th row in the pixel portion 10. Further, the first input terminal of the AND gate 111_b (b is an even number of m or less) is electrically connected to the b-th output terminal of the shift register 110; the second input terminal of the AND gate 111_b is electrically connected to a wiring for supplying a second pulse-width control signal (GPWC2) for the scan line driver circuit; and the output terminal of the AND gate 111_b is electrically connected to the scan line 13_b that is provided in the b-th row in the pixel portion 10.

The shift register 110 sequentially outputs high-level potentials from the first to m-th output terminals when a signal that has a high-level potential is input to the shift register 110 as a start pulse (GSP) for the scan line driver circuit which is input from the outside. Note that in the shift register 110, the output terminals which output high-level potentials are changed every half the cycle of a clock signal (GCK) for the scan line driver circuit. That is, in the shift register 110, a signal that has a high-level potential is shifted every half the cycle of the clock signal (GCK) for the scan line driver circuit and the signals are sequentially output from the m output terminals. In addition, the shift register 110 stops the shift of the signal when supply of the clock signal (GCK) for the scan line driver circuit from the outside is stopped.

An operation example of the scan line driver circuit 11 is described with reference to FIG. 3B. Note that in FIG. 3B, the start pulse (GSP) for the scan line driver circuit, the clock signal (GCK) for the scan line driver circuit, signals (SR110out) output from the m output terminals of the shift register 110, the first pulse-width control signal (GPWC1) for the scan line driver circuit, the second pulse-width control signal (GPWC2) for the scan line driver circuit, and potentials of the scan lines 13_1 to 13_m are shown.

Figure 3B:
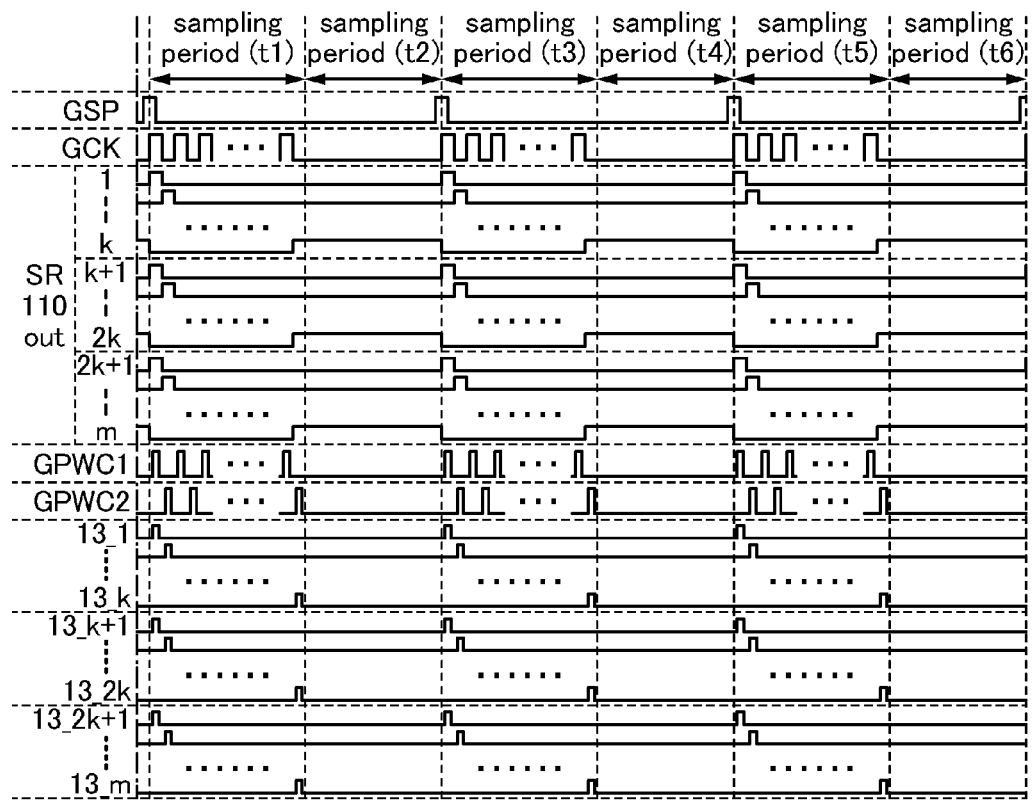
FIG. 3B illustrates an example of operation of a scan line driver circuit.

In the operation example illustrated in FIG. 3B, the start pulse (GSP) for the scan line driver circuit which has a high-level potential is input to the shift register 110 at least three times before a sampling period (t1). Specifically, in the sampling period (t1), the start pulse (GSP) for the scan line driver circuit is input so that the first to k-th output terminals of the shift register 110 sequentially output high-level potentials, the (k+1)-th to 2k-th output terminals sequentially output high-level potentials, and the (2k+1)-th to m-th output terminals sequentially output high-level potentials.

Accordingly, in the sampling period (t1), each of the AND gates 111_1 to 111_m outputs a logical AND of any of the signals output from the m output terminals of the shift register 110 and any of the first pulse-width control signal (GPWC1) for the scan line driver circuit and the second pulse-width control signal (GPWC2) for the scan line driver circuit. In other words, in the sampling period (t1), high-level potentials are sequentially supplied to the scan lines 13_1 to 13_k which are provided in the first to k-th rows, high-level potentials are sequentially supplied to the scan lines 13_k+1 to 13_2k which are provided in the (k+1)-th to 2k-th rows, and high-level potentials are sequentially supplied to the scan lines 13_2k+1 to 13_m which are provided in the (2k+1)-th to m-th rows. Note that the length of a period (a horizontal scanning period) in which a high-level potential is supplied to the scan line is substantially the same as that (a pulse width) of a period in which the potential of the first pulse-width control signal (GPWC1) for the scan line driver circuit or the second pulse-width control signal (GPWC2) for the scan line driver circuit is a high-level. In this manner, in the sampling period (t1), by the scan line driver circuit 11, high-level potentials can be concurrently supplied to the scan lines provided in three rows and the scan lines to which the high-level potentials are supplied are shifted every half the cycle of the clock signal (GCK) for the scan line driver circuit.

Then, in a sampling period (t2), supply of the clock signal (GCK) for the scan line driver circuit, the first pulse-width control signal (GPWC1) for the scan line driver circuit, and the second pulse-width control signal (GPWC2) for the scan line driver circuit to the scan line driver circuit 11 is stopped. Specifically, low-level potentials are supplied to the wirings for supplying these signals. Thus, the shift of the signal having a high-level potential in the shift register 110 is stopped and low-level potentials are supplied to the scan lines 13_1 to 13_m.

In the operation example illustrated in FIG. 3B, the above-described series of operations is repeated in the following periods. In other words, in this operation example, a series of a period in which high-level potentials are supplied to the scan lines provided in three rows (where the three rows to which the high-level potentials are supplied are shifted every half the cycle of the clock signal (GCK) for the scan line driver circuit) and a period in which low-level potentials are supplied to all the scan lines is repeated.

<Structure Example of Image Signal Line Driver Circuit 12>

Figure 4A:
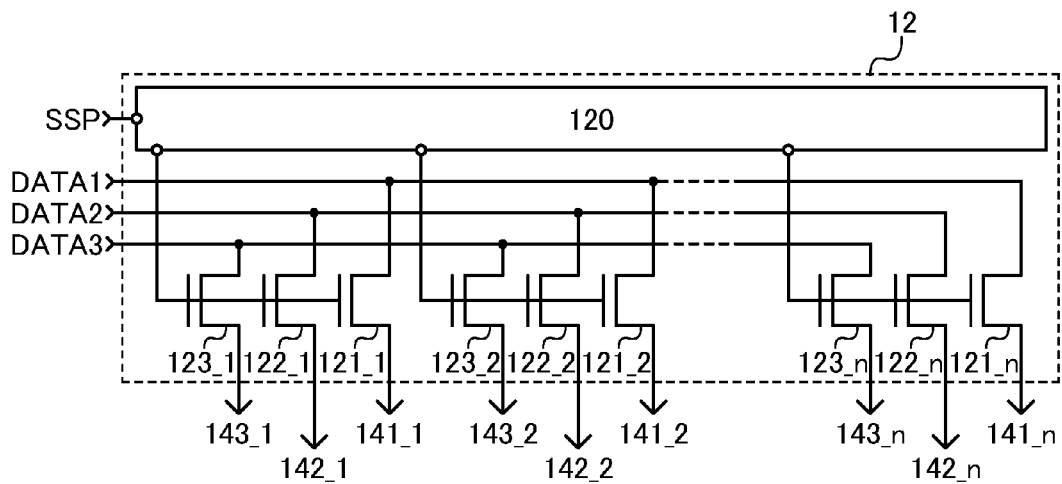
FIG. 4A illustrates a structure example of an image signal line driver circuit.

FIG. 4A illustrates a structure example of the image signal line driver circuit 12 which is included in the liquid crystal display device illustrated in FIG. 1. The image signal line driver circuit 12 illustrated in FIG. 4A includes a shift register 120 having n output terminals, transistors 121_1 to 121_n, transistors 122_1 to 122_n, and transistors 123_1 to 123_n. Note that a gate of the transistor 121_s (s is a natural number of n or less) is electrically connected to the s-th output terminal of the shift register 120; one of a source and a drain of the transistor 121_s is electrically connected to a wiring for supplying a first image signal (DATA1); and the other of the source and the drain of the transistor 121_s is electrically connected to the image signal line 141_s provided in the s-th column in the pixel portion 10. Further, a gate of the transistor 122_s is electrically connected to the s-th output terminal of the shift register 120; one of a source and a drain of the transistor 122_s is electrically connected to a wiring for supplying a second image signal (DATA2); and the other of the source and the drain of the transistor 122_s is electrically connected to the image signal line 142_s provided in the s-th column in the pixel portion 10. Further, a gate of the transistor 123_s is electrically connected to the s-th output terminal of the shift register 120; one of a source and a drain of the transistor 123_s is electrically connected to a wiring for supplying a third image signal (DATA3); and the other of the source and the drain of the transistor 123_s is electrically connected to the image signal line 143_s provided in the s-th column in the pixel portion 10.

Figure 4B:
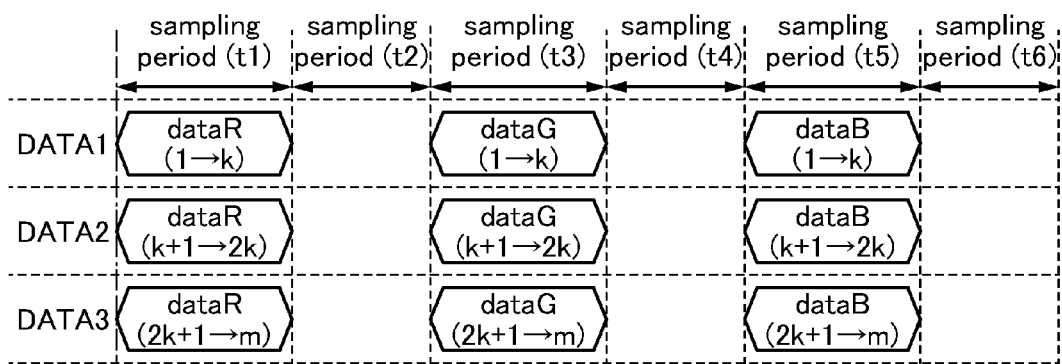
FIG. 4B illustrates an example of operation of an image signal line driver circuit.

FIG. 4B illustrates an example of timings of image signals supplied by the wirings for supplying the first image signal (DATA1), the second image signal (DATA2), and the third image signal (DATA3). As illustrated in FIG. 4B, in the sampling period (t1), the wiring for supplying the first image signal (DATA1) supplies an image signal (dataR(1→k)) for controlling transmission of red (R) light for the pixels provided in the first to k-th rows; in the sampling period (t3), the wiring for supplying the first image signal (DATA1) supplies an image signal (dataG(1→k)) for controlling transmission of green (G) light for the pixels provided in the first to k-th rows; in the sampling period (t5), the wiring for supplying the first image signal (DATA1) supplies an image signal (dataB (1→k)) for controlling transmission of blue (B) light for the pixels provided in the first to k-th rows; and in the other sampling periods (t2, t4, and t6), the wiring for supplying the first image signal (DATA1) does not supply any image signal. Further, in the sampling period (t1), the wiring for supplying the second image signal (DATA2) supplies an image signal (dataR(k+1→2k)) for controlling transmission of red (R) light for the pixels provided in the (k+1)-th to 2k-th rows; in the sampling period (t3), the wiring for supplying the second image signal (DATA2) supplies an image signal (dataG(k+1→2k)) for controlling transmission of green (G) light for the pixels provided in the (k+1)-th to 2k-th rows; in the sampling period (t5), the wiring for supplying the second image signal (DATA2) supplies an image signal (dataB(k+1→2k)) for controlling transmission of blue (B) light for the pixels provided in the (k+1)-th to 2k-th rows; and in the other sampling periods (t2, t4, and t6), the wiring for supplying the second image signal (DATA2) does not supply any image signal. Further, in the sampling period (t1), the wiring for supplying the third image signal (DATA3) supplies an image signal (dataR(2k+1→m)) for controlling transmission of red (R) light for the pixels provided in the (2k+1)-th to m-th rows; in the sampling period (t3), the wiring for supplying the third image signal (DATA3) supplies an image signal (dataG(2k+1→m)) for controlling transmission of green (G) light for the pixels provided in the (2k+1)-th to m-th rows; in the sampling period (t5), the wiring for supplying the third image signal (DATA3) supplies an image signal (dataB(2k+1→m)) for controlling transmission of blue (B) light for the pixels provided in the (2k+1)-th to m-th rows; and in the other sampling periods (t2, t4, and t6), the wiring for supplying the third image signal (DATA3) does not supply any image signal.

<Writing of Image Signal>

In the liquid crystal display device including the above-described scan line driver circuit 11 and the above-described image signal line driver circuit 12, in the sampling period (t1), supply of an image signal for controlling transmission of red (R) light for each pixel provided in the first to k-th rows each of which includes n pixels (i.e., input of the red (R) image signal for the pixels in the first to k-th rows), supply of an image signal for controlling transmission of red (R) light for each pixel provided in the (k+1)-th to 2k-th rows each of which includes n pixels (i.e., input of the red (R) image signal for the pixels in the (k+1)-th to 2k-th rows), and supply of an image signal for controlling transmission of red (R) light for each pixel provided in the (2k+1)-th to m-th rows each of which includes n pixels (i.e., input of the red (R) image signal for the pixels in the (2k+1)-th to m-th rows) can be concurrently performed. Similarly, in the sampling period (t3), input of the green (G) image signal for the pixels in the first to k-th rows, input of the green (G) image signal for the pixels in the (k+1)-th to 2k-th rows, and input of the green (G) image signal for the pixels in the (2k+1)-th to m-th rows can be concurrently performed; in the sampling period (t5), input of the blue (B) image signal for the pixels in the first to k-th rows, input of the blue (B) image signal for the pixels in the (k+1)-th to 2k-th rows, and input of the blue (B) image signal for the pixels in the (2k+1)-th to m-th rows can be concurrently performed.

<Structure Example of Image Sensor Driver Circuit 16>

Figure 5:
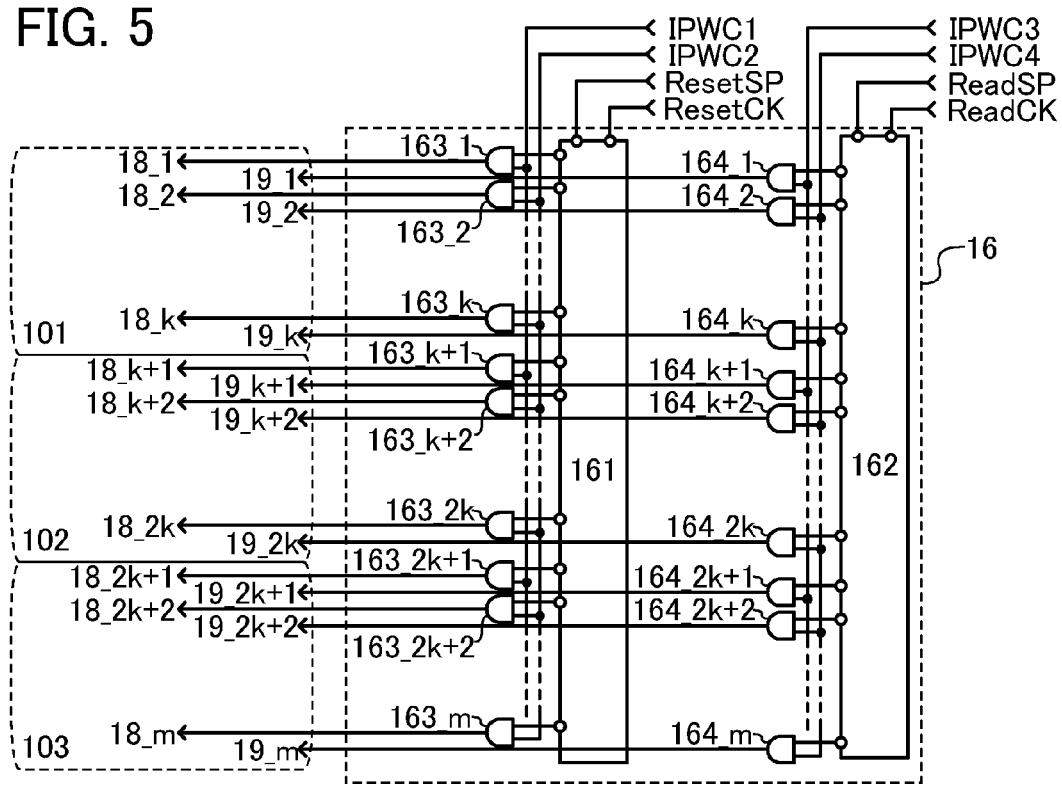
FIG. 5 illustrates a structure example of an image sensor driver circuit.

FIG. 5 illustrates a structure example of the image sensor driver circuit 16 which is included in the liquid crystal display device illustrated in FIG. 1. The image sensor driver circuit 16 illustrated in FIG. 5 includes shift registers 161 and 162 each having m output terminals and AND gates 163_1 to 163_m and AND gates 164_1 to 164_m each having a first input terminal, a second input terminal, and an output terminal.

Note that the first input terminal of the AND gate 163_a (a is an odd number of m or less) is electrically connected to the a-th output terminal of the shift register 161; the second input terminal of the AND gate 163_a is electrically connected to a wiring for supplying a first pulse-width control signal (IPWC1) for the image sensor driver circuit; and the output terminal of the AND gate 163_a is electrically connected to the reset signal line 18_a that is provided in the a-th row in the pixel portion 10. Further, the first input terminal of the AND gate 163_b (b is an even number of m or less) is electrically connected to the b-th output terminal of the shift register 161; the second input terminal of the AND gate 163_b is electrically connected to a wiring for supplying a second pulse-width control signal (IPWC2) for the image sensor driver circuit; and the output terminal of the AND gate 163_b is electrically connected to the reset signal line 18_b that is provided in the b-th row in the pixel portion 10. Further, the first input terminal of the AND gate 164_a is electrically connected to the a-th output terminal of the shift register 162; the second input terminal of the AND gate 164_a is electrically connected to a wiring for supplying a third pulse-width control signal (IPWC3) for the image sensor driver circuit; and the output terminal of the AND gate 164_a is electrically connected to the reading signal line 19_a that is provided in the a-th row in the pixel portion 10. Further, the first input terminal of the AND gate 164_b is electrically connected to the b-th output terminal of the shift register 162; the second input terminal of the AND gate 164_b is electrically connected to a wiring for supplying a fourth pulse-width control signal (IPWC4) for the image sensor driver circuit; and the output terminal of the AND gate 164_b is electrically connected to the reading signal line 19_b that is provided in the b-th row in the pixel portion 10.

The shift register 161 sequentially outputs high-level potentials from the first to m-th output terminals when a signal that has a high-level potential is input to the shift register 161 as a start pulse (ResetSP) for a reset signal line driver circuit which is input from the outside. Note that in the shift register 161, the output terminals which output high-level potentials are changed every half the cycle of a clock signal (ResetCK) for the reset signal line driver circuit. That is, in the shift register 161, a signal that has a high-level potential is shifted every half the cycle of the clock signal (ResetCK) for the reset signal line driver circuit and the signals are sequentially output from the m output terminals. In addition, the shift register 161 stops the shift of the signal when supply of the clock signal (ResetCK) for the reset signal line driver circuit from the outside is stopped. Similarly, the shift register 162 sequentially outputs high-level potentials from the first to m-th output terminals when a signal that has a high-level potential is input to the shift register 162 as a start pulse (ReadSP) for a reading signal line driver circuit which is input from the outside. Note that in the shift register 162, the output terminals which output high-level potentials are changed every half the cycle of a clock signal (ReadCK) for the reading signal line driver circuit. In addition, the shift register 162 stops the shift of the signal when supply of the clock signal (ReadCK) for the reading signal line driver circuit from the outside is stopped.

An operation example of the image sensor driver circuit 16 is described with reference to FIG. 6 and FIG. 7. Note that in FIG. 6, the start pulse (ResetSP) for the reset signal line driver circuit, the clock signal (ResetCK) for the reset signal line driver circuit, signals (SR161out) output from the m output terminals of the shift register 161, the first pulse-width control signal (IPWC1) for the image sensor driver circuit, the second pulse-width control signal (IPWC2) for the image sensor driver circuit, and potentials of the reset signal lines 18_1 to 18__m are shown. Further, in FIG. 7, the start pulse (ReadSP) for the reading signal line driver circuit, the clock signal (ReadCK) for the reading signal line driver circuit, signals (SR162out) output from the m output terminals of the shift register 162, the third pulse-width control signal (IPWC3) for the image sensor driver circuit, the fourth pulse-width control signal (IPWC4) for the image sensor driver circuit, and potentials of the reading signal lines 19_1 to 19__m are shown.

Figure 6:
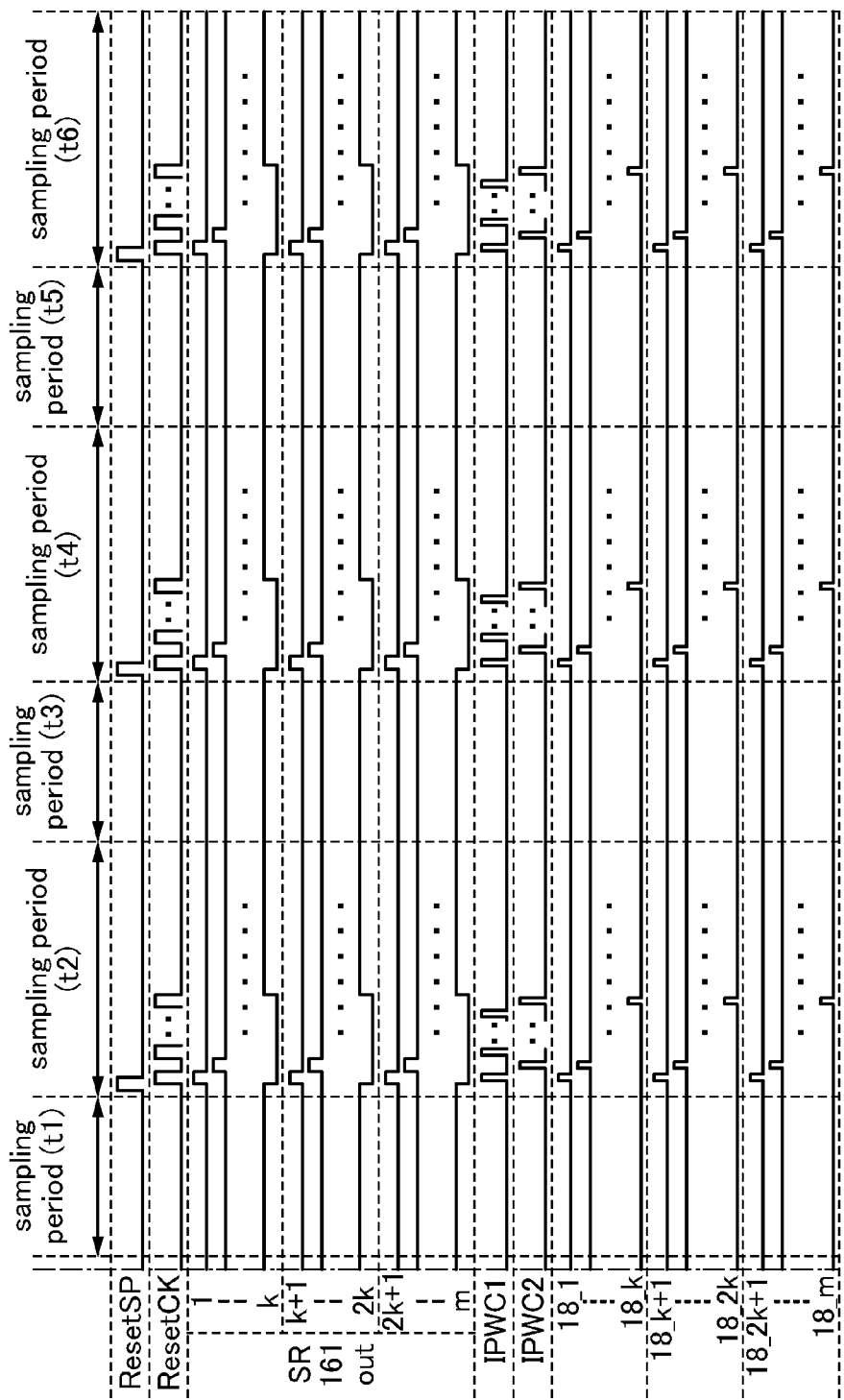
FIG. 6 illustrates an example of operation of an image sensor driver circuit.

In the sampling period (t1), supply of the clock signal (ResetCK) for the reset signal line driver circuit, the first pulse-width control signal (IPWC1) for the image sensor driver circuit, and the second pulse-width control signal (IPWC2) for the image sensor driver circuit to the image sensor driver circuit 16 is stopped (see FIG. 6). Specifically, low-level potentials are supplied to the wirings for supplying these signals. Thus, the shift of the signal having a high-level potential in the shift register 161 is stopped and low-level potentials are supplied to the reset signal lines 18_1 to 18__m. Note that in the sampling period (t1), high-level potentials are output from the k-th, 2k-th and m-th output terminals of the shift register 161.

Then, in the former period of the sampling period (t2), the start pulse (ResetSP) for the reset signal line driver circuit and the clock signal (ResetCK) for the reset signal line driver circuit are supplied to the image sensor driver circuit 16. Accordingly, sequentially from the first output terminal of the shift register 161, a signal that has a high-level potential is shifted every half the cycle of the clock signal (ResetCK) for the reset signal line driver circuit. Concurrently with the shift, a signal that has a high-level potential is shifted sequentially from the (k+1)-th output terminal and a signal that has a high-level potential is shifted sequentially from the (2k+1)-th output terminal. Note that supply of the clock signal (ResetCK) for the reset signal line driver circuit to the image sensor driver circuit 16 is stopped at the time when the k-th, 2k-th and m-th output terminals of the shift register 161 output high-level potentials. In addition, in the same period as supply of the clock signal (ResetCK) for the reset signal line driver circuit to the image sensor driver circuit 16, the first pulse-width control signal (IPWC1) for the image sensor driver circuit and the second pulse-width control signal (IPWC2) for the image sensor driver circuit are supplied to the image sensor driver circuit 16. Here, each of the AND gates 163_1 to 163__m outputs a logical AND of any of the signals output from the m output terminals of the shift register 161 and any of the first pulse-width control signal (IPWC1) for the image sensor driver circuit and the second pulse-width control signal (IPWC2) for the image sensor driver circuit. In other words, in the former period of the sampling period (t2), high-level potentials are sequentially supplied to the reset signal lines 18_1 to 18__k which are provided in the first to k-th rows, high-level potentials are sequentially supplied to the reset signal lines 18__k+1 to 18__2k which are provided in the (k+1)-th to 2k-th rows, and high-level potentials are sequentially supplied to the reset signal lines 18__2k+1 to 18__m which are provided in the (2k+1)-th to m-th rows. Note that the length of a period in which a high-level potential is supplied to the reset signal line is substantially the same as that (a pulse width) of a period in which the potential of the first pulse-width control signal (IPWC1) for the image sensor driver circuit or the second pulse-width control signal (IPWC2) for the image sensor driver circuit is a high-level. In this manner, in the sampling period (t2), by the image sensor driver circuit 16, high-level potentials can be supplied to the reset signal lines provided in three rows and the three rows to which the high-level potentials are supplied are shifted every half the cycle of the clock signal (ResetCK) for the reset signal line driver circuit. In other words, scan of the reset signal for the pixels in the first to k-th rows, scan of the reset signal for the pixels in the (k+1)-th to 2k-th rows, and scan of the reset signal for the pixels in the (2k+1)-th to m-th rows can be concurrently performed.

In the latter period of the sampling period (t2), the state where supply of the clock signal (ResetCK) for the reset signal line driver circuit, the first pulse-width control signal (IPWC1) for the image sensor driver circuit, and the second pulse-width control signal (IPWC2) for the image sensor driver circuit to the image sensor driver circuit 16 is stopped is maintained. Accordingly, the state where the shift of the signal having a high-level potential in the shift register 161 is stopped is maintained and the state where low-level potentials are supplied to the reset signal lines 18_1 to 18__m is maintained.

In the following periods, the above-described series of operations is repeated. In other words, in this operation example, a series of a period in which high-level potentials are supplied to the reset signal lines provided in three rows (where the three rows to which the high-level potentials are supplied are shifted every half the cycle of the clock signal (ResetCK) for the reset signal line driver circuit) and a period in which low-level potentials are supplied to all the reset signal lines is repeated.

Figure 7:
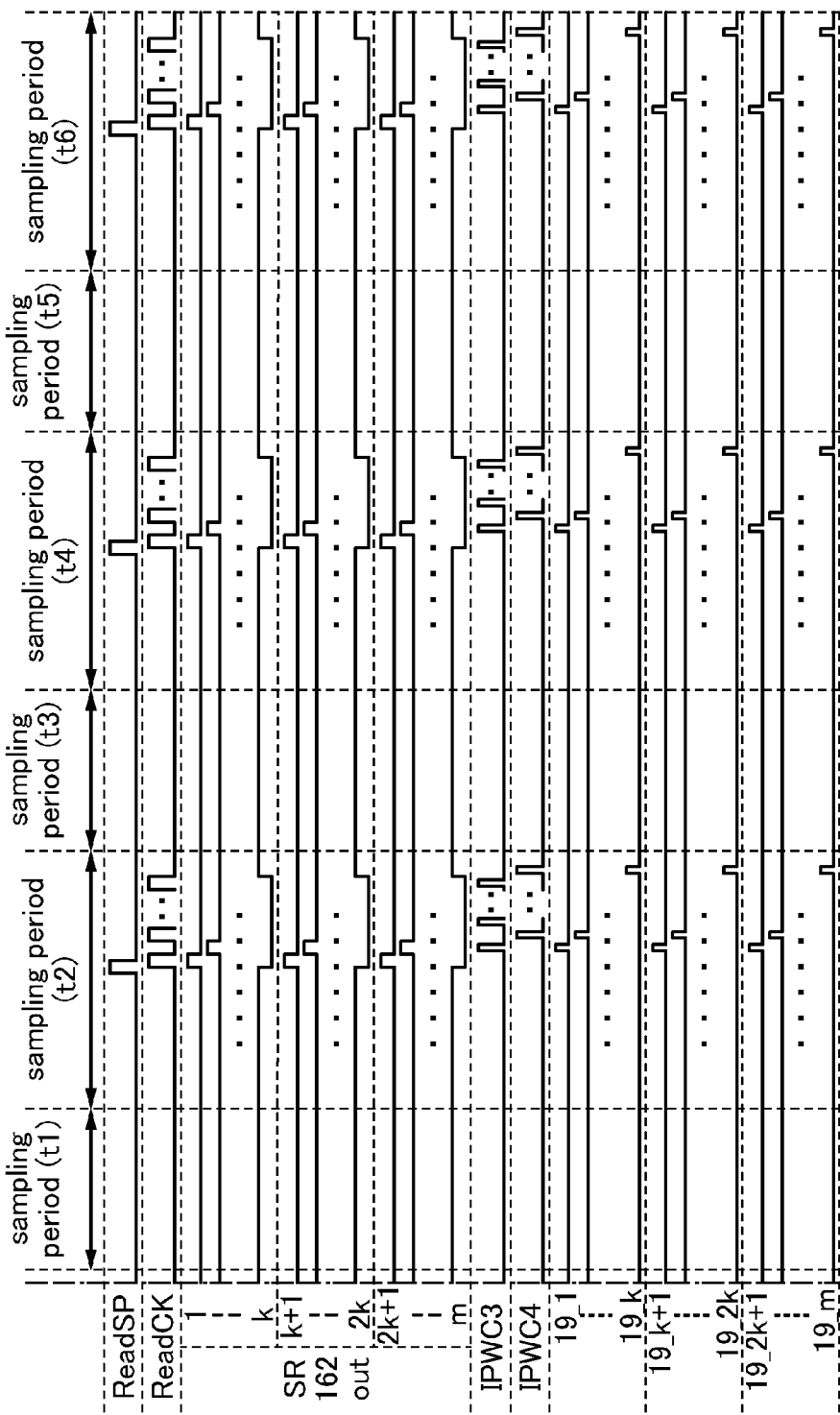
FIG. 7 illustrates an example of operation of an image sensor driver circuit.

Further, in the sampling period (t1), supply of the clock signal (ReadCK) for the reading signal line driver circuit, the third pulse-width control signal (IPWC3) for the image sensor driver circuit, and the fourth pulse-width control signal (IPWC4) for the image sensor driver circuit to the image sensor driver circuit 16 is stopped (see FIG. 7). Specifically, low-level potentials are supplied to the wirings for supplying these signals. Thus, the shift of the signal having a high-level potential in the shift register 162 is stopped and low-level potentials are supplied to the reading signal lines 19_1 to

19_m. Note that in the sampling period (t1), high-level potentials are output from the k-th, 2k-th and m-th output terminals of the shift register 162.

Then, in the former period of the sampling period (t2), the state where supply of the clock signal (ReadCK) for the reading signal line driver circuit, the third pulse-width control signal (IPWC3) for the image sensor driver circuit, and the fourth pulse-width control signal (IPWC4) for the image sensor driver circuit to the image sensor driver circuit 16 is stopped is maintained. Accordingly, the state where the shift of the signal having a high-level potential in the shift register 162 is stopped is maintained and the state where low-level potentials are supplied to the reading signal lines 19_1 to 19_m is maintained.

Then, in the latter period of the sampling period (t2), the start pulse (ReadSP) for the reading signal line driver circuit and the clock signal (ReadCK) for the reading signal line driver circuit are supplied to the image sensor driver circuit 16. Accordingly, sequentially from the first output terminal of the shift register 162, a signal that has a high-level potential is shifted every half the cycle of the clock signal (ReadCK) for the reading signal line driver circuit. Concurrently with the shift, a signal that has a high-level potential is shifted sequentially from the (k+1)-th output terminal and a signal that has a high-level potential is shifted sequentially from the (2k+1)-th output terminal. Note that supply of the clock signal (ReadCK) for the reading signal line driver circuit to the image sensor driver circuit 16 is stopped at the time when the k-th, 2k-th and m-th output terminals of the shift register 162 output high-level potentials. In addition, in the same period as supply of the clock signal (ReadCK) for the reading signal line driver circuit to the image sensor driver circuit 16, the third pulse-width control signal (IPWC3) for the image sensor driver circuit and the fourth pulse-width control signal (IPWC4) for the image sensor driver circuit are supplied to the image sensor driver circuit 16. Here, each of the AND gates 164_1 to 164_m outputs a logical AND of any of the signals output from the m output terminals of the shift register 162 and any of the third pulse-width control signal (IPWC3) for the image sensor driver circuit and the fourth pulse-width control signal (IPWC4) for the image sensor driver circuit. In other words, in the latter period of the sampling period (t2), high-level potentials are sequentially supplied to the reading signal lines 19_1 to 19_k which are provided in the first to k-th rows, high-level potentials are sequentially supplied to the reading signal lines 19_k+1 to 19_2k which are provided in the (k+1)-th to 2k-th rows, and high-level potentials are sequentially supplied to the reading signal lines 19_2k+1 to 19_m which are provided in the (2k+1)-th to m-th rows. Note that the length of a period in which a high-level potential is supplied to the reading signal line is substantially the same as that (a pulse width) of a period in which the potential of the third pulse-width control signal (IPWC3) for the image sensor driver circuit or the fourth pulse-width control signal (IPWC4) for the image sensor driver circuit is a high-level. In this manner, in the sampling period (t2), by the image sensor driver circuit 16, high-level potentials can be supplied to the reading signal lines provided in three rows and the three rows to which the high-level potentials are supplied are shifted every half the cycle of the clock signal (ReadCK) for the reading signal line driver circuit. In other words, scan of the reading signal for the pixels in the first to k-th rows, scan of the reading signal for the pixels in the (k+1)-th to 2k-th rows, and scan of the reading signal for the pixels in the (2k+1)-th to m-th rows can be concurrently performed.

In the operation example illustrated in FIG. 7, in the following periods, the above-described series of operations is repeated. In other words, in this operation example, a series of a period in which high-level potentials are supplied to the reading signal lines provided in three rows (where the three rows to which the high-level potentials are supplied are shifted every half the cycle of the clock signal (ReadCK) for the reading signal line driver circuit) and a period in which low-level potentials are supplied to all the reading signal lines is repeated.

<Structure Example of Detection Circuit 17>

Figure 8A:
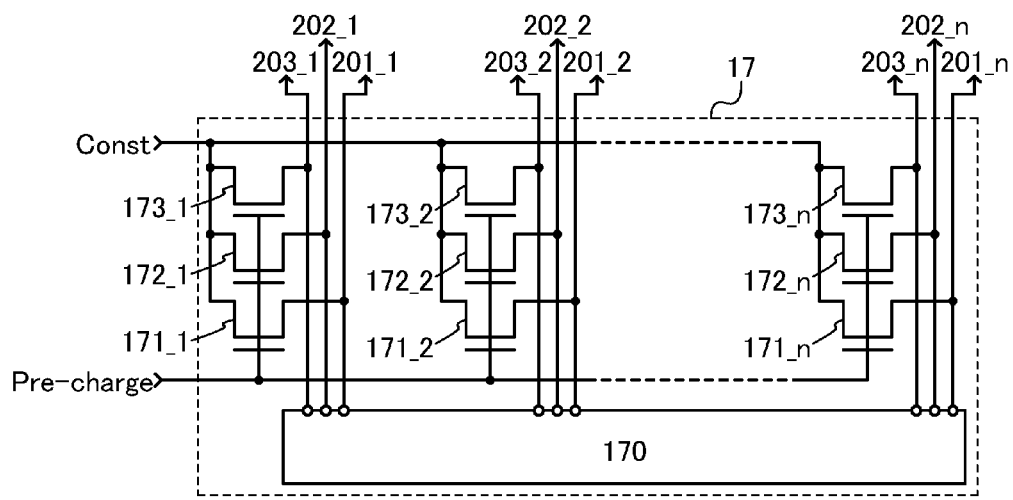
FIG. 8A illustrates a structure example of a detection circuit.

FIG. 8A illustrates a structure example of the detection circuit 17 which is included in the liquid crystal display device illustrated in FIG. 1. The detection circuit 17 illustrated in FIG. 8A includes an image-capture signal determination circuit 170 having 3n input terminals, transistors 171_1 to 171_n, transistors 172_1 to 172_n, and transistors 173_1 to 173_n. Note that each of the 3n input terminals of the image-capture signal determination circuit 170 is electrically connected to a corresponding image-capture signal line among image-capture signal lines 201_1 to 201_n, image-capture signal lines 202_1 to 202_n, and image-capture signal lines 203_1 to 203_n. Note that a gate of the transistor 171_v (v is a natural number of n or less) is electrically connected to a wiring for supplying a pre-charge signal (Pre-charge); one of a source and a drain of the transistor 171_v is electrically connected to a wiring for supplying a fixed potential (Const); and the other of the source and the drain of the transistor 171_v is electrically connected to the image-capture signal line 201_v provided in the v-th column in the pixel portion 10. Note that a gate of the transistor 172_v is electrically connected to the wiring for supplying the pre-charge signal (Pre-charge); one of a source and a drain of the transistor 172_v is electrically connected to the wiring for supplying the fixed potential (Const); and the other of the source and the drain of the transistor 172_v is electrically connected to the image-capture signal line 202_v provided in the v-th column in the pixel portion 10. Note that a gate of the transistor 173_v is electrically connected to the wiring for supplying the pre-charge signal (Pre-charge); one of a source and a drain of the transistor 173_v is electrically connected to the wiring for supplying the fixed potential (Const); and the other of the source and the drain of the transistor 173_v is electrically connected to the image-capture signal line 203_v provided in the v-th column in the pixel portion 10.

Figure 8B:
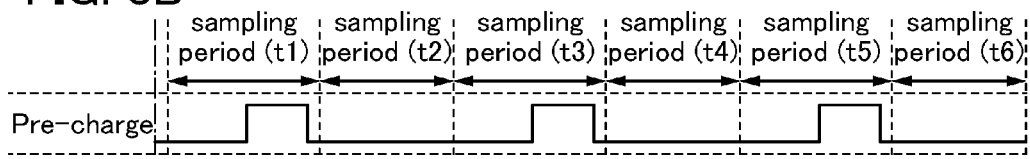
FIG. 8B illustrates an example of operation of a detection circuit.

In FIG. 8B, a potential of the wiring for supplying the pre-charge signal (Pre-charge) is shown. As shown in FIG. 8B, the pre-charge signal (Pre-charge) has a high-level potential in a period preceding a period in which the start pulse (ResetSP) for the reset signal line driver circuit is input to the image sensor driver circuit 16. Thus, the transistors 171_1 to 171_n, transistors 172_1 to 172_n, and transistors 173_1 to 173_n are turned on and the potentials of the image-capture signal lines 201_1 to 201_n, the image-capture signal lines 202_1 to 202_n, and the image-capture signal lines 203_1 to 203_n can each be set to the fixed potential (Const).

Note that the image-capture signal determination circuit 170 can determine the potentials of the image-capture signal lines 201_1 to 201_n, the image-capture signal lines 202_1 to 202_n, and the image-capture signal lines 203_1 to 203_n. Specifically, the image-capture signal determination circuit 170 can have an OP amplifier, an A/D converter, and the like.

<Image Capture by Image Sensor>

Figure 9A:
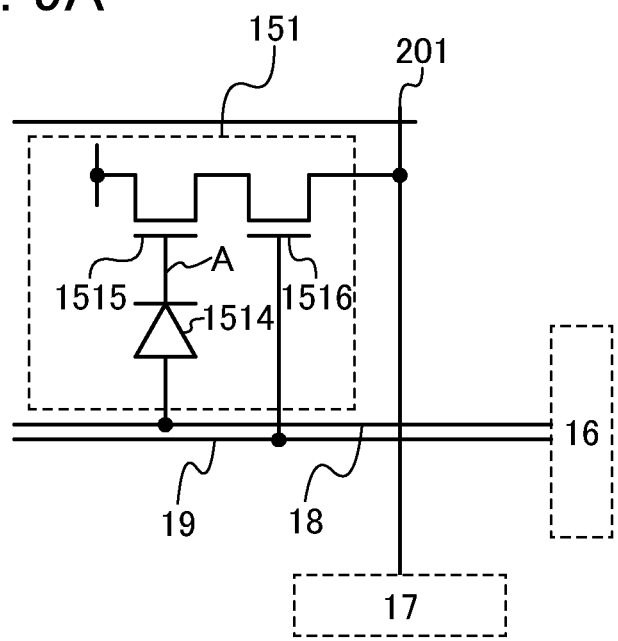
FIG. 9A illustrates a structure example of an image sensor.

Operation of the image sensor included in each pixel in the above-described liquid crystal display device is described below. FIG. 9A is a circuit diagram illustrating an example of an image sensor. Specifically, the circuit diagram of an image sensor in FIG. 9A corresponds to that of the image sensor included in the pixel 151 in FIG. 2A. Therefore, the above description is to be referred to for explanation of the circuit diagram in FIG. 9A. Note that in the circuit diagram in FIG. 9A, a node at which the cathode of the photodiode 1514 is electrically connected to the transistor 1515 is hereinafter referred to as a node A. Further, one of the source and the drain of the transistor 1515 is electrically connected to a wiring for supplying a high-level fixed potential.

Figure 9B:
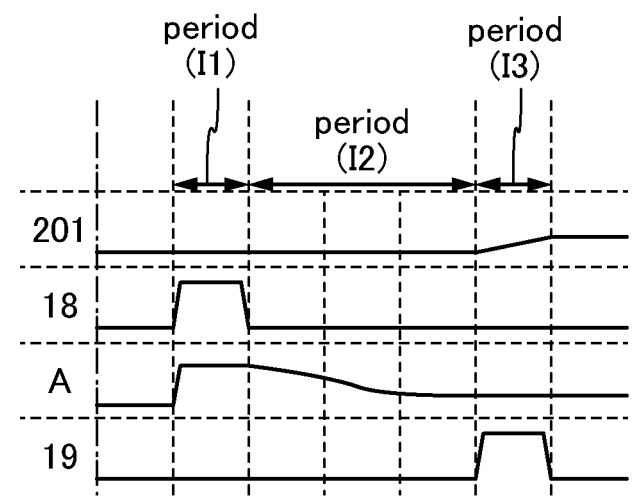
FIG. 9B illustrates an example of operation of an image sensor.

FIG. 9B illustrates an example of operation of the image sensor illustrated in FIG. 9A. In the operation example illustrated in FIG. 9B, before a period (I1), the potential of the image-capture signal line 201 is set to a low-level potential by the detection circuit 17. Then, in the period (I1), a high-level potential is supplied to the reset signal line 18 and the potential of the node A increases to a high-level potential. After that, in a period (I2), the potential of the reset signal line 18 decreases to a low-level potential. Accordingly, a reverse bias is applied to the photodiode 1514. At that time, photocurrent is generated in the photodiode 1514 in accordance with the illuminance of light with which the photodiode 1514 is irradiated and the potential of the node A thus decreases in accordance with the illuminance of the light with which the photodiode 1514 is irradiated. Then, in a period (I3), a high-level potential is supplied to the reading signal line 19 and the transistor 1516 is thus turned on. Thus, the potential of the image-capture signal line 201 is changed depending on the state of the transistor 1515. Specifically, when the current drive capability of the transistor 1515 in the period (I3) is high, the potential of the image-capture signal line 201 greatly increases; when the current drive capability of the transistor 1515 in the period (I3) is low, the potential of the image-capture signal line 201 does not increase so much. Here, the current drive capability is dependent on the potential of the node A. In other words, the current drive capability is dependent on the illuminance of the light with which the photodiode 1514 is irradiated. Therefore, the potential of the image-capture signal line 201 is determined by the detection circuit 17 after the period (I3), whereby the illuminance of the light with which the photodiode 1514 is irradiated in the period (I2) can be detected. That is, image capture can be performed by the image sensor.

<Structure Example of Backlight>

Figure 10A:
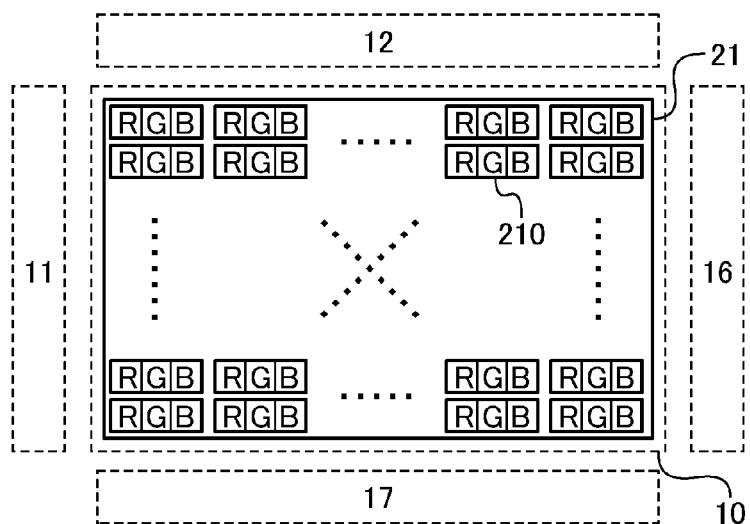
FIG. 10A illustrates a structure example of a backlight.
Figure 10B:
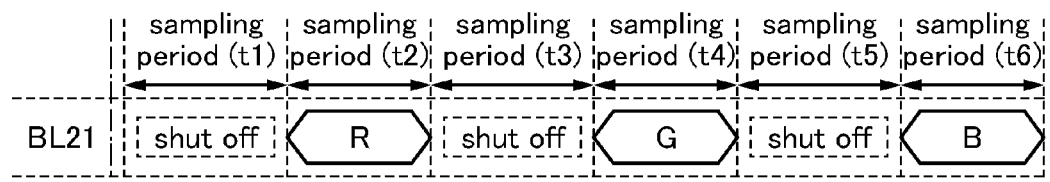
FIG. 10B illustrates an example of operation of a backlight.

FIG. 10A illustrates a structure example of a backlight 21 provided behind the pixel portion 10 in the liquid crystal display device illustrated in FIG. 1. In the backlight illustrated in FIG. 10A, backlight units 210 each including three light sources which emit light of any of red (R), green (G), and blue (B) are arranged in matrix. Note that light emitting diodes (LEDs) or the like can be used as the light sources. FIG. 10B illustrates an example of timing of light emitted from the backlight 21. According to the operation example illustrated in FIG. 10B, red (R) light is emitted from the backlight 21 in the sampling period (t2), green (G) light is emitted from the backlight 21 in the sampling period (t4), and blue (B) light is emitted from the backlight 21 in the sampling period (t6); in the other sampling periods (t1, t3, and t5), the backlight 21 is not lit (i.e., the backlight 21 is shut off).

<Operation Example of Liquid Crystal Display Device>

Figure 11:
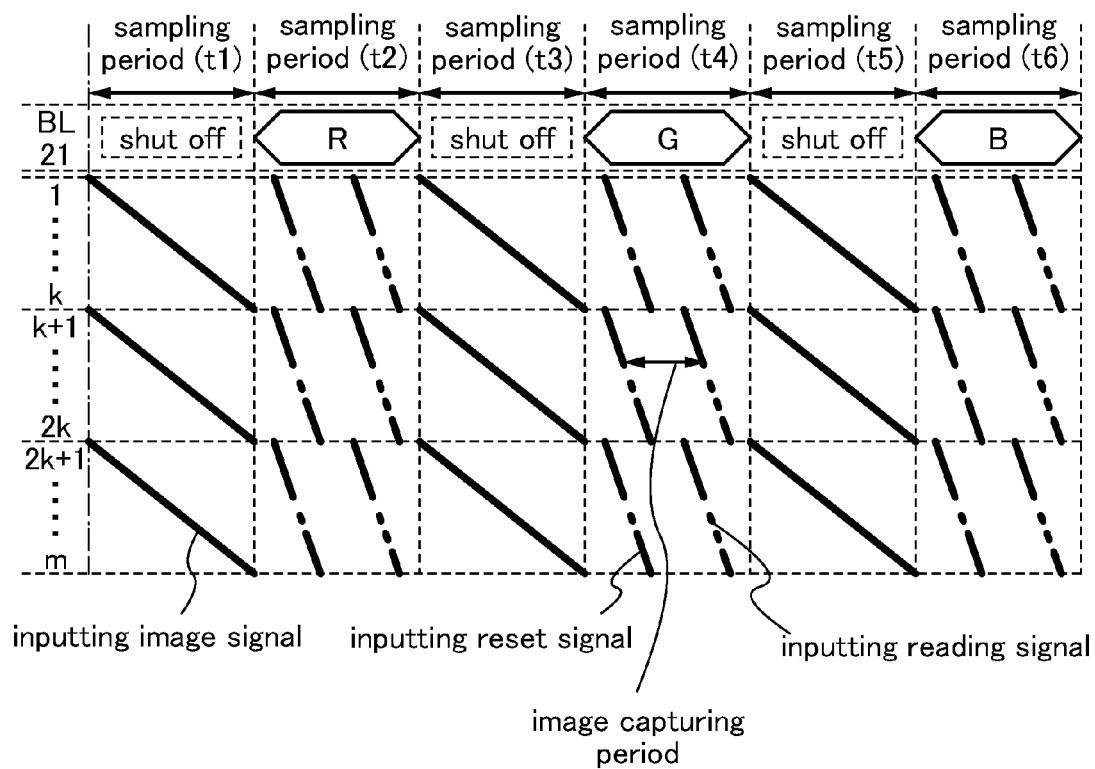
FIG. 11 illustrates an example of operation of a liquid crystal display device.

FIG. 11 illustrates an operation example of the liquid crystal display device. Note that FIG. 11 shows light emitted from the backlight 21 (BL21) and timings of input of an image signal, input of a reset signal, and input of a reading signal for the first to m-th rows each of which includes n pixels in the pixel portion 10 in the sampling periods (t1) to (t6). Specifically, in FIG. 11, 1 to m indicate the number of the rows; the solid line indicates timing of input of an image signal in a corresponding row; the alternate long and short dash line indicates timing of input of a reset signal in a corresponding row; and the alternate long and two short dashes line indicates timing of input of a reading signal in a corresponding row. Further, in FIG. 11, an interval between input of a reset signal and input of a reading signal (i.e., an interval between the alternate long and short dash line and the alternate long and two short dashes line) corresponds to an imaging period.

As illustrated in FIG. 11, in the liquid crystal display device, in the sampling period (t1), the respective n pixels 151 provided in the first to k-th rows are sequentially selected for each row; the respective n pixels 152 provided in the (k+1)-th to 2k-th rows are sequentially selected for each row; and the respective n pixels 153 provided in the (2k+1)-th to m-th rows are sequentially selected for each row. Thus, an image signal for controlling transmission of red (R) light can be input to each pixel. Similarly, in the liquid crystal display device, in the sampling period (t3), an image signal for controlling transmission of green (G) light can be input to each pixel, and in the sampling period (t5), an image signal for controlling transmission of blue (B) light can be input to each pixel.

Moreover, in the liquid crystal display device, in the sampling period (t2), red (R) light is emitted from the backlight 21 to the pixel portion 10; in the sampling period (t4), green (G) light is emitted from the backlight 21 to the pixel portion 10; and in the sampling period (t6), blue (B) light is emitted from the backlight 21 to the pixel portion 10.

In the liquid crystal display device, it is possible that, in the sampling periods (t2, t4, and t6), image capture is sequentially performed in the first to k-th rows each of which includes n pixels 151; image capture is sequentially performed in the (k+1)-th to 2k-th rows each of which includes n pixels 152; and image capture is sequentially performed in the (2k+1)-th to m-th rows each of which includes n pixels 153.

<Liquid Crystal Display Device Disclosed in This Embodiment>

In the liquid crystal display device disclosed in this embodiment, image signals can be concurrently supplied to pixels provided in a plurality of rows among pixels arranged in matrix. Further, image capture can be concurrently performed in pixels provided in a plurality of rows among pixels arranged in matrix. Thus, the frequency of input of an image signal to each pixel of the liquid crystal display device can be increased and a sufficient imaging period can be secured. As a result, in the liquid crystal display device, display deterioration such as color break which is caused in a field-sequential liquid crystal display device can be suppressed and improvements in image quality and detection accuracy in image capture can be realized.

Modification Example

The above-described liquid crystal display device is one embodiment of the present invention, and the present invention includes a liquid crystal display device which is different from the above-described liquid crystal display device.

For example, the above-described liquid crystal display device has the structure in which the pixel portion is divided into three regions; however, the liquid crystal display device of one embodiment of the present invention is not limited to having this structure. In other words, in the liquid crystal display device of one embodiment of the present invention, the pixel portion can be divided into a plurality of regions the number of which is not three. Note that in the case where the number of regions is changed, the number of regions needs to be equal to the number of image signal lines and that of image-capture signal lines, for example.

Further, the liquid crystal display device includes a capacitor for holding voltage applied to a liquid crystal element (see FIGS. 2A to 2C); however, it is possible not to provide the capacitor. In that case, the aperture ratio of the pixel can be improved. In addition, since the capacitor wiring extending to the pixel portion can be omitted, a variety of wirings can be driven at high speed.

Moreover, although each pixel is provided with the display element and the image sensor in the liquid crystal display device (see FIGS. 2A to 2C), a structure in which a display pixel provided with a display element and an image-capture pixel provided with an image sensor are independently formed can be alternatively employed. In a specific example of such a structure, display pixels are provided in m rows and n columns and image-capture pixels are provided in x rows and y columns (x is a natural number other than m and y is a natural number other than n).

Figure 12A:
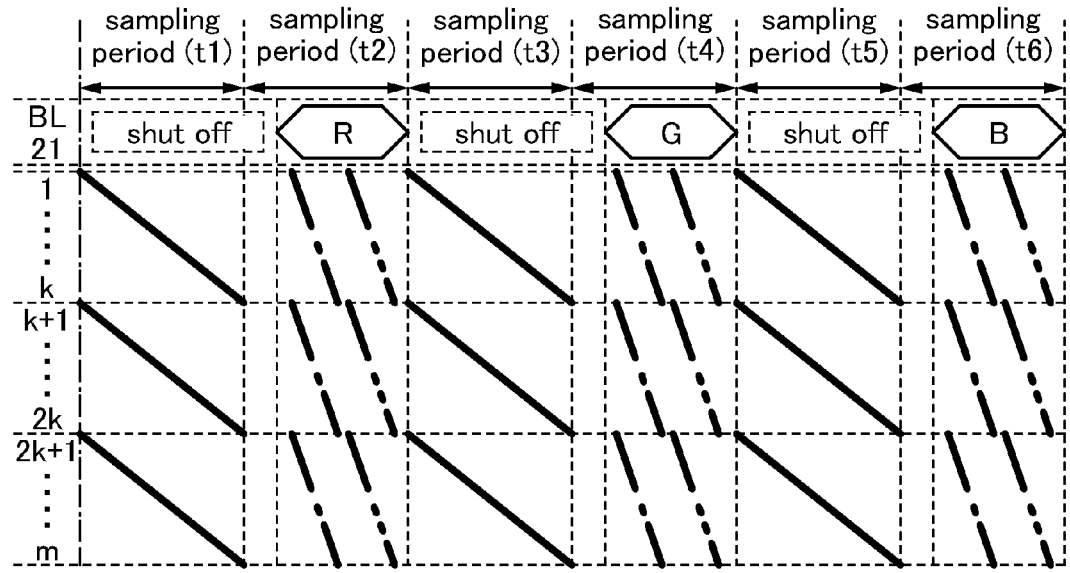
FIGS. 12A and 12B illustrate examples of operation of liquid crystal display devices.

In the liquid crystal display device, light of a given color is emitted to the pixel portion in each of the sampling periods (t2, t4, and t6) as illustrated in FIG. 10B and FIG. 11; however, operation of the liquid crystal display device of one embodiment of the present invention is not limited to having this structure. For example, in the above-described liquid crystal display device, a period (a shut-off period) in which the backlight is not lit can be provided at the beginning of each of the sampling periods (t2, t4, and t6) as illustrated in FIG. 12A. In that case, a response time of the liquid crystal elements of the pixels (e.g., the pixels provided in the k-th row, the 2k-th row and the m-th row in the pixel portion) to which the image signals are input at the end of the sampling periods (t1, t3, and t5) can be secured. In other words, light leakage in the pixels can be suppressed. Note that in the case of providing the shut-off period, scan of a reset signal is preferably started after the shut-off period so that accurate image capture is performed.

Figure 12B:
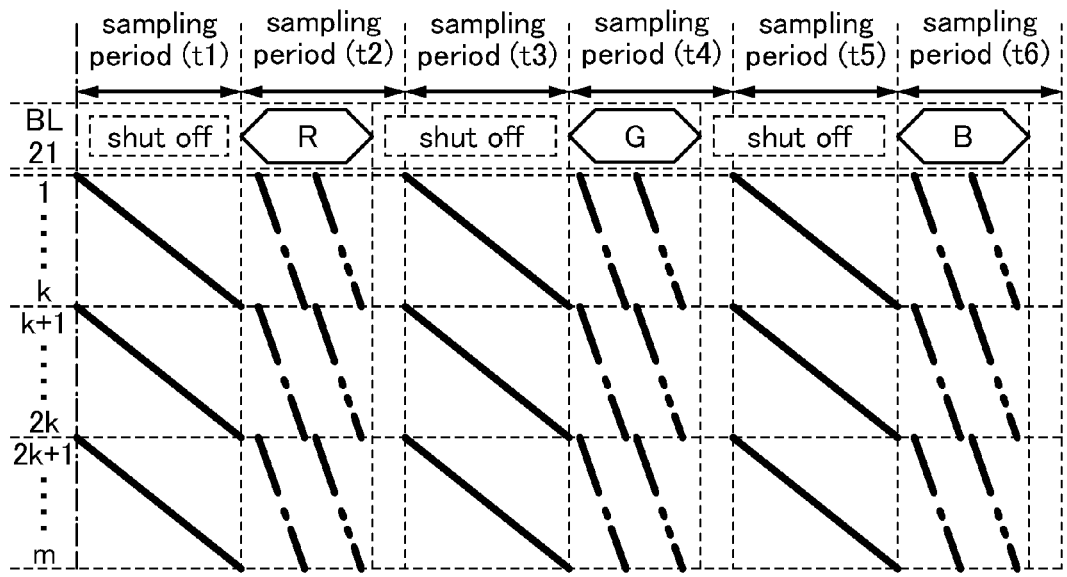

Further, a period (a shut-off period) in which the backlight is not lit can be provided at the end of each of the sampling periods (t2, t4, and t6) as illustrated in FIG. 12B. In that case, a period can be secured in which the polarity of the counter potential supplied to the other electrode (the counter electrode) of the liquid crystal element of the liquid crystal display device is inverted (this inversion is called common inversion). Note that in many general liquid crystal display devices, the polarity of a voltage which is applied to a liquid crystal element is inverted every predetermined period (i.e., the potential of an image signal input to a pixel is switched between a potential higher than a counter potential and a potential lower than the counter potential every predetermined period) in order to suppress deterioration of the liquid crystal element. By performing common inversion driving, the voltage amplitude of the image signal can be reduced. Note that although the shut-off period is provided in all the sampling periods (t2, t4, and t6) in FIG. 12B, the shut-off period may be provided only in a predetermined sampling period. For example, the shut-off period can be provided every period in which one image is produced in the pixel portion. Note that in the case of providing the shut-off period, scan of a reading signal is preferably finished before the shut-off period so that accurate image capture is performed.

Figure 13:
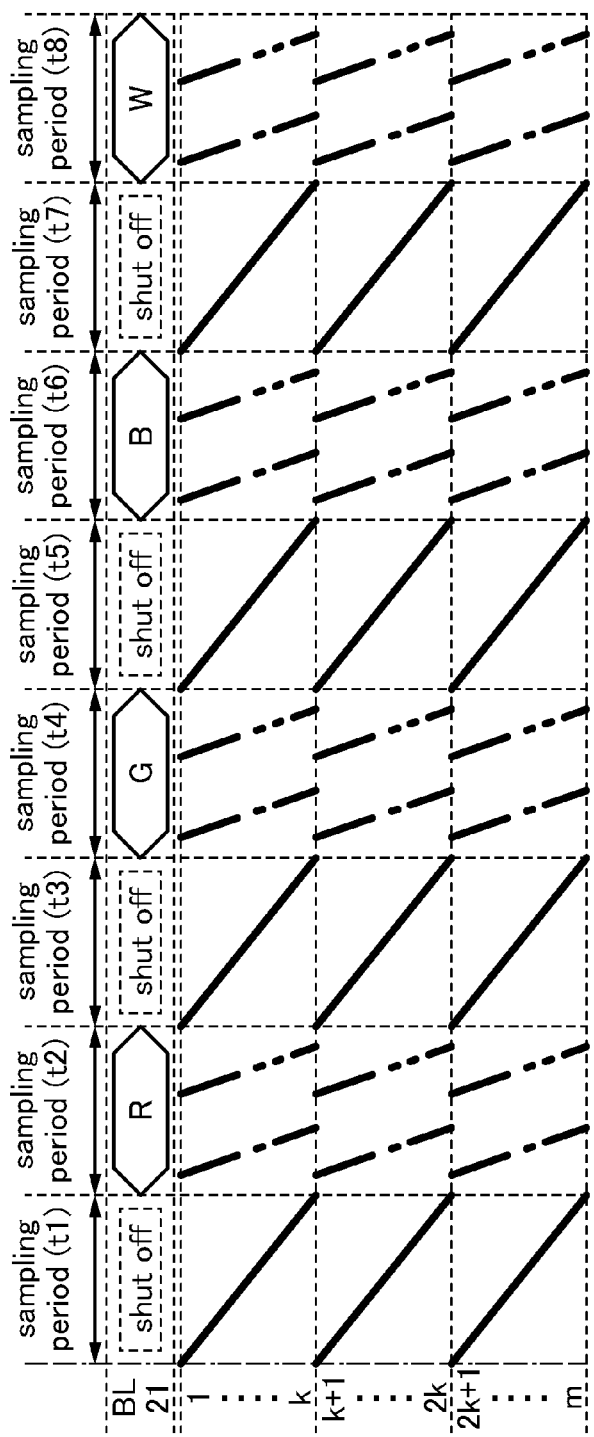
FIG. 13 illustrates an example of operation of a liquid crystal display device.
Figure 14:
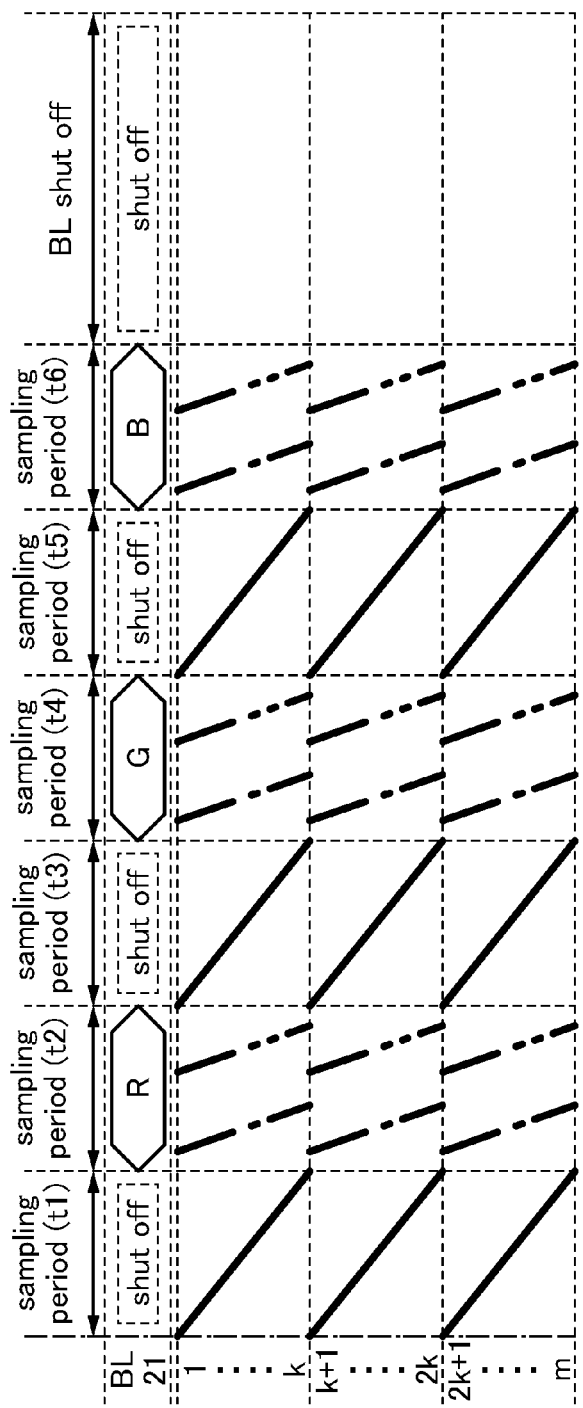
FIG. 14 illustrates an example of operation of a liquid crystal display device.

The liquid crystal display device has a structure where the backlight sequentially emits red (R) light, green (G) light, and blue (B) light to the pixel portion (see FIG. 10B, FIG. 11, and FIGS. 12A and 12B); however, the lighting order is not limited (red (R) light, green (G) light, and blue (B) light can be emitted in any appropriate order). Further, a structure (see FIG. 13) where light sources capable of emitting red (R) light, green (G) light, and blue (B) light are lit at the same time in the backlight, so that white (W) light can be produced and emitted to the pixel portion can be employed. Further, a structure (see FIG. 14) where a period (a black insertion period) in which the backlight is shut off is provided after an image is produced in the pixel portion can be employed. With the black insertion period, color break can be suppressed. Alternatively, light of a given color, the amount of which is larger than that of light of the other colors, can be emitted to the pixel portion. Specifically, the amount of blue (B) light emitted to the pixel portion, which has a low luminosity factor, can be larger than that of green (G) light emitted to the pixel portion, which has a high luminosity factor.

Furthermore, the liquid crystal display device has a structure where the backlight unit has light sources capable of emitting light of three colors of red (R), green (G), and blue (B); however, the structure of the liquid crystal display device of one embodiment of the present invention is not limited to such a structure. In other words, in the liquid crystal display device of one embodiment of the present invention, the backlight unit can be formed by arbitrarily combining plural light sources that emit light of different colors. For example, combination of light sources that emit light of four colors of red (R), green (G), blue (B), and white (W) or four colors of red (R), green (G), blue (B), and yellow (Y), combination of light sources that emit light of a plurality of complementary colors, and the like are possible. Note that in the case where the backlight unit includes a light source emitting white (W) light, white (W) light can be produced by the light source without mixture of colors. Since the light source has high luminous efficiency, power consumption can be reduced by forming the backlight unit using the light source. Further, in the case where the backlight unit includes light sources that emit light of two complementary colors (e.g., light sources that emit two colors of blue (B) and yellow (Y)), white (W) light can be produced by mixture of the light of the two colors. Further, light sources that emit light of six colors of pale red (R), pale green (G), pale blue (B), deep red (R), deep green (G), and deep blue (B) can be used in combination or light sources that emit light of six colors of red (R), green (G), blue (B), cyan (C), magenta (M), and yellow (Y) can be used in combination. In this manner, by a combination of light sources that emit light of a larger number of colors, the color gamut of the liquid crystal display device can be increased, so that image quality can be improved.

The structures in Modification Example can be applied in combination to the liquid crystal display device which is described with reference to FIG. 1, FIGS. 2A to 2C, FIGS. 3A and 3B, FIGS. 4A and 4B, FIG. 5, FIG. 6, FIG. 7, FIGS. 8A and 8B, FIGS. 9A and 9B, FIGS. 10A and 10B, and FIG. 11.

Embodiment 2

In this embodiment, operation of a liquid crystal display device of one embodiment of the present invention, which is different from the liquid crystal display device described in Embodiment 1 is described with reference to FIGS. 22A and 22B, FIG. 23, FIG. 24, FIG. 25, FIG. 26, FIG. 27, and FIG. 28.
<Structure Example of Liquid Crystal Display Device>

As the liquid crystal display device in this embodiment, the liquid crystal display device (see FIG. 1 and FIGS. 2A to 2C) described in Embodiment 1 can be applied. Therefore, the description in Embodiment 1 is to be referred to.
<Structure Example of Scan Line Driver Circuit>

As a scan line driver circuit included in the liquid crystal display device in this embodiment, the scan line driver circuit 11 (see FIG. 3A) included in the liquid crystal display device described in Embodiment 1 can be applied. Therefore, the description in Embodiment 1 is to be referred to for the structure of the scan line driver circuit.

An operation example of the scan line driver circuit 11 in this embodiment is described with reference to FIG. 22A. Note that in FIG. 22A, the start pulse (GSP) for the scan line driver circuit, the clock signal (GCK) for the scan line driver circuit, the signals (SR110out) output from the m output terminals of the shift register 110, the first pulse-width control signal (GPWC1) for the scan line driver circuit, the second pulse-width control signal (GPWC2) for the scan line driver circuit, and potentials of the scan lines 13_1 to 13_*m* are shown.

Figure 22A:
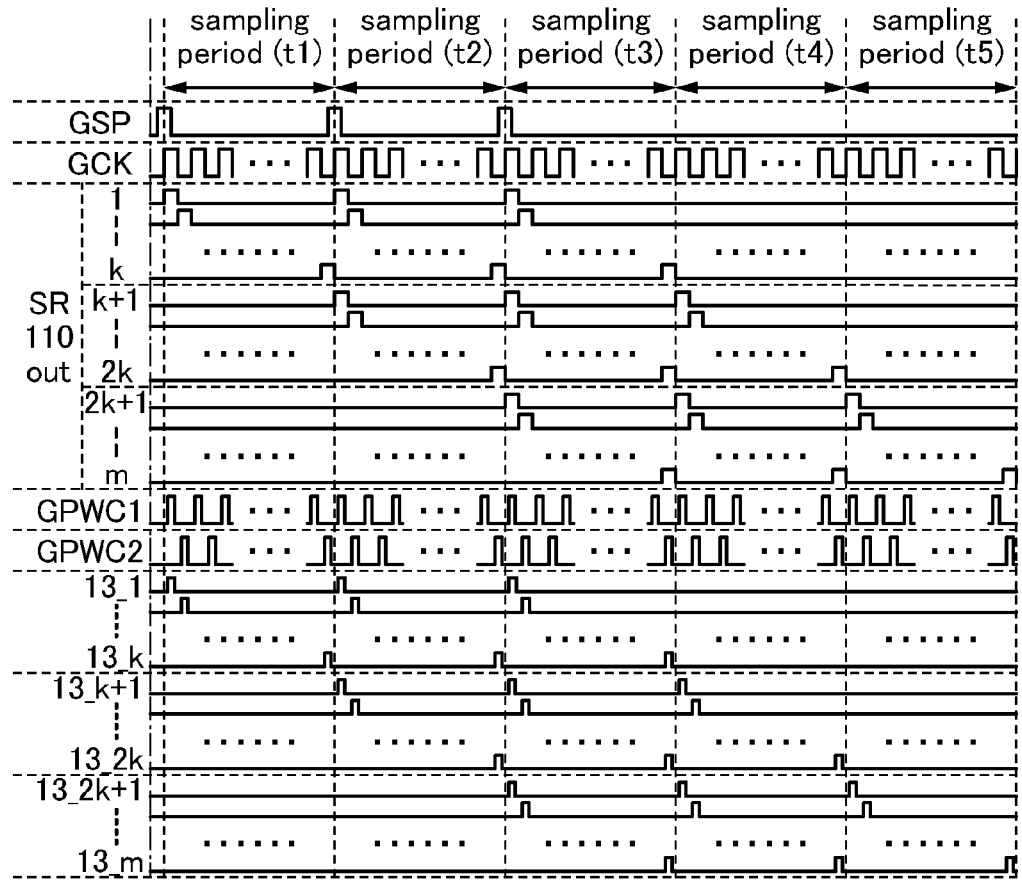
FIG. 22A illustrates an example of operation of a scan line driver circuit.

In the operation example illustrated in FIG. 22A, the start pulse (GSP) for the scan line driver circuit which has a high-level potential is input to the shift register 110 just before the sampling period (t1). Thus, in the sampling period (t1), high-level potentials are sequentially output from the first to k-th output terminals of the shift register 110. Further, the AND gates 111_1 to 111_*k* sequentially supply high-level potentials to the respective scan lines 13_1 to 13_*k* which are provided in the first to k-th rows. Note that the length of a period (a horizontal scanning period) in which a high-level potential is supplied to the scan line is substantially the same as that (a pulse width) of a period in which the potential of the first pulse-width control signal (GPWC1) for the scan line driver circuit or the second pulse-width control signal (GPWC2) for the scan line driver circuit is a high-level.

Then, just before the sampling period (t2), i.e., at the end of the sampling period (t1), the start pulse (GSP) for the scan line driver circuit which has a high-level potential is input to the shift register 110. Thus, in the sampling period (t2), high-level potentials are sequentially output from the first to k-th output terminals and the (k+1)-th to 2k-th output terminals of the shift register 110. Further, the AND gates 111_1 to 111_*k* sequentially supply high-level potentials to the respective scan lines 13_1 to 13_*k* which are provided in the first to k-th rows; and the AND gates 111_*k*+1 to 111_2k sequentially supply high-level potentials to the respective scan lines 13_*k*+1 to 13_2k which are provided in the (k+1)-th to 2k-th rows.

Then, just before the sampling period (t3), i.e., at the end of the sampling period (t2), the start pulse (GSP) for the scan line driver circuit which has a high-level potential is input to the shift register 110. Thus, in the sampling period (t3), high-level potentials are sequentially output from the first to k-th output terminals, the (k+1)-th to 2k-th output terminals, and the (2k+1)-th to m-th output terminals of the shift register 110. Further, the AND gates 111_1 to 111_*k* sequentially supply high-level potentials to the respective scan lines 13_1 to 13_*k* which are provided in the first to k-th rows; the AND gates 111_*k*+1 to 111_2k sequentially supply high-level potentials to the respective scan lines 13_*k*+1 to 13_2k which are provided in the (k+1)-th to 2k-th rows; and the AND gates 111_2k+1 to 111_*m* sequentially supply high-level potentials to the respective scan lines 13_2k+1 to 13_*m* which are provided in the (2k+1)-th to m-th rows.

After that, in the sampling period (t4), high-level potentials are sequentially output from the (k+1)-th to 2k-th output terminals and the (2k+1)-th to m-th output terminals of the shift register 110. Further, the AND gates 111_*k*+1 to 111_2k sequentially supply high-level potentials to the respective scan lines 13_*k*+1 to 13_2k which are provided in the (k+1)-th to 2k-th rows; and the AND gates 111_2k+1 to 111_*m* sequentially supply high-level potentials to the respective scan lines 13_2k+1 to 13_*m* which are provided in the (2k+1)-th to m-th rows.

Then, in the sampling period (t5), high-level potentials are sequentially output from the (2k+1)-th to m-th output terminals of the shift register 110. Further, the AND gates 111_2k+1 to 111_*m* sequentially supply high-level potentials to the respective scan lines 13_2k+1 to 13_*m* which are provided in the (2k+1)-th to m-th rows.

<Structure Example of Image Signal Line Driver Circuit>

As an image signal line driver circuit included in the liquid crystal display device in this embodiment, the image signal line driver circuit 12 (see FIG. 4A) included in the liquid crystal display device described in Embodiment 1 can be applied. Therefore, the description in Embodiment 1 is to be referred to for the structure of the image signal line driver circuit.

Figure 22B:
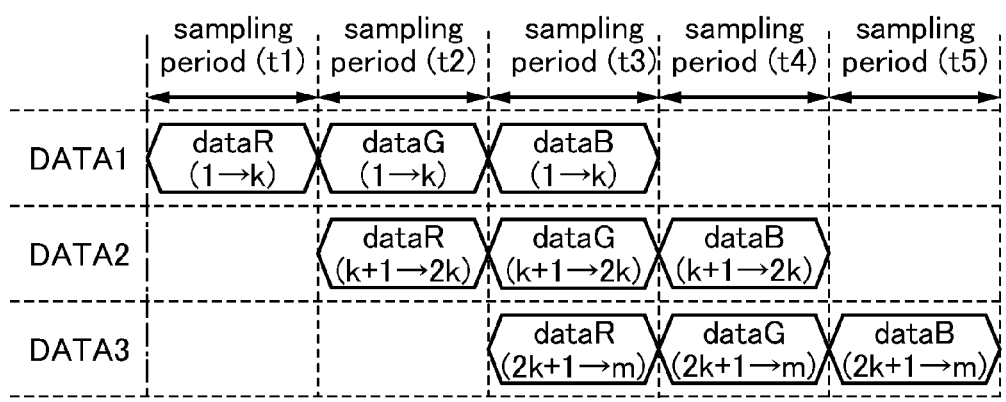
FIG. 22B illustrates an example of operation of a signal line driver circuit.

An operation example of the image signal line driver circuit 12 in this embodiment is described with reference to FIG. 22B. FIG. 22B illustrates an example of timings of image signals supplied by the wirings for supplying the first image signal (DATA1), the second image signal (DATA2), and the third image signal (DATA3).

As illustrated in FIG. 22B, in the sampling period (t1), the wiring for supplying the first image signal (DATA1) supplies an image signal (dataR(1→k)) for controlling transmission of red (R) light for the pixels provided in the first to k-th rows. In the sampling period (t2), the wiring for supplying the first image signal (DATA1) supplies an image signal (dataG(1→k)) for controlling transmission of green (G) light for the pixels provided in the first to k-th rows. In the sampling period (t3), the wiring for supplying the first image signal (DATA1) supplies an image signal (dataB(1→k)) for controlling transmission of blue (B) light for the pixels provided in the first to k-th rows. In the sampling period (t2), the wiring for supplying the second image signal (DATA2) supplies an image signal (dataR(k+1→2k)) for controlling transmission of red (R) light for the pixels provided in the (k+1)-th to 2k-th rows. In the sampling period (t3), the wiring for supplying the second image signal (DATA2) supplies an image signal (dataG(k+12k)) for controlling transmission of green (G) light for the pixels provided in the (k+1)-th to 2k-th rows. In the sampling period (t4), the wiring for supplying the second image signal (DATA2) supplies an image signal (dataB(k+1→2k)) for controlling transmission of blue (B) light for the pixels provided in the (k+1)-th to 2k-th rows. In the sampling period (t3), the wiring for supplying the third image signal (DATA3) supplies an image signal (dataR(2k+1→m)) for controlling transmission of red (R) light for the pixels provided in the (2k+1)-th to m-th rows. In the sampling period (t4), the wiring for supplying the third image signal (DATA3) supplies an image signal (dataG(2k+1→m)) for controlling transmission of green (G) light for the pixels provided in the (2k+1)-th to m-th rows. In the sampling period (t5), the wiring for supplying the third image signal (DATA3) supplies an image signal (dataB(2k+1→m)) for controlling transmission of blue (B) light for the pixels provided in the (2k+1)-th to m-th rows.

<Writing of Image Signal>

In the structure of the liquid crystal display device in this embodiment, a period (the sampling period (t3)) can be provided in which supply of an image signal for controlling transmission of red (R) light (i.e., input of the red (R) image signal for the pixel portion), supply of an image signal for controlling transmission of green (G) light (i.e., input of the green (G) image signal for the pixel portion), and supply of an image signal for controlling transmission of blue (B) light (i.e., input of the blue (B) image signal for the pixel portion) are concurrently performed.

<Structure Example of Image Sensor Driver Circuit>

As an image sensor driver circuit included in the liquid crystal display device in this embodiment, the image sensor driver circuit 16 (see FIG. 5) included in the liquid crystal display device described in Embodiment 1 can be applied. Therefore, the description in Embodiment 1 is to be referred to for the structure of the image sensor driver circuit.

Figure 23:
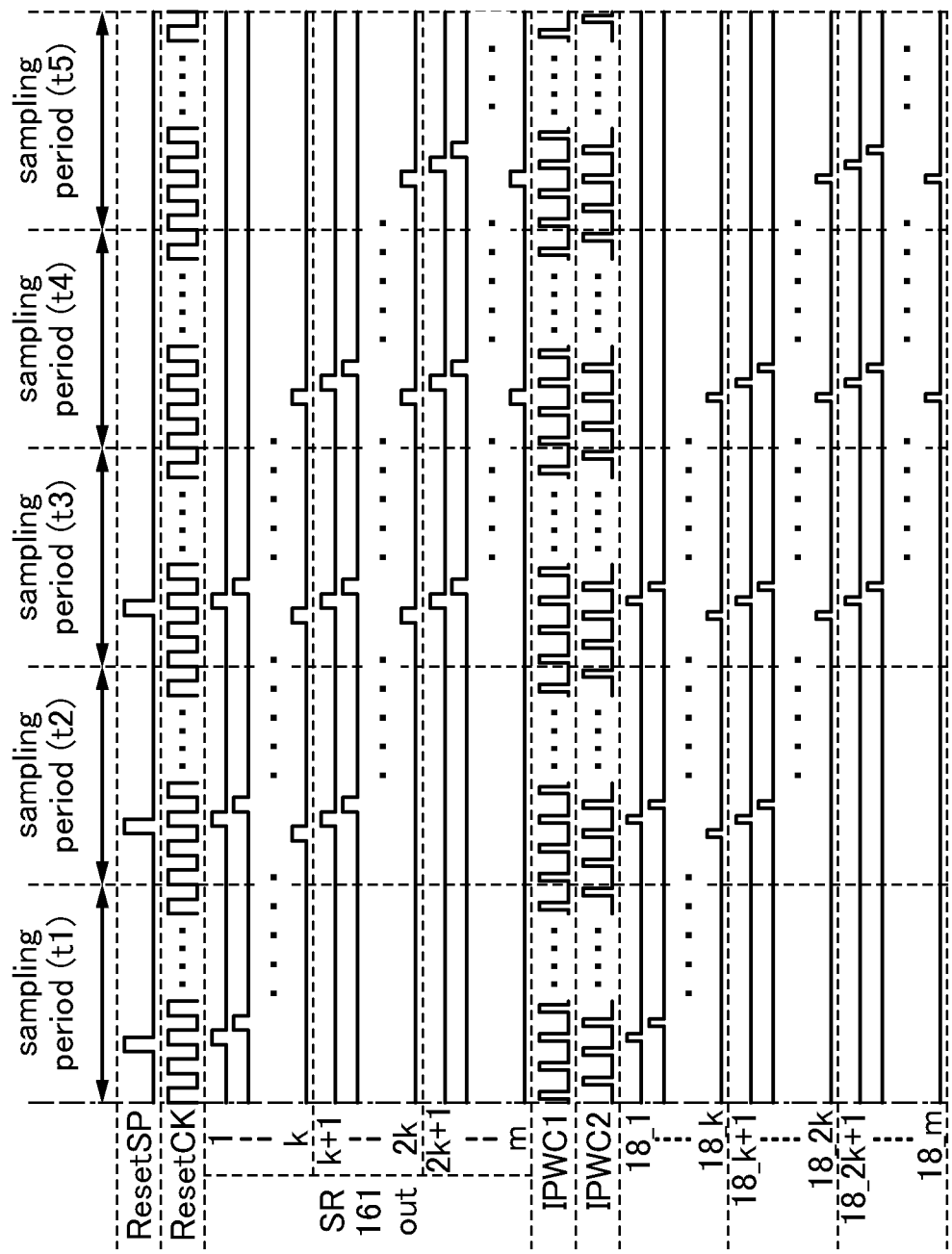
FIG. 23 illustrates an example of operation of an image sensor driver circuit.
Figure 24:
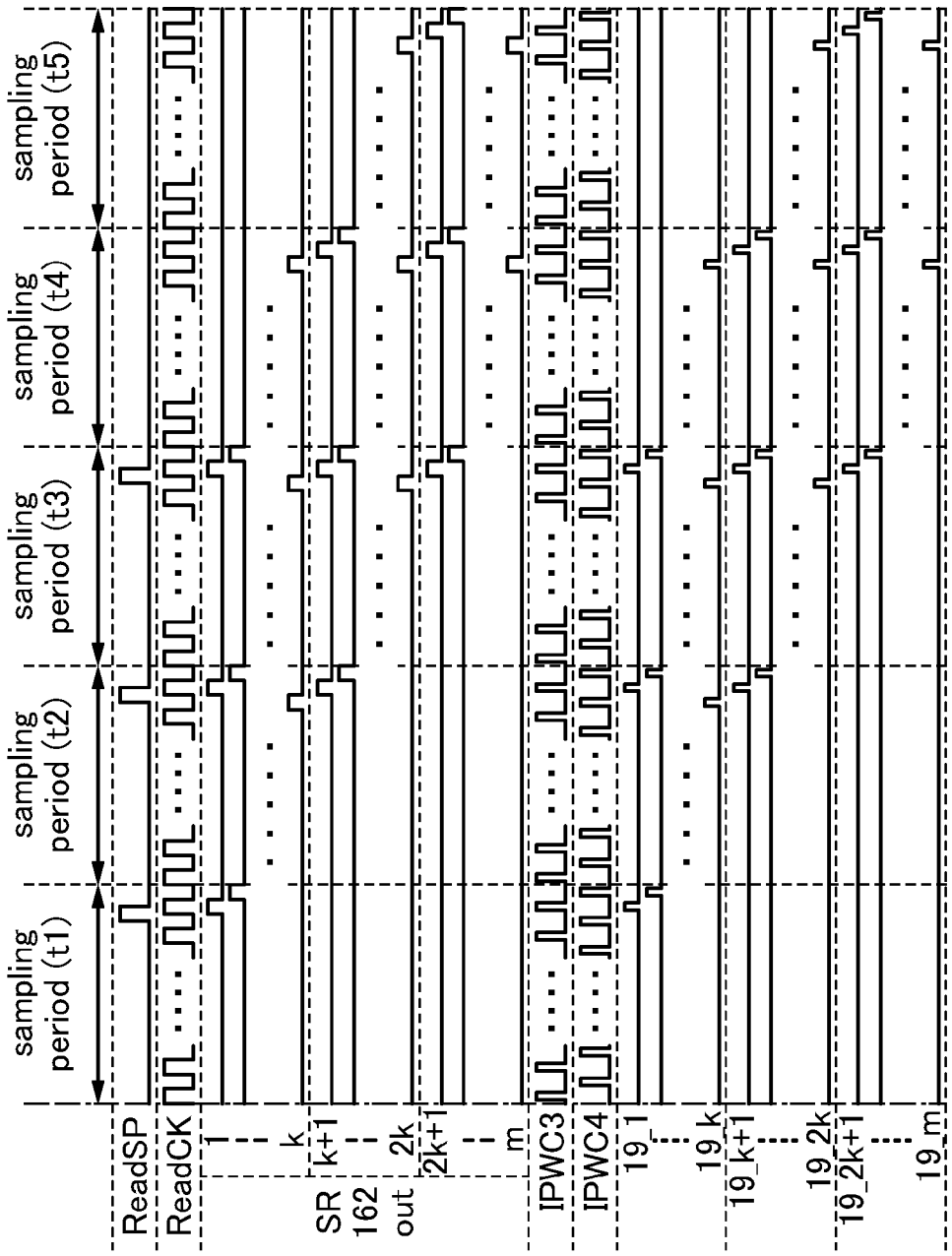
FIG. 24 illustrates an example of operation of an image sensor driver circuit.

An operation example of the image sensor driver circuit 16 in this embodiment is described with reference to FIG. 23 and FIG. 24. Note that in FIG. 23, the start pulse (ResetSP) for the reset signal line driver circuit, the clock signal (ResetCK) for the reset signal line driver circuit, the signals (SR161out) output from the m output terminals of the shift register 161, the first pulse-width control signal (IPWC1) for the image sensor driver circuit, the second pulse-width control signal (IPWC2) for the image sensor driver circuit, and potentials of the reset signal lines 18_1 to 18_*m* are shown. Further, in FIG. 24, the start pulse (ReadSP) for the reading signal line driver circuit, the clock signal (ReadCK) for the reading signal line driver circuit, the signals (SR162out) output from the m output terminals of the shift register 162, the third pulse-width control signal (IPWC3) for the image sensor driver circuit, the fourth pulse-width control signal (IPWC4) for the image sensor driver circuit, and potentials of the reading signal lines 19_1 to 19_*m* are shown.

First, an example of driving of the reset signal lines 18_1 to 18_*m* by the image sensor driver circuit 16 is described with reference to FIG. 23.

First, in the sampling period (t1), a signal that has a high-level potential is supplied to the image sensor driver circuit 16 as the start pulse (ResetSP) for the reset signal line driver circuit. Note that the signal is supplied to the image sensor driver circuit 16 in a period (a lighting period) in which the backlight units for the first to t-th rows (here, t is k/4) included in the backlight to be described below are lit. Accordingly, sequentially from the first output terminal of the shift register 161, a signal that has a high-level potential is shifted every half the cycle of the clock signal (ResetCK) for the reset signal line driver circuit. Here, each of the AND gates 163_1 to 163_*m* outputs a logical AND of any of the signals output from the m output terminals of the shift register 161 and any of the first pulse-width control signal (IPWC1) for the image sensor driver circuit and the second pulse-width control signal (IPWC2) for the image sensor driver circuit. In other words, sequentially from the reset signal line 18_1 provided in the first row, a signal that has a high-level potential is shifted in the sampling period (t1).

Then, in the sampling period (t2), a signal that has a high-level potential is supplied to the image sensor driver circuit 16 as the start pulse (ResetSP) for the reset signal line driver circuit. Note that the signal is supplied to the image sensor driver circuit 16 at a stage where the shift of the signal that has a high-level potential which starts in the sampling period (t1) reaches the k-th output terminal of the shift register 161 in a period (a lighting period) in which the backlight units for the (k+1)-th to (k+t)-th rows included in the backlight to be described below are lit. In this manner, in the shift register 161, concurrently with a shift of a signal that has a high-level potential in the (k+1)-th output terminal and the subsequent output terminals, a signal that has a high-level potential is shifted sequentially from the first output terminal. In other words, in the sampling period (t2), concurrently with the shift of the signal that has a high-level potential in the reset signal line 18_*k*+1 provided in the (k+1)-th row and the subsequent reset signal lines, a signal that has a high-level potential is shifted sequentially from the reset signal line 18_1 provided in the first row.

Then, in the sampling period (t3), a signal that has a high-level potential is supplied to the image sensor driver circuit 16 as the start pulse (ResetSP) for the reset signal line driver circuit. Note that the signal is supplied to the image sensor driver circuit 16 at a stage where the shift of the signal that has a high-level potential which starts in the sampling period (t2) reaches the k-th output terminal of the shift register 161 in a period (a lighting period) in which the backlight units for the (2k+1)-th to (2k+t)-th rows included in the backlight to be described below are lit. In this manner, in the shift register 161, concurrently with a shift of a signal that has a high-level potential in the (2k+1)-th output terminal and the subsequent output terminals and the shift of the signal that has a high-level potential in the (k+1)-th output terminal and the subsequent output terminals, a signal that has a high-level potential is shifted sequentially from the first output terminal. In other words, in the sampling period (t3), concurrently with a shift of a signal that has a high-level potential in the reset signal line 18_2k+1 provided in the (2k+1)-th row and the subsequent reset signal lines and the shift of the signal that has a high-level potential in the reset signal line 18_*k*+1 provided in the (k+1)-th row and the subsequent reset signal lines, a signal that has a high-level potential is shifted sequentially from the reset signal line 18_1 provided in the first row.

Then, in the sampling period (t4), the three signals that have high-level potentials are concurrently shifted in a period before the shift of the signal that has a high-level potential which starts in the sampling period (t1) is finished (i.e., a period before a high-level potential is supplied to the reset signal line 18_*m* provided in the m-th row); then, after the shift of the signal that has a high-level potential which starts in the sampling period (t1) is finished, the two signals that have high-level potentials are concurrently shifted in the shift register 161.

Then, in the sampling period (t5), the two signals that have high-level potentials are concurrently shifted in a period before the shift of the signal that has a high-level potential which starts in the sampling period (t2) is finished (i.e., a period before a high-level potential is supplied to the reset signal line 18_*m* provided in the m-th row); then, after the shift of the signal that has a high-level potential which starts in the sampling period (t2) is finished, the one signal that has a high-level potential is shifted in the shift register 161.

Next, an example of driving of the reading signal lines 19_1 to 19_*m* by the image sensor driver circuit 16 is described with reference to FIG. 24.

First, in the sampling period (t1), a signal that has a high-level potential is supplied to the image sensor driver circuit 16 as the start pulse (ReadSP) for the reading signal line driver circuit. Note that the signal is supplied to the image sensor driver circuit 16 after supply of the start pulse (ResetSP) for the reset signal line driver circuit in the sampling period (t1) is performed in a period (a lighting period) in which the backlight units for the first to t-th rows included in the backlight to be described below are lit. Accordingly, sequentially from the first output terminal of the shift register 162, a signal that has a high-level potential is shifted every half the cycle of the clock signal (ReadCK) for the reading signal line driver circuit. Here, each of the AND gates 164_1 to 164_*m* outputs a logical AND of any of the signals output from the m output terminals of the shift register 162 and any of the third pulse-width control signal (IPWC3) for the image sensor driver circuit and the fourth pulse-width control signal (IPWC4) for the image sensor driver circuit. In other words, sequentially from the reading signal line 19_1 provided in the first row, a signal that has a high-level potential is shifted in the sampling period (t1).

Next, in the sampling period (t2), a signal that has a high-level potential is supplied to the image sensor driver circuit 16 as the start pulse (ReadSP) for the reading signal line driver circuit. Note that the signal is supplied to the image sensor driver circuit 16 after supply of the start pulse (ResetSP) for the reset signal line driver circuit in the sampling period (t2) is performed in a period (a lighting period) in which the backlight units for the (k+1)-th to (k+t)-th rows included in the backlight to be described below are lit. In this manner, in the shift register 162, concurrently with a shift of a signal that has a high-level potential in the (k+1)-th output terminal and the subsequent output terminals, a signal that has a high-level potential is shifted sequentially from the first output terminal. In other words, in the sampling period (t2), concurrently with the shift of the signal that has a high-level potential in the reading signal line 19_*k*+1 provided in the (k+1)-th row and the subsequent reading signal lines, a signal that has a high-level potential is shifted sequentially from the reading signal line 19_1 provided in the first row.

Next, in the sampling period (t3), a signal that has a high-level potential is supplied to the image sensor driver circuit 16 as the start pulse (ReadSP) for the reading signal line driver circuit. Note that the signal is supplied to the image sensor driver circuit 16 after supply of the start pulse (ResetSP) for the reset signal line driver circuit in the sampling period (t3) is performed in a period (a lighting period) in which the backlight units for the (2k+1)-th to (2k+t)-th rows included in the backlight to be described below are lit. In this manner, in the shift register 162, concurrently with a shift of a signal that has a high-level potential in the (2k+1)-th output terminal and the subsequent output terminals and the shift of the signal that has a high-level potential in the (k+1)-th output terminal and the subsequent output terminals, a signal that has a high-level potential is shifted sequentially from the first output terminal. In other words, in the sampling period (t3), concurrently with the shift of the signal that has a high-level potential in the reading signal line 19_2k+1 provided in the (2k+1)-th row and the subsequent reading signal lines and the shift of the signal that has a high-level potential in the reading signal line 19_*k*+1 provided in the (k+1)-th row and the subsequent reading signal lines, a signal that has a high-level potential is shifted sequentially from the reading signal line 19_1 provided in the first row.

Then, in the sampling period (t4), the three signals that have high-level potentials are concurrently shifted in a period before the shift of the signal that has a high-level potential which starts in the sampling period (t1) is finished (i.e., a period before a high-level potential is supplied to the reading signal line 19_*m* provided in the m-th row); then, after the shift of the signal that has a high-level potential which starts in the sampling period (t1) is finished, the two signals that have high-level potentials are concurrently shifted in the shift register 162.

Then, in the sampling period (t5), the two signals that have high-level potentials are concurrently shifted in a period before the shift of the signal that has a high-level potential which starts in the sampling period (t2) is finished (i.e., a period before a high-level potential is supplied to the reading signal line 19_*m* provided in the m-th row); then, after the shift of the signal that has a high-level potential which starts in the sampling period (t2) is finished, the one signal that has a high-level potential is shifted in the shift register 162.

<Structure Example of Detection Circuit>

As a detection circuit included in the liquid crystal display device in this embodiment, the detection circuit 17 (see FIG. 8A) included in the liquid crystal display device described in Embodiment 1 can be applied. Therefore, the description in Embodiment 1 is to be referred to for the structure of the detection circuit.

<Structure Example of Backlight>

As the backlight included in the liquid crystal display device in this embodiment, the backlight 21 (see FIG. 10A) included in the liquid crystal display device described in Embodiment 1 can be applied. Therefore, the description in Embodiment 1 is to be referred to for the structure of the backlight.

<Operation Example of Liquid Crystal Display Device>

Figure 25:
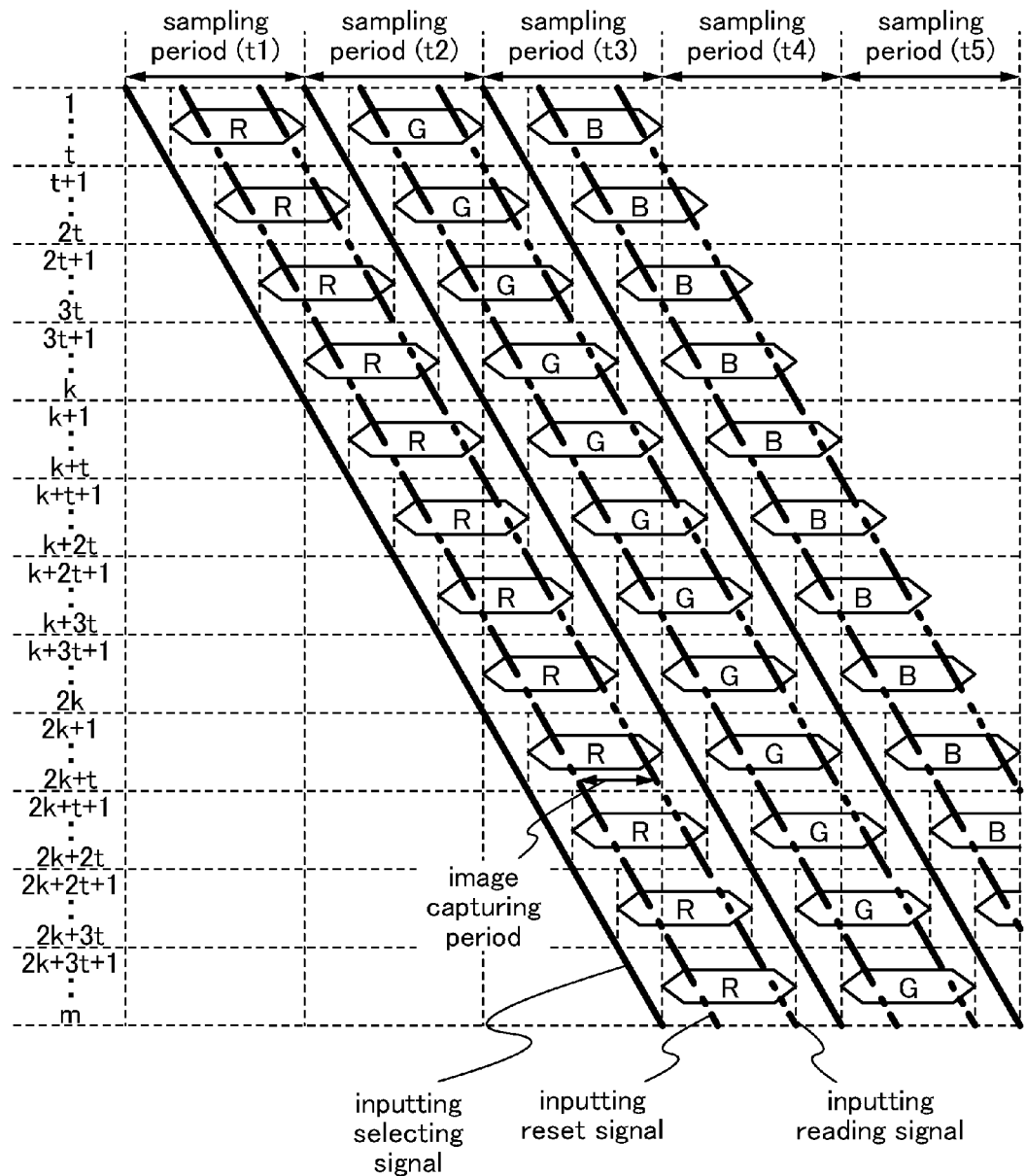
FIG. 25 illustrates an example of operation of a liquid crystal display device.
Figure 26:
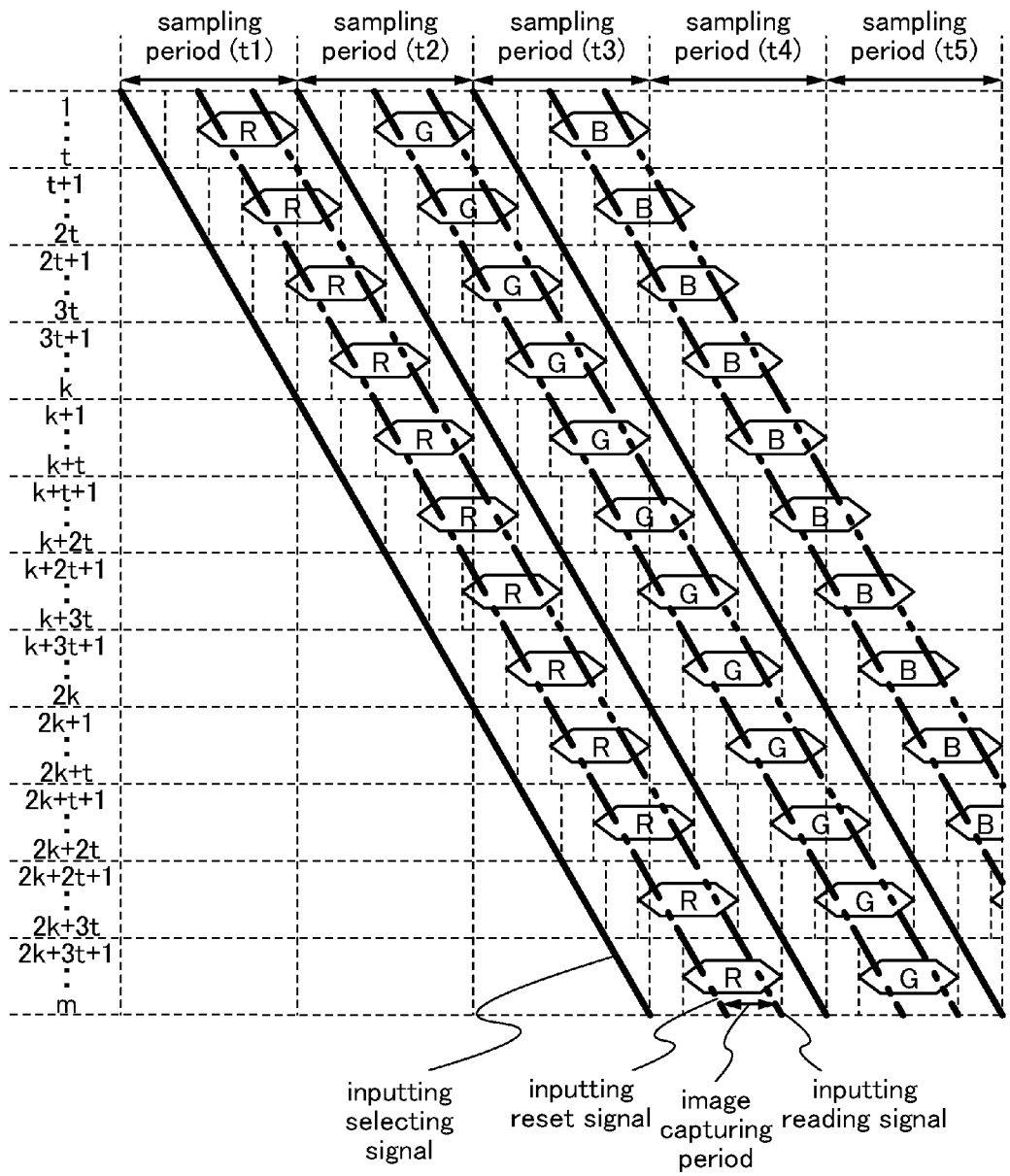
FIG. 26 illustrates an example of operation of a liquid crystal display device.
Figure 27:
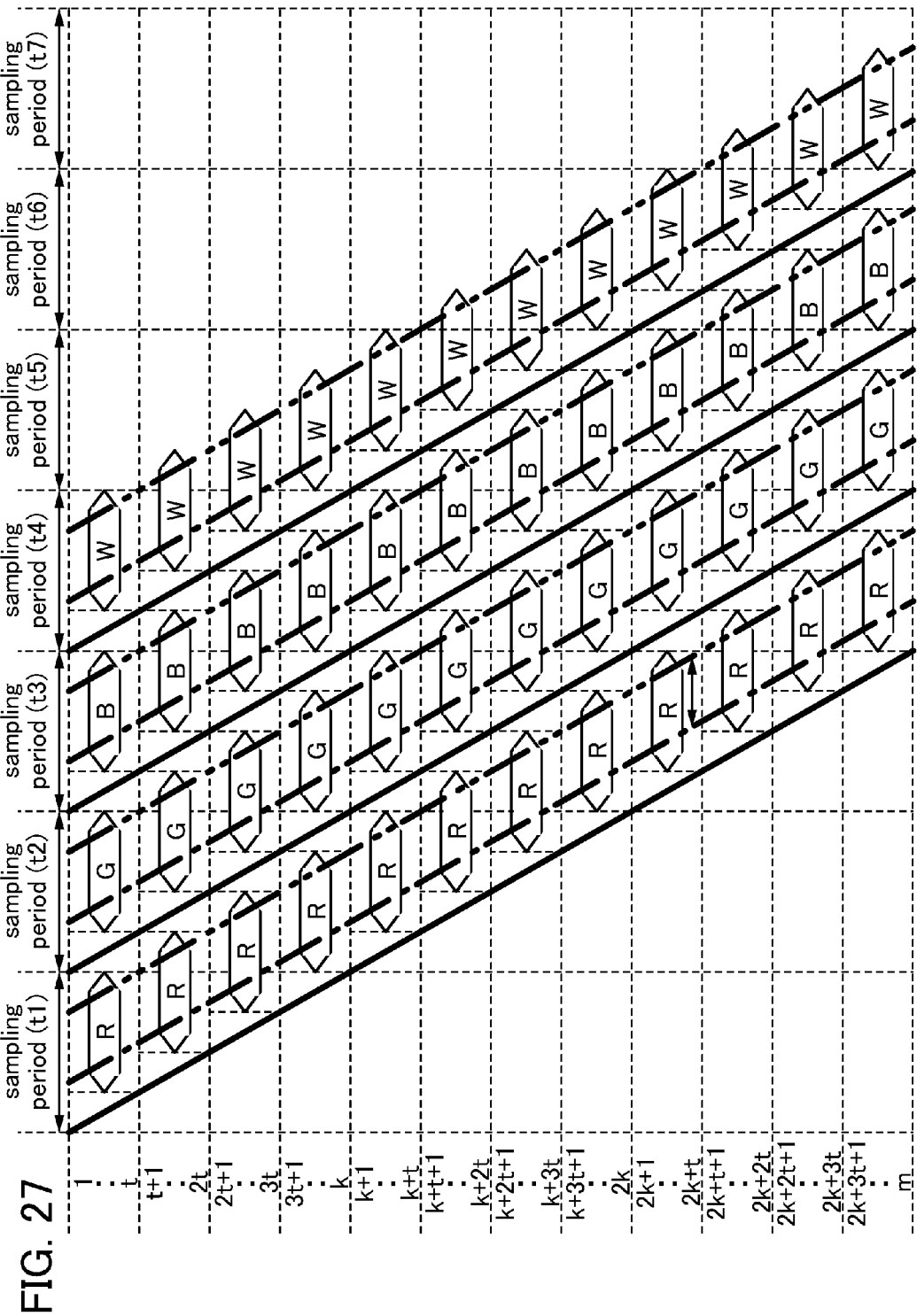
FIG. 27 illustrates an example of operation of a liquid crystal display device.
Figure 28:
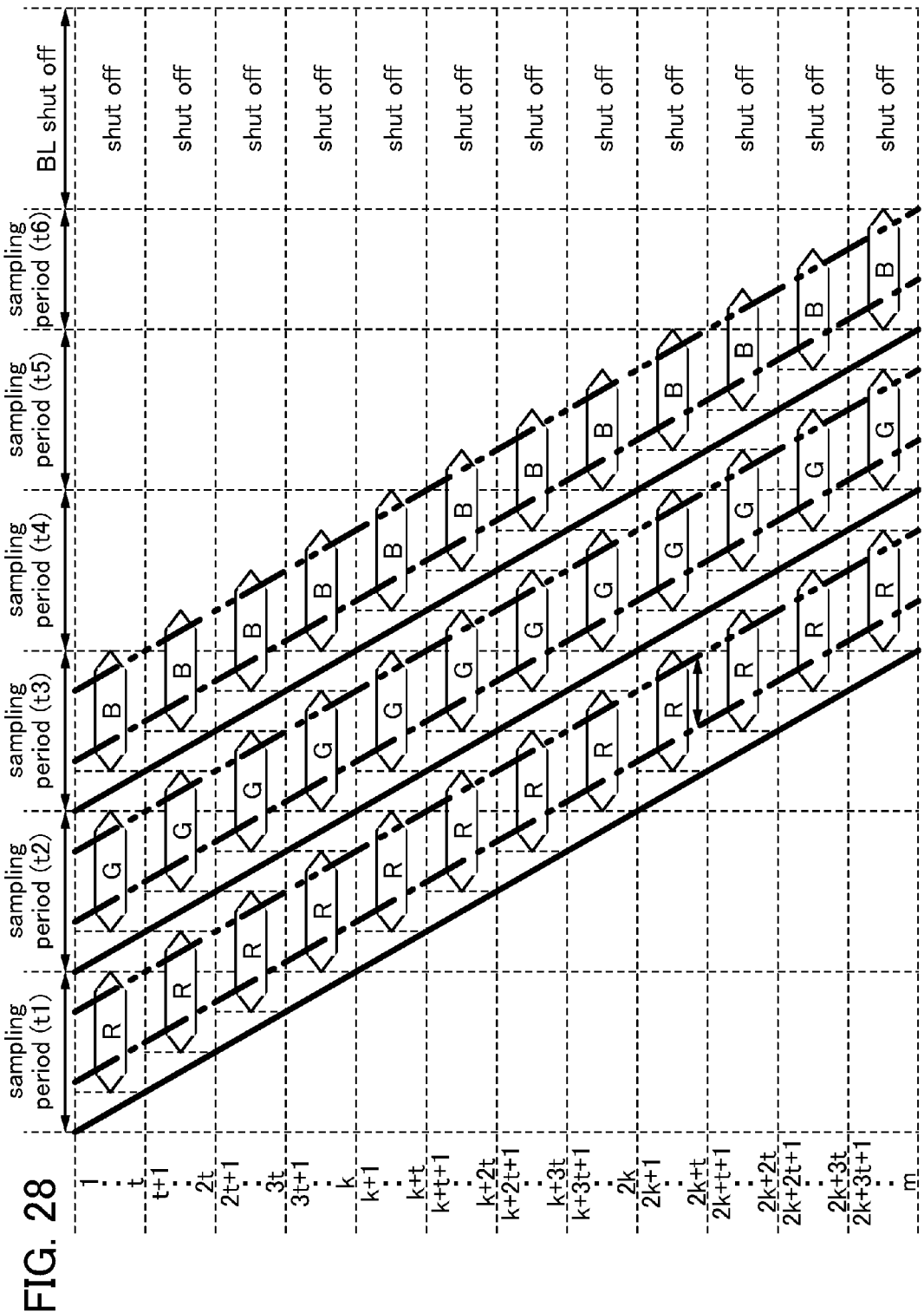
FIG. 28 illustrates an example of operation of a liquid crystal display device.

FIG. 25 illustrates an operation example of the liquid crystal display device. Note that FIG. 25 shows timing of lighting the backlight units for the first to t-th rows to the backlight units for the (2k+3t+1)-th to m-th rows which are included in the backlight 21 and timings of input of an image signal, input of a reset signal, and input of a reading signal for the first to m-th rows each of which includes n pixels in the pixel portion 10, in the sampling periods (t1) to (t5). Specifically, in FIG. 25, 1 to m indicate the number of the rows; the solid line indicates timing of input of an image signal in a corresponding row; the alternate long and short dash line indicates timing of input of a reset signal in a corresponding row; and the alternate long and two short dashes line indicates timing of input of a reading signal in a corresponding row. Further, in FIG. 25, an interval between input of a reset signal and input of a reading signal (i.e., an interval between the alternate long and short dash line and the alternate long and two short dashes line) corresponds to an imaging period.

As illustrated in FIG. 25, in the liquid crystal display device, image signals can be concurrently supplied to pixels provided in a plurality of rows. Specifically, in the sampling period (t3), it is possible to concurrently perform input of an image signal for controlling transmission of blue (B) light by sequentially selecting the first to k-th rows each of which includes n pixels 151, input of an image signal for controlling transmission of green (G) light by sequentially selecting the (k+1)-th to 2k-th rows each of which includes n pixels 152, and input of an image signal for controlling transmission of red (R) light by sequentially selecting the (2k+1)-th to m-th rows each of which includes n pixels 153. Further, in the sampling period (t3), blue (B) light can be emitted from the backlight units for the first to t-th rows after the image signal for controlling transmission of blue (B) light is input to each pixel provided in the first to t-th rows, each of which comprises n pixels 151; green (G) light can be emitted from the backlight units for the (k+1)-th to (k+t)-th rows after the image signal for controlling transmission of green (G) light is input to each pixel provided in the (k+1)-th to (k+t)-th rows, each of which comprises n pixels 152; and red (R) light can be emitted from the backlight units for the (2k+1)-th to (2k+t)-th rows after the image signal for controlling transmission of red (R) light is input to each pixel provided in the (2k+1)-th to (2k+t)-th rows, each of which comprises n pixels 153.

In addition, in the liquid crystal display device, image capture can be concurrently performed in pixels provided in a plurality of rows. Specifically, in the sampling period (t3), it is possible to concurrently perform the following operations: in a period in which blue (B) light is emitted from the backlight units for the first to t-th rows, image capture utilizing blue (B) light is performed in the respective n pixels 151 provided in the first to t-th rows; in a period in which green (G) light is emitted from the backlight units for the (k+1)-th to (k+t)-th rows, image capture utilizing green (G) light is performed in the respective n pixels 152 provided in the (k+1)-th to (k+t)-th rows; and in a period in which red (R) light is emitted from the backlight units for the (2k+1)-th to (2k+t)-th rows, image capture utilizing red (R) light is performed in the respective n pixels 153 provided in the (2k+1)-th to (2k+t)-th rows.

<Liquid Crystal Display Device Disclosed in This Embodiment>

In the liquid crystal display device disclosed in this embodiment, image signals can be concurrently supplied to pixels provided in a plurality of rows among pixels arranged in matrix. Further, in the liquid crystal display device disclosed in this embodiment, image capture can be concurrently performed in pixels provided in a plurality of rows among pixels arranged in matrix. Thus, the frequency of input of an image signal to each pixel of the liquid crystal display device can be increased and a sufficient imaging period can be secured. As a result, in the liquid crystal display device, display deterioration such as color break which is caused in a field-sequential liquid crystal display device can be suppressed and improvements in image quality and detection accuracy in image capture can be realized.

Modification Example

The above-described liquid crystal display device is one embodiment of the present invention, and the present invention includes a liquid crystal display device which is different from the above-described liquid crystal display device. For example, the structure described in Modification Example in Embodiment 1 can be applied to the liquid crystal display device in this embodiment.

In the liquid crystal display device, an image signal is written to a pixel provided in a given region in the pixel portion and then light is emitted to the given region (see FIG. 25); however, operation of the liquid crystal display device of one embodiment of the present invention is not limited to having this structure. For example, a structure (see FIG. 26) where a period (a shut-off period) in which a backlight unit for a given region is not lit is provided after writing of an image signal to the given region can be employed. In that case, a response time of the liquid crystal elements of the pixels (e.g., the pixels provided in the t-th, 2t-th, 3t-th, and k-th rows in the pixel portion) to which the image signals are input at the end of the period in which an image signal is supplied to the given region can be secured. In other words, light leakage in the pixels can be suppressed. Note that in the case of providing the shut-off period, scan of a reset signal is preferably started after the shut-off period in order to reduce adverse effects of external light.

The liquid crystal display device has a structure where the backlight sequentially emits light of three colors of red (R), green (G), and blue (B) to the pixel portion (see FIG. 25, and FIG. 26); however, the lighting order is not limited (red (R) light, green (G) light, and blue (B) light can be emitted in any appropriate order). Further, a structure (see FIG. 27) where light sources capable of emitting red (R) light, green (G) light, and blue (B) light are lit at the same time in the backlight, so that white (W) light can be produced and emitted to the pixel portion can be employed. Further, a structure (see FIG. 28) where a period (a black insertion period) in which the backlight is shut off is provided after an image is produced in the pixel portion can be employed. With the black insertion period, color break can be suppressed. Further, in the black insertion period, the polarity of the counter potential supplied to the other electrode (the counter electrode) of the liquid crystal element of the liquid crystal display device can be inverted (this operation is called common inversion driving). Note that in many general liquid crystal display devices, the polarity of a voltage which is applied to a liquid crystal element is inverted every predetermined period (i.e., the potential of an image signal input to a pixel is switched between a potential higher than a counter potential and a potential lower than the counter potential every predetermined period) in order to suppress deterioration of the liquid crystal element. By performing common inversion driving, the voltage amplitude of the image signal can be reduced. Alternatively, light of a given color, the amount of which is larger than that of light of the other colors, can be emitted to the pixel portion. Specifically, the amount of blue (B) light emitted to the pixel portion, which has a low luminosity factor, can be larger than that of green (G) light emitted to the pixel portion, which has a high luminosity factor.

Note that the structure described in Modification Example in Embodiment 1 and that described in Modification Example in this embodiment can be applied to the liquid crystal display device in this embodiment.

Embodiment 3

In this embodiment, operation of a liquid crystal display device of one embodiment of the present invention, which is different from the liquid crystal display device described in Embodiment 1 or 2 is described with reference to FIG. 29, FIG. 30, FIG. 31, FIG. 32, and FIG. 33.

<Structure Example of Liquid Crystal Display Device>

As the liquid crystal display device in this embodiment, the liquid crystal display device (see FIG. 1 and FIGS. 2A to 2C) described in Embodiment 1 can be applied. Therefore, the description in Embodiment 1 is to be referred to.

<Structure Example of Scan Line Driver Circuit>

As a scan line driver circuit included in the liquid crystal display device in this embodiment, the scan line driver circuit 11 (see FIG. 3A) included in the liquid crystal display device described in Embodiment 1 can be applied. Therefore, the description in Embodiment 1 is to be referred to for the structure of the scan line driver circuit. Further, the scan line driver circuit can be operated in the same manner as the scan line driver circuit described in Embodiment 2 (see FIG. 22A). Therefore, the description in Embodiment 2 is to be referred to for operation of the scan line driver circuit.

<Structure Example of Image Signal Line Driver Circuit>

As an image signal line driver circuit included in the liquid crystal display device in this embodiment, the image signal line driver circuit 12 (see FIG. 4A) included in the liquid crystal display device described in Embodiment 1 can be applied. Therefore, the description in Embodiment 1 is to be referred to for the structure of the image signal line driver circuit. Further, the image signal line driver circuit can be operated in the same manner as the image signal line driver circuit described in Embodiment 2 (see FIG. 22B). Therefore, the description in Embodiment 2 is to be referred to for operation of the image signal line driver circuit.

<Structure Example of Image Sensor Driver Circuit>

As an image sensor driver circuit included in the liquid crystal display device in this embodiment, the image sensor driver circuit 16 (see FIG. 5) included in the liquid crystal display device described in Embodiment 1 can be applied. Therefore, the description in Embodiment 1 is to be referred to for the structure of the image sensor driver circuit. Further, the image sensor driver circuit can be operated in the same manner as the image sensor driver circuit described in Embodiment 2 (see FIG. 23 and FIG. 24). Therefore, the description in Embodiment 2 is to be referred to for operation of the image sensor driver circuit.

<Structure Example of Detection Circuit>

As a detection circuit included in the liquid crystal display device in this embodiment, the detection circuit 17 (see FIG. 8A) included in the liquid crystal display device described in Embodiment 1 can be applied. Therefore, the description in Embodiment 1 is to be referred to for the structure of the detection circuit.

<Structure Example of Backlight>

Figure 29:
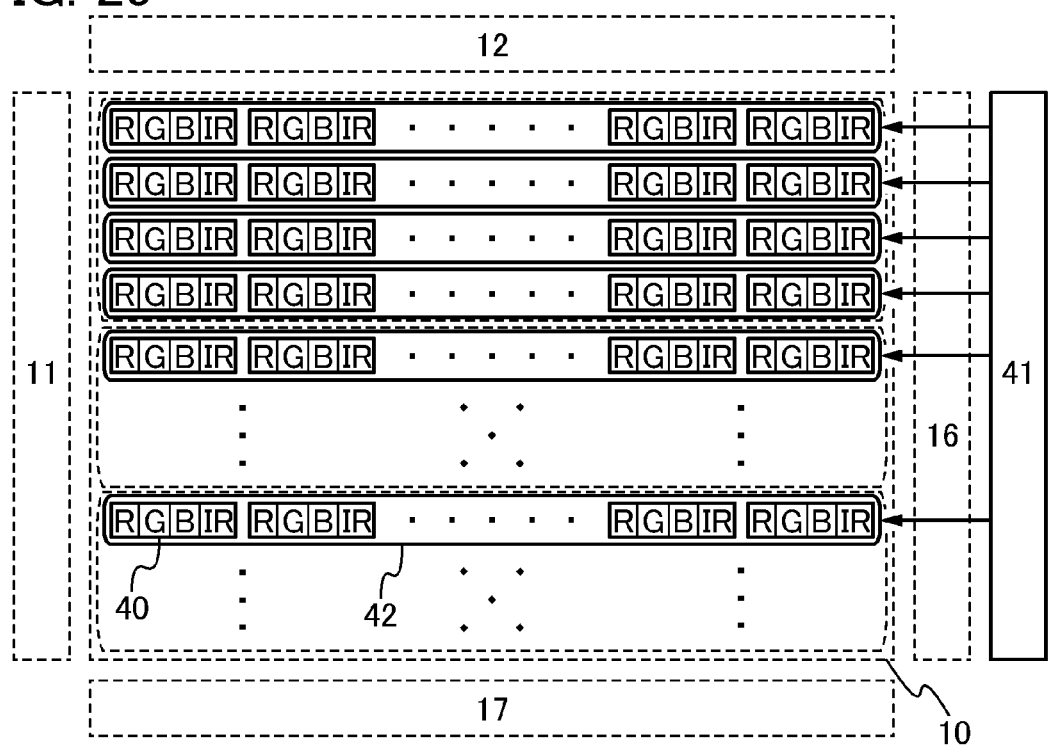
FIG. 29 illustrates a structure example of a backlight.

FIG. 29 illustrates a structure example of a backlight provided behind the pixel portion 10 in the liquid crystal display device illustrated in FIG. 1. The backlight illustrated in FIG. 29 includes a plurality of backlight units 40 which is arranged in matrix. Note that the backlight unit 40 includes a light source emitting red (R) light, a light source emitting green (G) light, a light source emitting blue (B) light, and a light source emitting light whose wavelength is in the infrared (IR) region. Note that light whose wavelength is in the infrared (IR) region passes through a pixel regardless of an orientation state in the liquid crystal element of the pixel. In other words, a polarizing plate and the like of the liquid crystal display device are selected so that infrared rays pass through the pixel even when black display is performed in the pixel.

Blinking of the light sources in the plurality of backlight units 40 is controlled by a backlight control circuit 41. Note that, here, the backlight control circuit 41 can control blinking of the light sources per backlight unit group 42 for emitting light to the pixels provided in t rows and n columns (here, t is k/4) among the plurality of pixels provided in m rows and n columns. In other words, the backlight control circuit 41 can independently control light emitted in the backlight unit group for the first to t-th rows to the backlight unit group for the (2k+3t+1)-th to m-th rows. Moreover, the backlight control circuit 41 can independently control lighting of the four light sources of the backlight unit 40 included in the backlight unit group 42. Further, light emitting diodes (LEDs) or the like can be used as the light sources.

<Example of Method for Driving Liquid Crystal Display Device>

Next, an example of a method for driving the liquid crystal display device in this embodiment is described with reference to FIG. 30, FIG. 31, FIG. 32, and FIG. 33. Specifically, operation when at least one of display and image capture is performed in the liquid crystal display device having the above-described structure is described.

Operation Example 1

Figure 30:
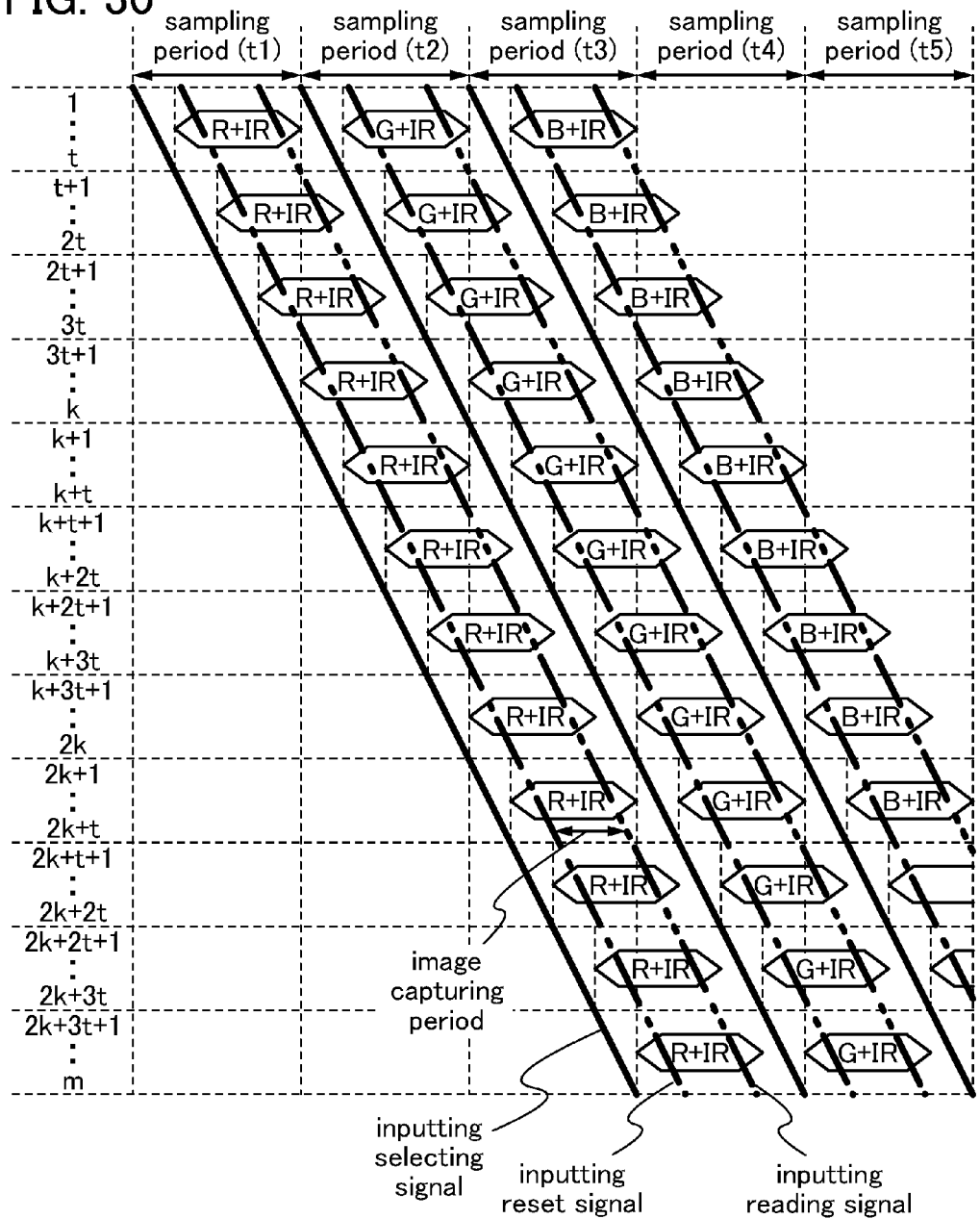
FIG. 30 illustrates an example of operation of a liquid crystal display device.

FIG. 30 illustrates an operation example in the case of concurrently performing field sequential display and image capture utilizing visible light and infrared rays. Note that FIG. 30 shows timing of lighting the backlight unit group for the first to t-th rows to the backlight unit group for the (2k+3t+1)-th to m-th rows which are included in the backlight and timings of input of an image signal, input of a reset signal, and input of a reading signal for the first to m-th rows each of which includes n pixels in the pixel portion 10, in the sampling periods (t1) to (t5). Specifically, in FIG. 30, 1 to m indicate the number of the rows; the solid line indicates timing of input of an image signal in a corresponding row; the alternate long and short dash line indicates timing of input of a reset signal in a corresponding row; and the alternate long and two short dashes line indicates timing of input of a reading signal in a corresponding row. Further, in FIG. 30, an interval between input of a reset signal and input of a reading signal (i.e., an interval between the alternate long and short dash line and the alternate long and two short dashes line) corresponds to an imaging period.

As illustrated in FIG. 30, in the liquid crystal display device, image signals can be concurrently supplied to pixels provided in a plurality of rows. Specifically, in the sampling period (t3), it is possible to concurrently perform input of an image signal for controlling transmission of blue (B) light by sequentially selecting the first to k-th rows each of which includes n pixels 151, input of an image signal for controlling transmission of green (G) light by sequentially selecting the (k+1)-th to 2k-th rows each of which includes n pixels, and input of an image signal for controlling transmission of red (R) light by sequentially selecting the (2k+1)-th to m-th rows each of which includes n pixels.

In addition, in each of the sampling periods (t1) to (t3), after an image signal for controlling transmission of light of a given color is input to a given region, a light source emitting light of the given color can be lit in a backlight unit group for the given region. For example, in the sampling period (t3), the light source emitting blue (B) light and the light source emitting light whose wavelength is in the infrared (IR) region can be lit in the backlight unit group for the first to t-th rows after the image signal for controlling transmission of blue (B) light is input to each pixel provided in the first to t-th rows, each of which comprises n pixels 151; the light source emitting green (G) light and the light source emitting light whose wavelength is in the infrared (IR) region can be lit in the backlight unit group for the (k+1)-th to (k+t)-th rows after the image signal for controlling transmission of green (G) light is input to each pixel provided in the (k+1)-th to (k+t)-th rows, each of which comprises n pixels 152; and the light source emitting red (R) light and the light source emitting light whose wavelength is in the infrared (IR) region can be lit in the backlight unit group for the (2k+1)-th to (2k+t)-th rows after the image signal for controlling transmission of red (R) light is input to each pixel provided in the (2k+1)-th to (2k+t)-th rows, each of which comprises n pixels 153.

In addition, in the liquid crystal display device, image capture can be concurrently performed in pixels provided in a plurality of rows. Specifically, in the sampling period (t3), it is possible to concurrently perform the following operations: in a period in which the light source emitting blue (B) light and the light source emitting light whose wavelength is in the infrared (IR) region are lit in the backlight units for the first to t-th rows, image capture utilizing blue (B) light and light whose wavelength is in the infrared (IR) region is performed in the first to t-th rows each of which includes n pixels 151; in a period in which the light source emitting green (G) light and the light source emitting light whose wavelength is in the infrared (IR) region are lit in the backlight units for the (k+1)-th to (k+t)-th rows, image capture utilizing green (G) light and light whose wavelength is in the infrared (IR) region is performed in the (k+1)-th to (k+t)-th rows each of which includes n pixels 152; and in a period in which the light source emitting red (R) light and the light source emitting light whose wavelength is in the infrared (IR) region are lit in the backlight units for the (2k+1)-th to (2k+t)-th rows, image capture utilizing red (R) light and light whose wavelength is in the infrared (IR) region is performed in the (2k+1)-th to (2k+t)-th rows each of which includes n pixels 153.

Note that although lighting of the light source emitting light whose wavelength is in the infrared (IR) region and lighting of the light source emitting visible light are synchronized in the structure illustrated in FIG. 30, they are not necessarily synchronized. For example, the light source emitting light whose wavelength is in the infrared (IR) region may be also lit in a period in which the light source emitting visible light is not lit, as illustrated in FIG. 31.

Figure 31:
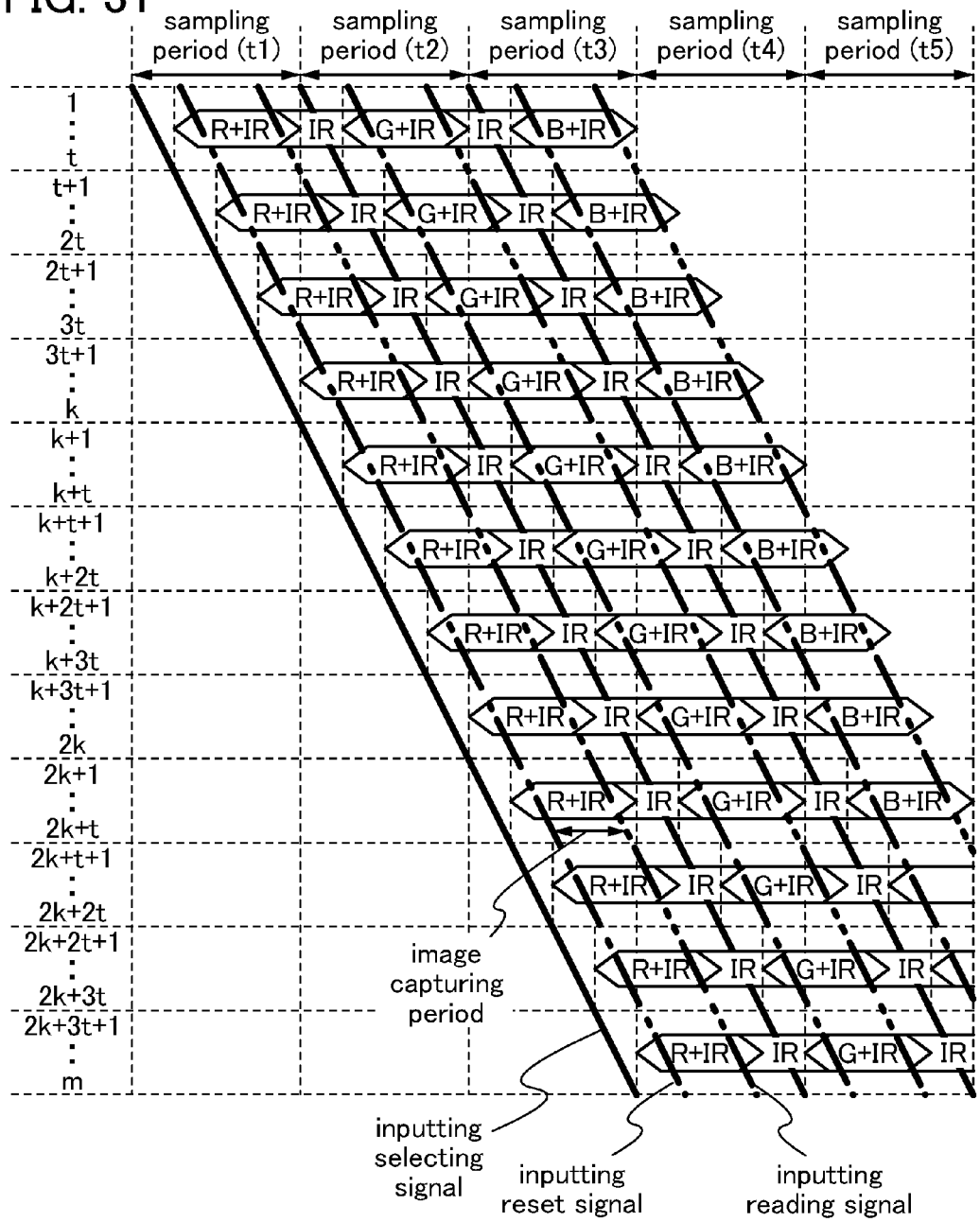
FIG. 31 illustrates an example of operation of a liquid crystal display device.

In the operation examples illustrated in FIG. 30 and FIG. 31, image signals are concurrently supplied to pixels provided in a plurality of rows among pixels arranged in matrix. Thus, the frequency of input of an image signal to each pixel of the liquid crystal display device can be increased. As a result, display deterioration such as color break in the liquid crystal display device can be suppressed and image quality can be improved.

Further, in the operation examples illustrated in FIG. 30 and FIG. 31, image capture can be concurrently performed in image-capture pixels provided in a plurality of rows among image-capture pixels arranged in matrix. Thus, a sufficient imaging period can be secured. Accordingly, detection accuracy in image capture in the liquid crystal display device can be improved.

Further, in the operation examples illustrated in FIG. 30 and FIG. 31, image capture utilizing reflected red (R) light, image capture utilizing reflected green (G) light, and image capture utilizing reflected blue (B) light are performed. In this manner, a color image can be taken.

Further, in the operation examples illustrated in FIG. 30 and FIG. 31, image capture utilizing infrared rays is performed. Thus, image capture can be performed regardless of what image is displayed in the liquid crystal display device (even in a pixel where black display is performed).

Operation Example 2

As an operation example of the liquid crystal display device in this embodiment, the operation example described in Embodiment 2 with reference to FIG. 25 can be applied. Note that although the operation example illustrated in FIG. 25 is different from that illustrated in FIG. 30 in that image capture is performed without utilizing light whose wavelength is in the infrared (IR) region, the other points of each of the operation examples can be regarded as the same.

Note that although image capture utilizing visible light is performed in the operation example illustrated in FIG. 25, such image capture is not necessarily performed. That is, the above-described liquid crystal display device which has the image-capture function can be utilized as a device specialized in performing display. For example, the above-described liquid crystal display device which has the image-capture function can be utilized as a device specialized in performing display in the case where signals that have high-level potentials are not input to the image sensor driver circuit 16 as the start pulse (ResetSP) for the reset signal line driver circuit and the start pulse (ReadSP) for the reading signal line driver circuit in the sampling periods (t1) to (t3).

Operation Example 3

Figure 32:
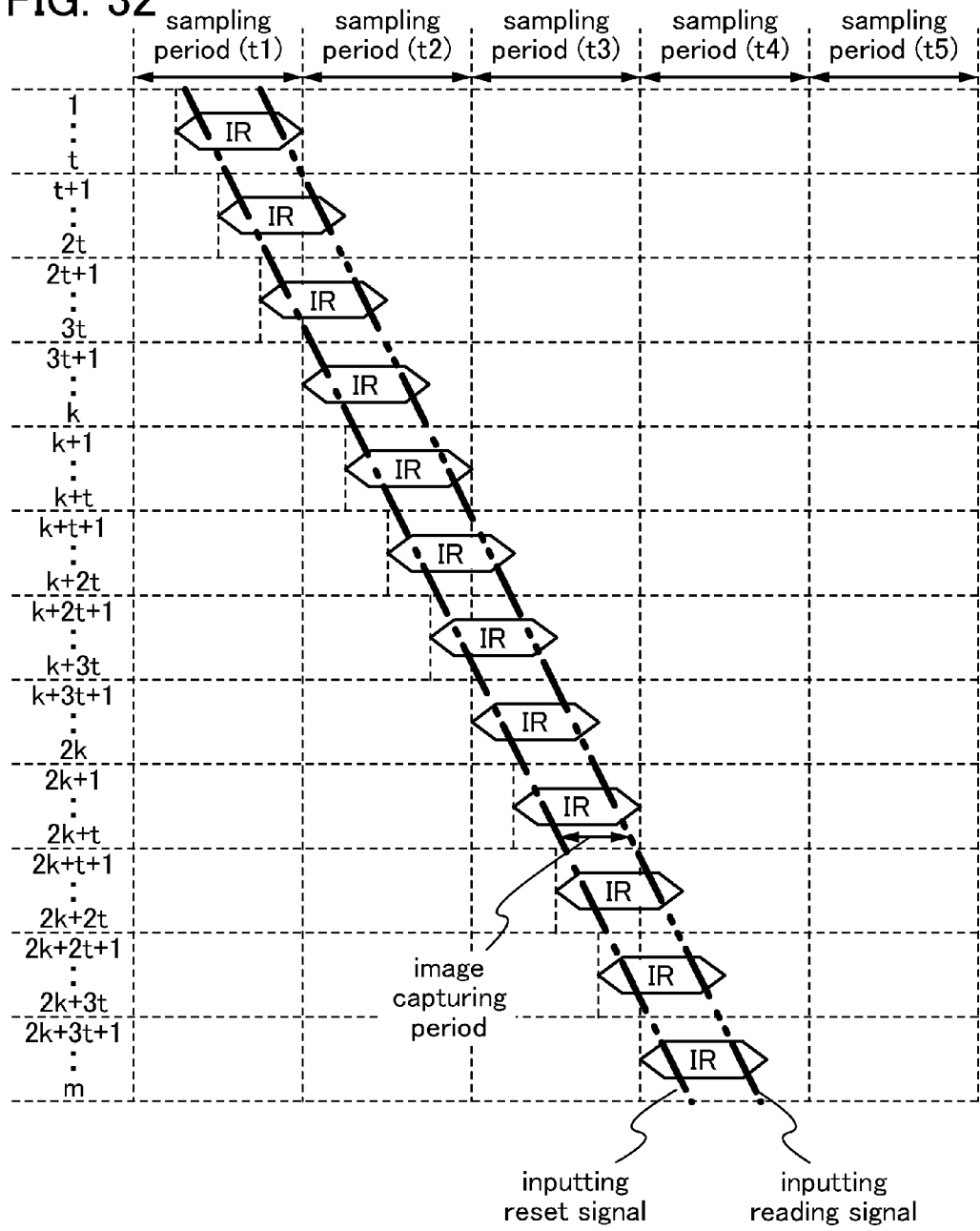
FIG. 32 illustrates an example of operation of a liquid crystal display device.

FIG. 32 illustrates an operation example in the case of performing only image capture utilizing light whose wavelength is in the infrared (IR) region. The operation illustrated in FIG. 32 can be performed, for example, in the following manner: a signal that has a high-level potential is not input to the scan line driver circuit 11 as the start pulse (GSP) for the scan line driver circuit in the sampling periods (t1) to (t3), and signals that each have a high-level potential are input to the image sensor driver circuit 16 not in the sampling periods (t2) and (t3) but only in the sampling period (t1) as the start pulse (ResetSP) for the reset signal line driver circuit and the start pulse (ReadSP) for the reading signal line driver circuit.

In the operation example illustrated in FIG. 32, image capture utilizing infrared rays is performed. Thus, image capture can be performed regardless of what image is displayed in the liquid crystal display device (even in a pixel where black display is performed).

Operation Example 4

FIG. 33 illustrates an operation example in the case of performing only image capture with no light sources lit in the backlight. Note that although the operation example illustrated in FIG. 33 is different from that illustrated in FIG. 32 in that image capture is performed without utilizing light whose wavelength is in the infrared (IR) region, the other points of each of the operation examples are the same.

An image data obtained in the operation example illustrated in FIG. 33 reflects only external light.

<Method for Driving Liquid Crystal Display Device in This Embodiment>

The liquid crystal display device in this embodiment can be operated by combining any of the operations illustrated in Operation Examples 1 to 4 and the operation illustrated in Operation Example 2 in which image capture is not performed (operation in which the liquid crystal display device functions just as a liquid crystal display device). For example, the liquid crystal display device in this embodiment can be operated in such a manner that the operation illustrated in Operation Example 2 in which image capture is not performed is repeated and the operation illustrated in Operation Example 1, 2, or 3 is performed only when image capture needs to be performed.

Further, in the liquid crystal display device in this embodiment, it is possible to generate a data of a difference between an image data obtained in the operation illustrated in Operation Example 1, 2, or 3 and an image data obtained in the operation illustrated in Operation Example 4. Here, the former data, which is obtained with the image sensor included in the liquid crystal display device, reflects not only light which is emitted by at least one light source included in the backlight and enters the image sensor by being reflected by an object to be read, but also external light which enters the image sensor. The latter data reflects only external light which enters the image sensor. Therefore, by generating a data of a difference between the former and latter data, an image data in which the influence of the external light is reduced can be obtained. As a result, detection accuracy in image capture in the liquid crystal display device can be improved. For example, detection accuracy in touch-input in the case where the liquid crystal display device is used as a touch panel can be improved.

Modification Example

The above-described liquid crystal display device is one embodiment of the present invention, and the present invention includes a liquid crystal display device which is different from the above-described liquid crystal display device. For example, the structure described in Modification Example in Embodiment 1 or 2 can be applied to the liquid crystal display device in this embodiment.

Further, although each pixel is provided with one image sensor in the liquid crystal display device (see FIGS. 2A to 2C), a structure in which each pixel is provided with a plurality of image sensors can be alternatively employed. For example, each pixel can be provided with an image sensor for visible light and an image sensor for infrared rays. In that case, an image data of visible light and an image data of infrared rays can be separately obtained and each image data can be accurately obtained.

Furthermore, in the liquid crystal display device, the light source emitting red (R) light, the light source emitting green (G) light, the light source emitting blue (B) light, and the light source emitting light whose wavelength is in the infrared (IR) region are aligned linearly and horizontally as the backlight unit (see FIG. 29); however, the structure of the backlight unit is not limited to this. For example, the light sources of the four kinds may be arranged in rectangle or aligned linearly and vertically; alternatively, the light sources may be separately provided. Moreover, the liquid crystal display device includes a direct-lit backlight as the backlight (see FIG. 29); however, an edge-lit backlight can be used as the backlight. Further, in the liquid crystal display device, it is possible that a direct-lit light source of visible light and an edge-lit light source of infrared rays are provided; alternatively, an edge-lit light source of visible light and a direct-lit light source of infrared rays can be provided.

The structures in Modification Example can be applied in combination to the liquid crystal display device in this embodiment.

This embodiment or part of this embodiment can be freely combined with the other embodiments or part of the other embodiments.

Embodiment 4

In this embodiment, operation of a liquid crystal display device which is different from any of Embodiments 1 to 3 is described with reference to FIGS. 34A and 34B, FIG. 35, FIG. 36, FIG. 37, FIG. 38, FIG. 39, FIG. 40, FIG. 41, FIG. 42, and FIG. 43.

<Structure Example of Liquid Crystal Display Device>

As the liquid crystal display device in this embodiment, the liquid crystal display device (see FIG. 1 and FIGS. 2A to 2C) described in Embodiment 1 can be applied. Therefore, the description in Embodiment 1 is to be referred to.

<Structure Example of Scan Line Driver Circuit>

As a scan line driver circuit included in the liquid crystal display device in this embodiment, the scan line driver circuit 11 (see FIG. 3A) included in the liquid crystal display device described in Embodiment 1 can be applied. Therefore, the description in Embodiment 1 is to be referred to for the structure of the scan line driver circuit. Note that operation of the scan line driver circuit 11 included in the liquid crystal display device in this embodiment is different from that of the scan line driver circuit 11 described in Embodiment 1.

An operation example of the scan line driver circuit 11 in this embodiment is described with reference to FIG. 34A. Note that in FIG. 34A, the start pulse (GSP) for the scan line driver circuit, the clock signal (GCK) for the scan line driver circuit, the signals (SR110out) output from the m output terminals of the shift register 110, the first pulse-width control signal (GPWC1) for the scan line driver circuit, the second pulse-width control signal (GPWC2) for the scan line driver circuit, and potentials of the scan lines 13_1 to 13_*m* are shown.

Figure 34A:
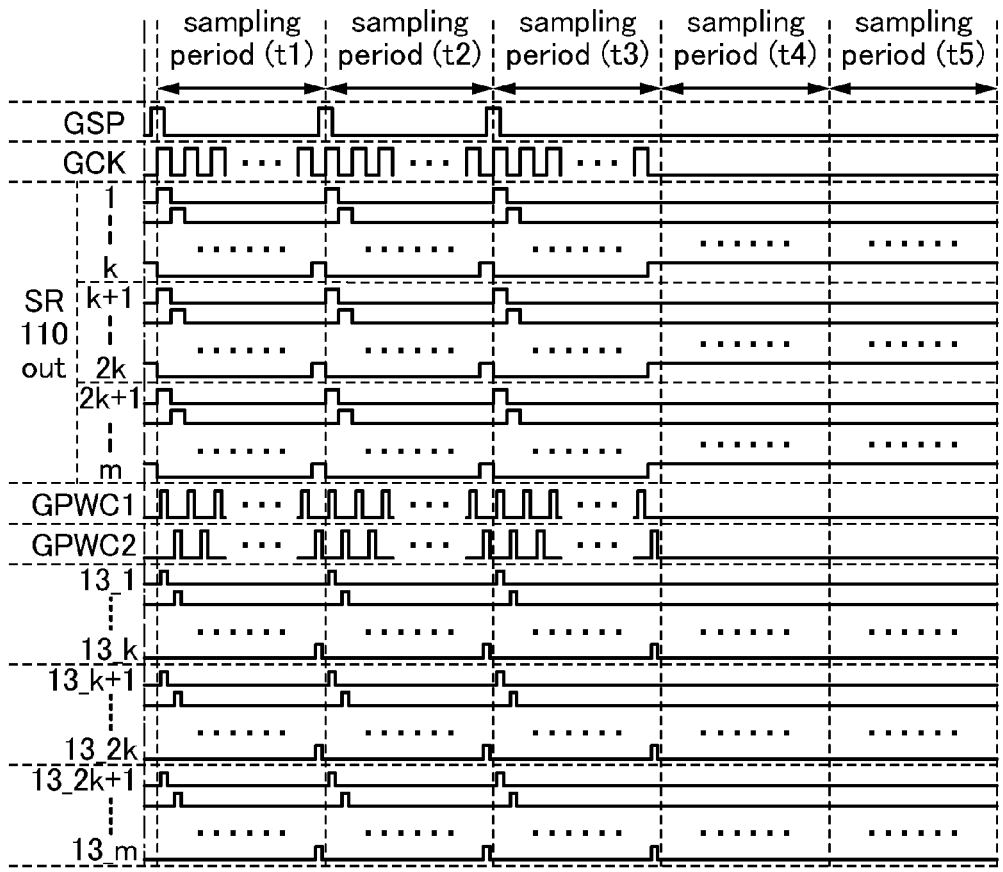
FIG. 34A illustrates an example of operation of a scan line driver circuit.

In the operation example illustrated in FIG. 34A, a signal that has a high-level potential is input to the shift register 110 as the start pulse (GSP) for the scan line driver circuit at least three times before the sampling period (t1). Specifically, in the sampling period (t1), the start pulse (GSP) for the scan line driver circuit is input so that the first to k-th output terminals of the shift register 110 sequentially output high-level potentials, the (k+1)-th to 2k-th output terminals sequentially output high-level potentials, and the (2k+1)-th to m-th output terminals sequentially output high-level potentials.

Accordingly, in the sampling period (t1), each of the AND gates 111_1 to 111_*m* outputs a logical AND of any of the signals output from the m output terminals of the shift register 110 and any of the first pulse-width control signal (GPWC1) for the scan line driver circuit and the second pulse-width control signal (GPWC2) for the scan line driver circuit. In other words, in the sampling period (t1), high-level potentials (selection signals) are sequentially supplied to the scan lines 13_1 to 13_*k* which are provided in the first to k-th rows, high-level potentials (selection signals) are sequentially supplied to the scan lines 13_*k*+1 to 13_2k which are provided in the (k+1)-th to 2k-th rows, and high-level potentials (selection signals) are sequentially supplied to the scan lines 13_2k+1 to 13_*m* which are provided in the (2k+1)-th to m-th rows. Note that the length of a period (a horizontal scanning period) in which a high-level potential is supplied to the scan line is substantially the same as that of a period in which the potential of the first pulse-width control signal (GPWC1) for the scan line driver circuit or the second pulse-width control signal (GPWC2) for the scan line driver circuit is a high-level. In this manner, in the sampling period (t1), by the scan line driver circuit 11, selection signals can be concurrently supplied to 3n pixels provided in three rows and the three rows to which the selection signals are supplied are shifted every half the cycle of the clock signal (GCK) for the scan line driver circuit.

Also in the sampling periods (t2) and (t3), the scan line driver circuit 11 performs the same operation as in the sampling period (t1). That is, also in the sampling periods (t2) and (t3), the scan line driver circuit 11 can supply selection signals to 3n pixels provided in three rows and the three rows to which the selection signals are supplied are shifted every half the cycle of the clock signal (GCK) for the scan line driver circuit. Note that a signal that has a high-level potential is input just before each of the sampling periods (t2) and (t3) as the start pulse (GSP) for the scan line driver circuit.

Then, in the sampling periods (t4) and (t5), supply of the clock signal (GCK) for the scan line driver circuit, the first pulse-width control signal (GPWC1) for the scan line driver circuit, and the second pulse-width control signal (GPWC2) for the scan line driver circuit to the scan line driver circuit 11 is stopped. Specifically, low-level potentials are supplied to the wirings for supplying these signals. Thus, the shift of the signal having a high-level potential in the shift register 110 is stopped and low-level potentials (non-selection signals) are supplied to the scan lines 13_1 to 13_*m*.

<Structure Example of Image Signal Line Driver Circuit>

As an image signal line driver circuit included in the liquid crystal display device in this embodiment, the image signal line driver circuit 12 (see FIG. 4A) included in the liquid crystal display device described in Embodiment 1 can be applied. Therefore, the description in Embodiment 1 is to be referred to for the structure of the image signal line driver circuit. Note that in the liquid crystal display device in this embodiment, timings of the image signals, which are supplied through the wirings for supplying the first image signal (DATA1), the second image signal (DATA2), and the third image signal (DATA3) so as to be input to the image signal line driver circuit 12, are different from those in the liquid crystal display device described in Embodiment 1.

Figure 34B:
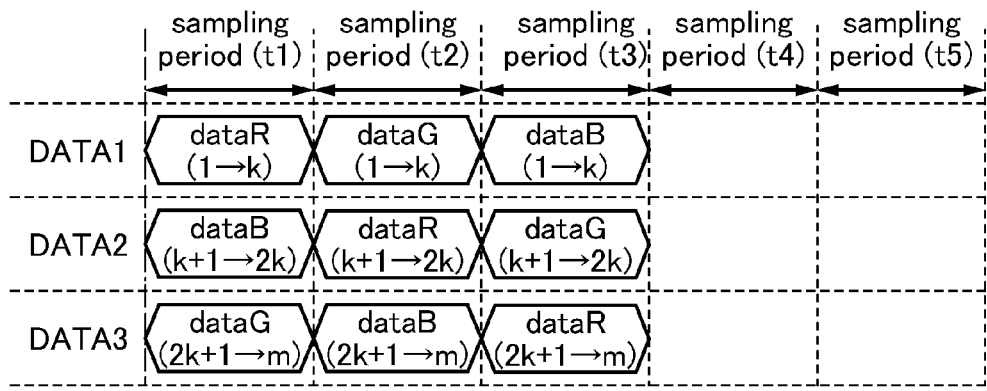
FIG. 34B illustrates an example of operation of an image signal line driver circuit.

FIG. 34B illustrates an example of timings of image signals supplied by the wirings for supplying the first image signal (DATA1), the second image signal (DATA2), and the third image signal (DATA3). As illustrated in FIG. 34B, in the sampling period (t1), the wiring for supplying the first image signal (DATA1) supplies an image signal (dataR(1→k)) for controlling transmission of red (R) light for the pixels provided in the first to k-th rows. In the sampling period (t2), the wiring for supplying the first image signal (DATA1) supplies an image signal (dataG(1→k)) for controlling transmission of green (G) light for the pixels provided in the first to k-th rows. In the sampling period (t3), the wiring for supplying the first image signal (DATA1) supplies an image signal (dataB (1→k)) for controlling transmission of blue (B) light for the pixels provided in the first to k-th rows. In the sampling period (t1), the wiring for supplying the second image signal (DATA2) supplies an image signal (dataB(k+1→2k)) for controlling transmission of blue (B) light for the pixels provided in the (k+1)-th to 2k-th rows. In the sampling period (t2), the wiring for supplying the second image signal (DATA2) supplies an image signal (dataR(k+1→2k)) for controlling transmission of red (R) light for the pixels provided in the (k+1)-th to 2k-th rows. In the sampling period (t3), the wiring for supplying the second image signal (DATA2) supplies an image signal (dataG(k+12k)) for controlling transmission of green (G) light for the pixels provided in the (k+1)-th to 2k-th rows. In the sampling period (t1), the wiring for supplying the third image signal (DATA3) supplies an image signal (dataG (2k+1→m)) for controlling transmission of green (G) light for the pixels provided in the (2k+1)-th to m-th rows. In the sampling period (t2), the wiring for supplying the third image signal (DATA3) supplies an image signal (dataB(2k+1→m)) for controlling transmission of blue (B) light for the pixels provided in the (2k+1)-th to m-th rows. In the sampling period (t3), the wiring for supplying the third image signal (DATA3) supplies an image signal (dataR(2k+1→m)) for controlling transmission of red (R) light for the pixels provided in the (2k+1)-th to m-th rows.

<Writing of Image Signal>

In the structure of the liquid crystal display device in this embodiment, supply of an image signal for controlling transmission of red (R) light (i.e., input of the red (R) image signal for the pixel portion), supply of an image signal for controlling transmission of green (G) light (i.e., input of the green (G) image signal for the pixel portion), and supply of an image signal for controlling transmission of blue (B) light (i.e., input of the blue (B) image signal for the pixel portion) can be performed in the same period (the sampling periods (t1) to (t3)).

<Structure Example of Image Sensor Driver Circuit>

As an image sensor driver circuit included in the liquid crystal display device in this embodiment, the image sensor driver circuit 16 (see FIG. 5) included in the liquid crystal display device described in Embodiment 1 can be applied. Therefore, the description in Embodiment 1 is to be referred to for the structure of the image sensor driver circuit. Note that operation of the image sensor driver circuit 16 included in the liquid crystal display device in this embodiment is different from that of the image sensor driver circuit 16 described in Embodiment 1.

An operation example of the image sensor driver circuit 16 is described with reference to FIG. 35 and FIG. 36. Note that in FIG. 35, the start pulse (ResetSP) for the reset signal line driver circuit, the clock signal (ResetCK) for the reset signal line driver circuit, the signals (SR161out) output from the m output terminals of the shift register 161, the first pulse-width control signal (IPWC1) for the image sensor driver circuit, the second pulse-width control signal (IPWC2) for the image sensor driver circuit, and potentials of the reset signal lines 18_1 to 18_m are shown. Further, in FIG. 36, the start pulse (ReadSP) for the reading signal line driver circuit, the clock signal (ReadCK) for the reading signal line driver circuit, the signals (SR162out) output from the m output terminals of the shift register 162, the third pulse-width control signal (IPWC3) for the image sensor driver circuit, the fourth pulse-width control signal (IPWC4) for the image sensor driver circuit, and potentials of the reading signal lines 19_1 to 19_m are shown.

First, an example of driving of the reset signal lines 18_1 to 18_m by the image sensor driver circuit 16 is described with reference to FIG. 35.

Figure 35:
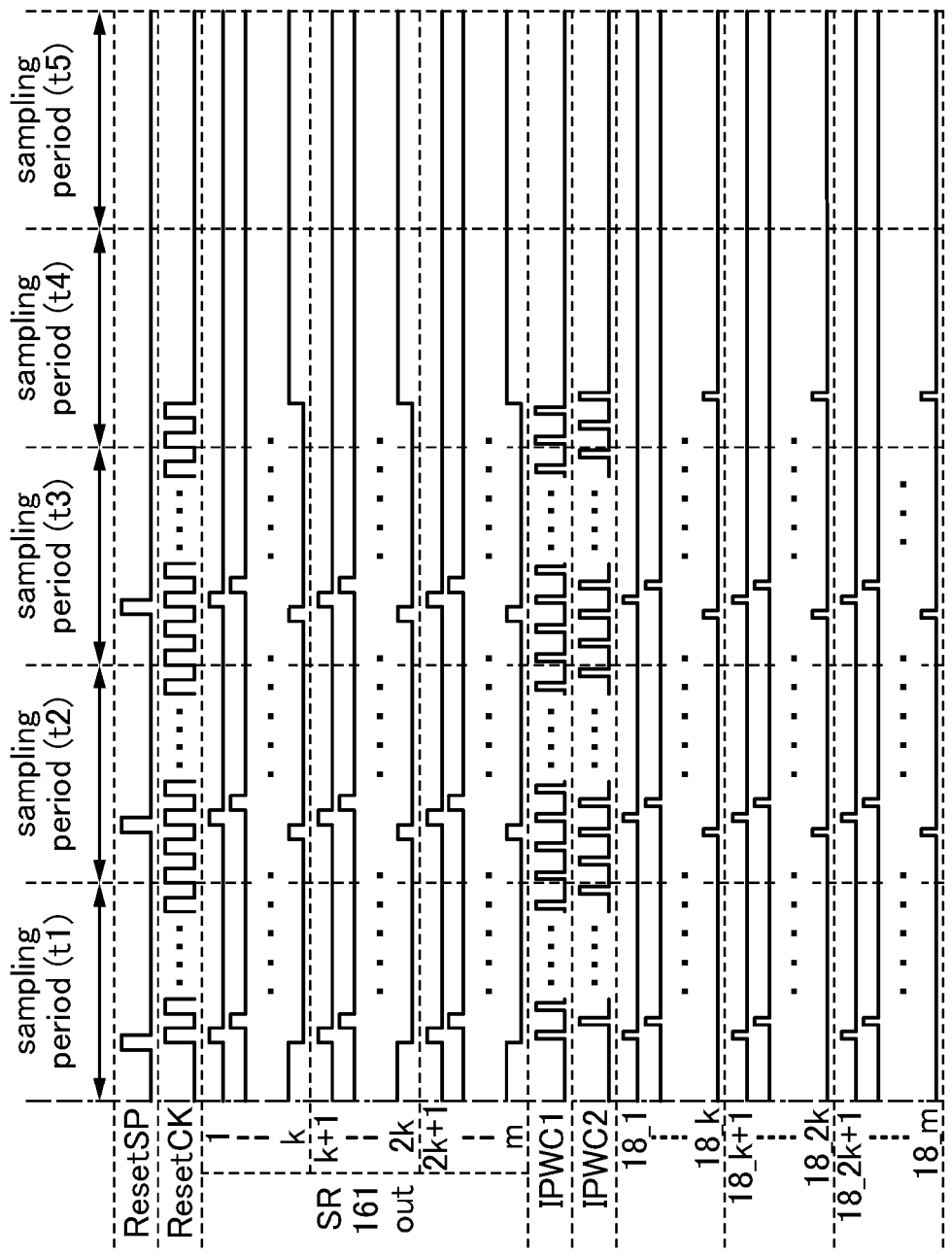
FIG. 35 illustrates an example of operation of an image sensor driver circuit.

In the operation example illustrated in FIG. 35, a signal that has a high-level potential is input to the shift register 161 as the start pulse (ResetSP) for the reset signal line driver circuit at least two times before the sampling period (t1). Further, a signal that has a high-level potential is input to the shift register 161 as the start pulse (ResetSP) for the reset signal line driver circuit also in the sampling period (t1). Specifically, in the sampling period (t1), the start pulse (ResetSP) for the reset signal line driver circuit is input so that, in the shift register 161, a shift of a signal that has a high-level potential in the first output terminal and the subsequent output terminals, a shift of a signal that has a high-level potential in the (k+1)-th output terminal and the subsequent output terminals, and a shift of a signal that has a high-level potential in the (2k+1)-th output terminal and the subsequent output terminals are concurrently performed.

As a result, in the sampling period (t1), each of the AND gates 163_1 to 163_m outputs a logical AND of any of the signals output from the m output terminals of the shift register 161 and any of the first pulse-width control signal (IPWC1) for the image sensor driver circuit and the second pulse-width control signal (IPWC2) for the image sensor driver circuit. In other words, in the sampling period (t1), the potentials of the reset signal line 18_1 provided in the first row and the subsequent reset signal lines provided in the subsequent rows are sequentially set to high-level potentials; the potentials of the reset signal line 18_k+1 provided in the (k+1)-th row and the subsequent reset signal lines provided in the subsequent rows are sequentially set to high-level potentials; and the potentials of the reset signal line 18_2k+1 provided in the (2k+1)-th row and the subsequent reset signal lines provided the subsequent rows are sequentially set to high-level potentials.

Also in the sampling periods (t2) and (t3), the shift register 161 performs the same operation as in the sampling period (t1).

Then, in the sampling period (t4), supply of the clock signal (ResetCK) for the reset signal line driver circuit, the first pulse-width control signal (IPWC1) for the image sensor driver circuit, and the second pulse-width control signal (IPWC2) for the image sensor driver circuit to the shift register 161 is stopped. Specifically, low-level potentials are supplied to the wirings for supplying these signals. Note that supply of those signals is stopped at a stage where supply of high-level potentials to the reset signal lines 18_k, 18_2k, and 18_m is finished. Thus, the shift of the signal having a high-level potential in the shift register 161 is stopped and low-level potentials are supplied to the reset signal lines 18_1 to 18_m.

Next, an example of driving of the reading signal lines 19_1 to 19_m by the image sensor driver circuit 16 is described with reference to FIG. 36.

Figure 36:
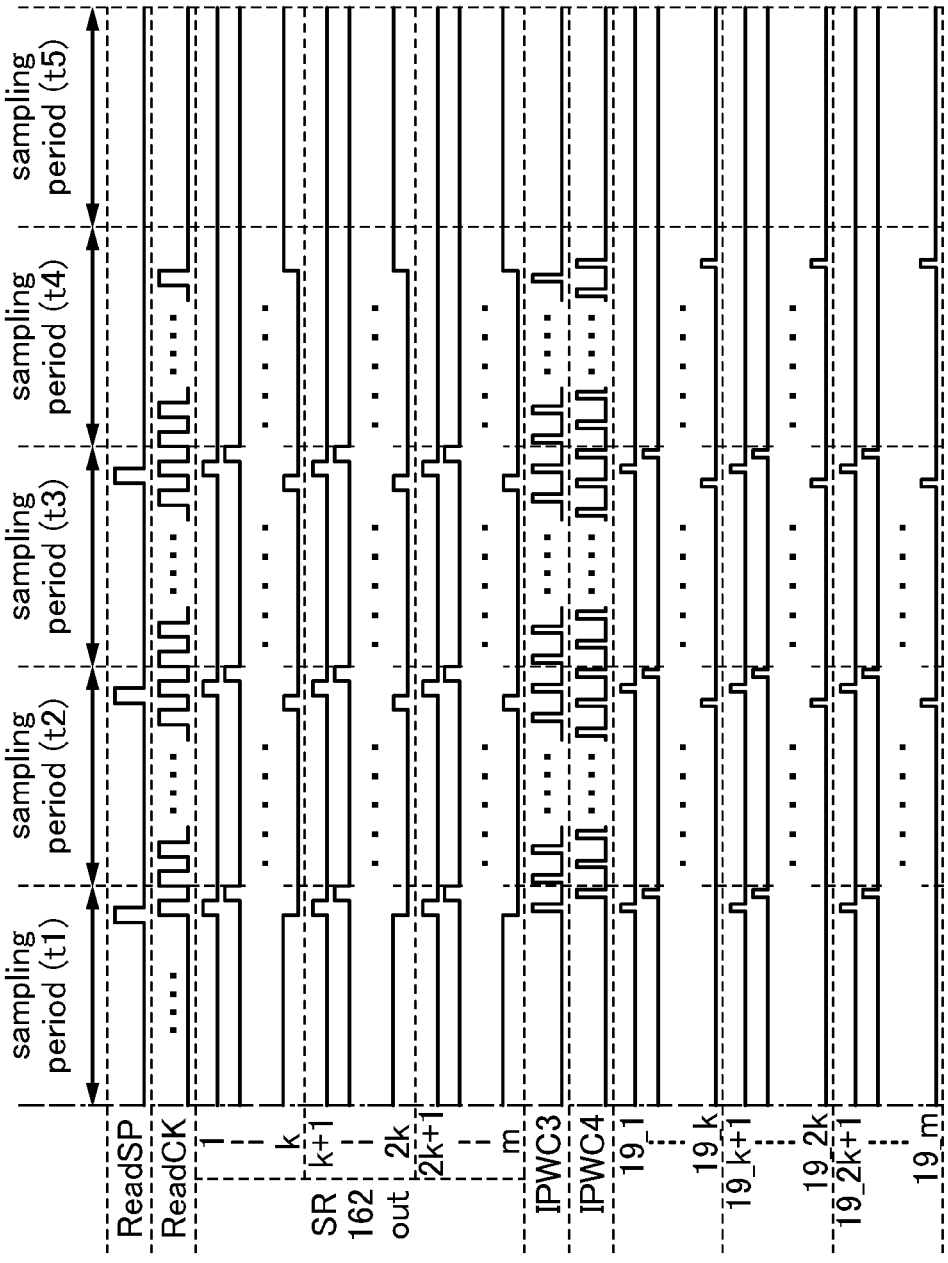
FIG. 36 illustrates an example of operation of an image sensor driver circuit.

In the operation example illustrated in FIG. 36, a signal that has a high-level potential is input to the shift register 162 as the start pulse (ReadSP) for the reading signal line driver circuit at least two times before the sampling period (t1). Further, a signal that has a high-level potential is input to the shift register 162 as the start pulse (ReadSP) for the reading signal line driver circuit also in the sampling period (t1). Specifically, in the sampling period (t1), the start pulse (ReadSP) for the reading signal line driver circuit is input so that, in the shift register 162, a shift of a signal that has a high-level potential in the first output terminal and the subsequent output terminals, a shift of a signal that has a high-level potential in the (k+1)-th output terminal and the subsequent output terminals, and a shift of a signal that has a high-level potential in the (2k+1)-th output terminal and the subsequent output terminals are concurrently performed. Note that in the sampling period (t1), the signal that has a high-level potential is input to the shift register 162 as the start pulse (ReadSP) for the reading signal line driver circuit after the signal that has a high-level potential is input to the shift register 161 as the start pulse (ResetSP) for the reset signal line driver circuit.

As a result, in the sampling period (t1), each of the AND gates 164_1 to 164_m outputs a logical AND of any of the signals output from the m output terminals of the shift register 162 and any of the third pulse-width control signal (IPWC3) for the image sensor driver circuit and the fourth pulse-width control signal (IPWC4) for the image sensor driver circuit. In other words, in the sampling period (t1), the potentials of the reading signal line 19_1 provided in the first row and the subsequent reading signal lines provided in the subsequent rows are sequentially set to a high-level potential; the potentials of the reading signal line 19_k+1 provided in the (k+1)-th row and the subsequent reading signal lines provided in the subsequent rows are sequentially set to high-level potentials; and the potentials of the reading signal line 19_2k+1 provided in the (2k+1)-th row and the subsequent reading signal lines provided in the subsequent rows are sequentially set to high-level potentials.

The shift register 162 performs the same operation as in the sampling period (t1) also in the sampling periods (t2) and (t3).

Then, in the sampling period (t4), supply of the clock signal (ReadCK) for the reading signal line driver circuit, the third pulse-width control signal (IPWC3) for the image sensor driver circuit, and the fourth pulse-width control signal (IPWC4) for the image sensor driver circuit to the shift register 162 is stopped. Specifically, low-level potentials are supplied to the wirings for supplying these signals. Note that supply of those signals is stopped at a stage where supply of high-level potentials to the reading signal lines 19_k, 19_2k, and 19_m is finished. Thus, the shift of the signal having a high-level potential in the shift register 162 is stopped and low-level potentials are supplied to the reading signal lines 19_1 to 19_m.

<Example of Method for Driving Liquid Crystal Display Device>

Next, an example of a method for driving the liquid crystal display device in this embodiment is described with reference to FIG. 37, FIG. 38, FIG. 39, FIG. 40, and FIG. 41. Specifically, operation when at least one of display and image capture is performed in the liquid crystal display device in this embodiment is described.

Operation Example 1

Figure 37:
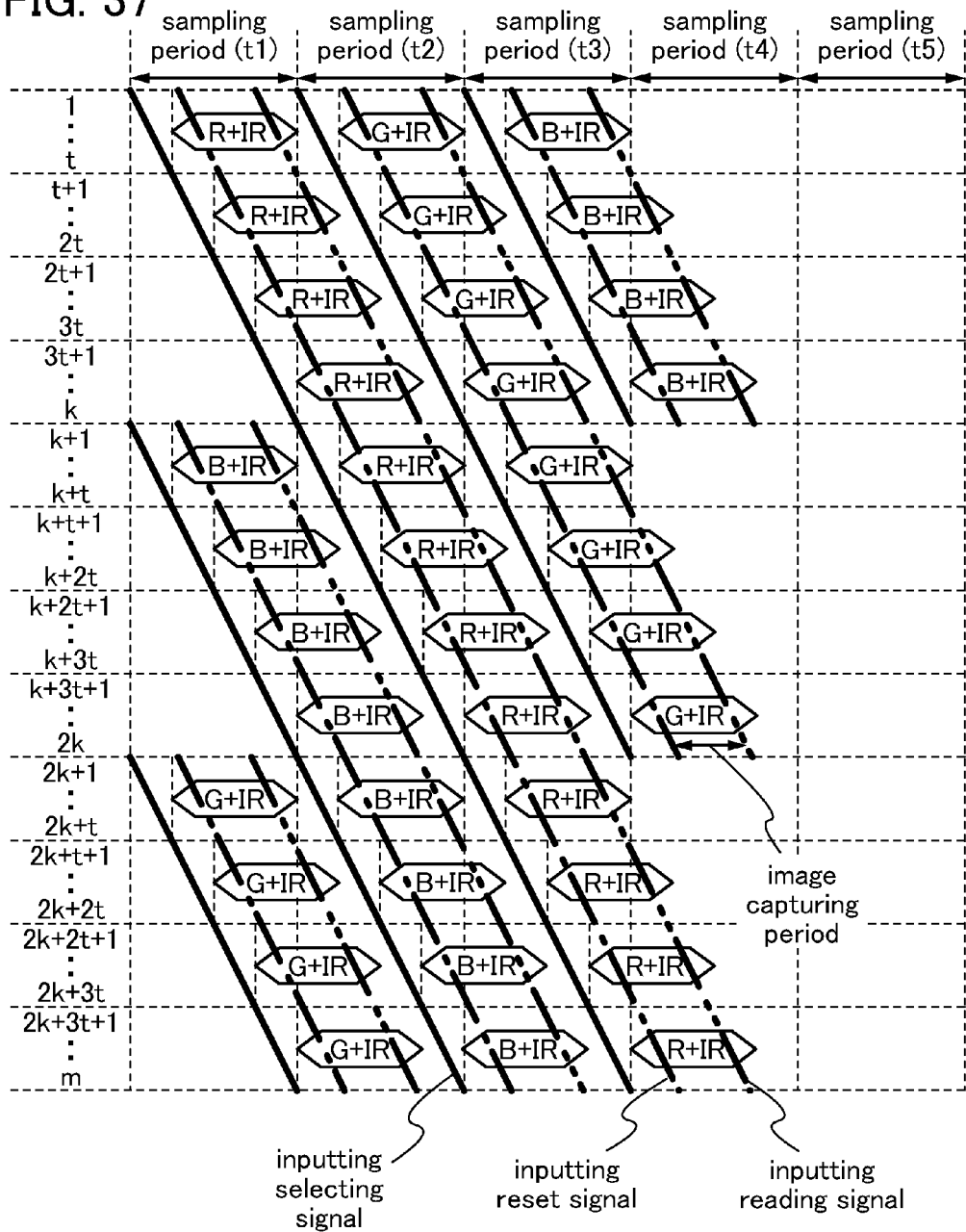
FIG. 37 illustrates an example of operation of a liquid crystal display device.

FIG. 37 illustrates an operation example in the case of concurrently performing field sequential display and image capture utilizing visible light and infrared rays. Note that FIG. 37 shows timing of lighting the backlight unit group for the first to t-th rows to the respective backlight unit group for the (2k+3t+1)-th to m-th rows which are included in the backlight and timings of input of an image signal, input of a reset signal, and input of a reading signal for the first to m-th rows each of which includes n pixels in the pixel portion 10, in the sampling periods (t1) to (t5). Specifically, in FIG. 37, 1 to m indicate the number of the rows; the solid line indicates timing of input of an image signal in a corresponding row; the alternate long and short dash line indicates timing of input of a reset signal in a corresponding row; and the alternate long and two short dashes line indicates timing of input of a reading signal in a corresponding row. Further, in FIG. 37, an interval between input of a reset signal and input of a reading signal (i.e., an interval between the alternate long and short dash line and the alternate long and two short dashes line) corresponds to an imaging period.

As illustrated in FIG. 37, in the liquid crystal display device, image signals can be concurrently supplied to pixels provided in a plurality of rows in each of the sampling periods (t1) to (t3). For example, in the sampling period (t3), it is possible to concurrently perform input of an image signal for controlling transmission of blue (B) light by sequentially selecting the respective n pixels 151 provided in the first to k-th rows, input of an image signal for controlling transmission of green (G) light by sequentially selecting the respective n pixels 152 provided in the (k+1)-th to 2k-th rows, and input of an image signal for controlling transmission of red (R) light by sequentially selecting the respective n pixels 153 provided in the (2k+1)-th to m-th rows.

In addition, in each of the sampling periods (t1) to (t3), after an image signal for controlling transmission of light of a given color is input to a given region, a light source emitting light of the given color can be lit in a backlight unit group for the given region. For example, in the sampling period (t3), the light source emitting blue (B) light and the light source emitting light whose wavelength is in the infrared (IR) region can be lit in the backlight unit group for the first to t-th rows after the image signal for controlling transmission of blue (B) light is input to the respective n pixels 151 provided in the first to t-th rows; the light source emitting green (G) light and the light source emitting light whose wavelength is in the infrared (IR) region can be lit in the backlight unit group for the (k+1)-th to (k+t)-th rows after the image signal for controlling transmission of green (G) light is input to the respective n pixels 152 provided in the (k+1)-th to (k+t)-th rows; and the light source emitting red (R) light and the light source emitting light whose wavelength is in the infrared (IR) region can be lit in the backlight unit group for the (2k+1)-th to (2k+t)-th rows after the image signal for controlling transmission of red (R) light is input to the respective n pixels 153 provided in the (2k+1)-th to (2k+t)-th rows.

In addition, in the liquid crystal display device, image capture can be concurrently performed in pixels provided in a plurality of rows in each of the sampling periods (t1) to (t3). For example, in the sampling period (t3), it is possible to concurrently perform the following operations: in a period in which the light source emitting blue (B) light and the light source emitting light whose wavelength is in the infrared (IR) region are lit in the backlight units for the first to t-th rows, image capture utilizing blue (B) light and light whose wavelength is in the infrared (IR) region is performed in the respective n pixels 151 provided in the first to t-th rows; in a period in which the light source emitting green (G) light and the light source emitting light whose wavelength is in the infrared (IR) region are lit in the backlight units for the (k+1)-th to (k+t)-th rows, image capture utilizing green (G) light and light whose wavelength is in the infrared (IR) region is performed in the respective n pixels 152 provided in the (k+1)-th to (k+t)-th rows; and in a period in which the light source emitting red (R) light and the light source emitting light whose wavelength is in the infrared (IR) region are lit in the backlight units for the (2k+1)-th to (2k+t)-th rows, image capture utilizing red (R) light and light whose wavelength is in the infrared (IR)

region is performed in the respective n pixels 153 provided in the (2k+1)-th to (2k+t)-th rows.

Note that although lighting of the light source emitting light whose wavelength is in the infrared (IR) region and lighting of the light source emitting visible light are synchronized in FIG. 37, they are not necessarily synchronized. For example, the light source emitting light whose wavelength is in the infrared (IR) region may be also lit in a period in which the light source emitting visible light is not lit as illustrated in FIG. 38.

Figure 38:
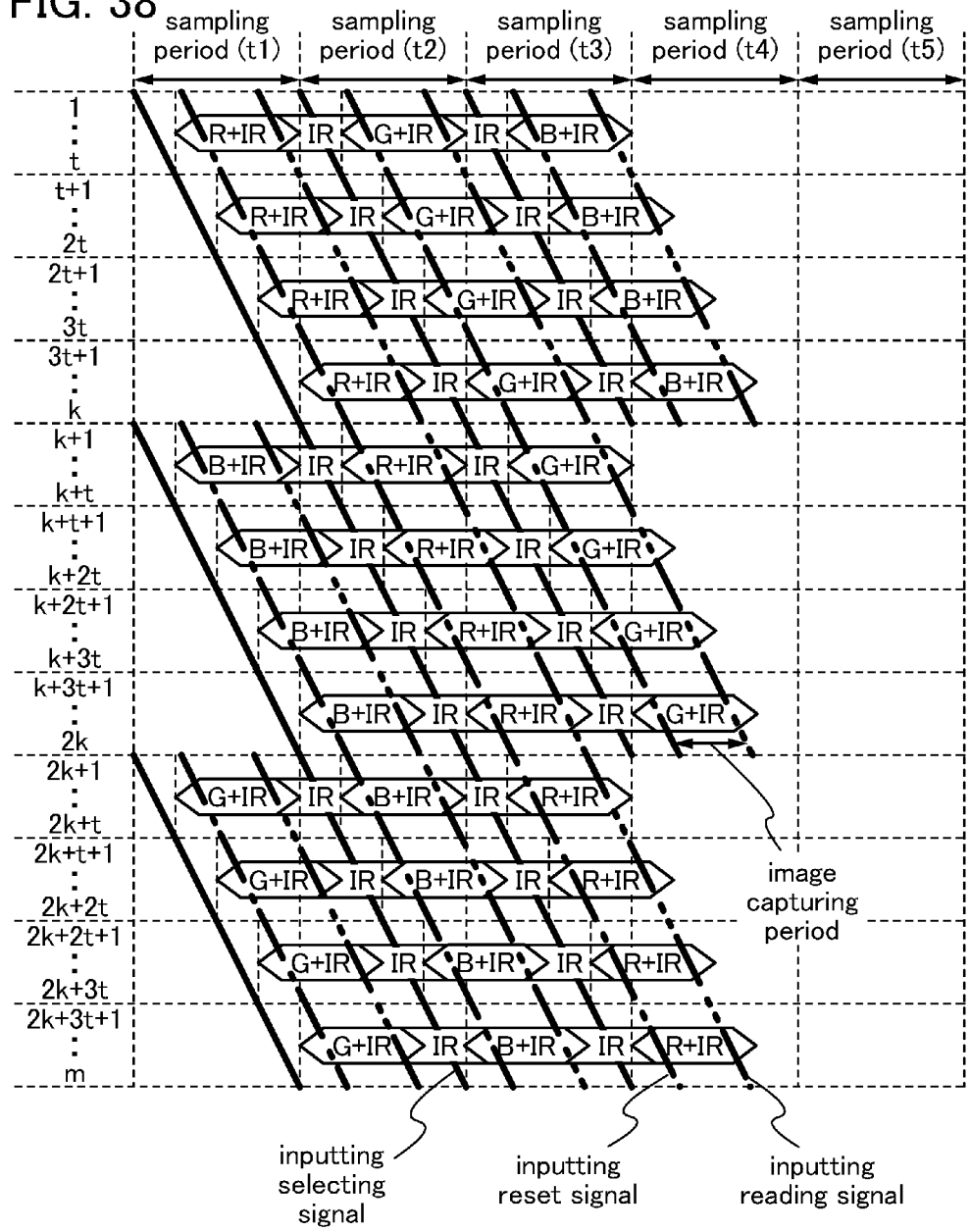
FIG. 38 illustrates an example of operation of a liquid crystal display device.

In the operation examples illustrated in FIG. 37 and FIG. 38, image signals are concurrently supplied to pixels provided in a plurality of rows among pixels arranged in matrix. Thus, the frequency of input of an image signal to each pixel of the liquid crystal display device can be increased. As a result, display deterioration such as color break in the liquid crystal display device can be suppressed and image quality can be improved.

Further, in the operation examples illustrated in FIG. 37 and FIG. 38, image capture can be concurrently performed in image-capture pixels provided in a plurality of rows among image-capture pixels arranged in matrix. Thus, a sufficient imaging period can be secured. Accordingly, detection accuracy in image capture in the liquid crystal display device can be improved.

Further, in the operation examples illustrated in FIG. 37 and FIG. 38, image capture utilizing reflected red (R) light, image capture utilizing reflected green (G) light, and image capture utilizing reflected blue (B) light are performed. In this manner, a color image can be taken.

Further, in the operation examples illustrated in FIG. 37 and FIG. 38, image capture utilizing infrared rays is performed. Thus, image capture can be performed regardless of what image is displayed in the liquid crystal display device (even in a pixel where black display is performed).

Further, in the operation examples illustrated in FIG. 37 and FIG. 38, time required for performing image capture in all the rows can be shorter than that in the operation examples described in Embodiments 1 to 3. Therefore, an image of an object to be read can be accurately taken without image distortion in the case where the object to be read moves at a high speed, for example.

Operation Example 2

Figure 39:
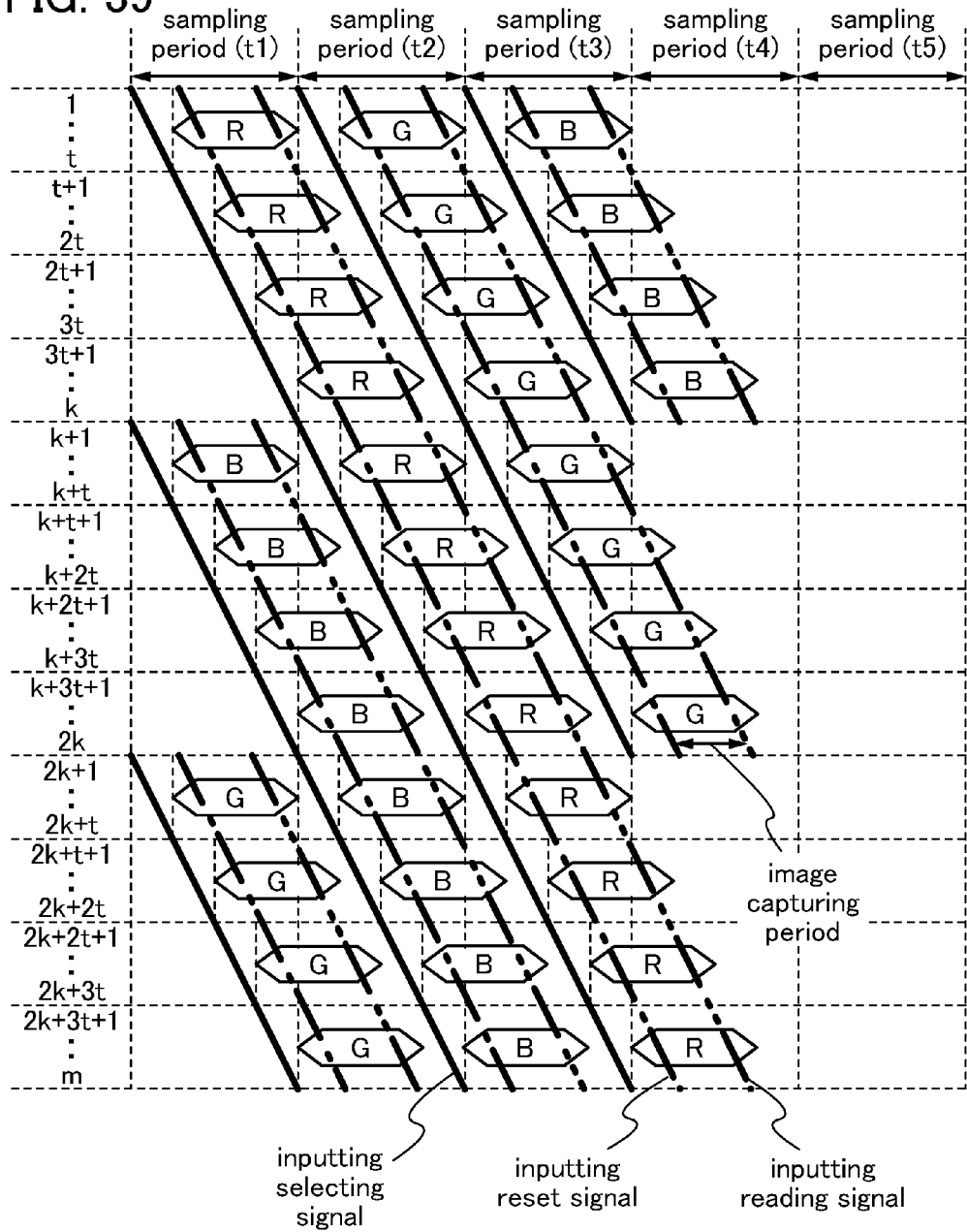
FIG. 39 illustrates an example of operation of a liquid crystal display device.

FIG. 39 illustrates an operation example in the case of concurrently performing field sequential display and image capture utilizing visible light. Note that although the operation example illustrated in FIG. 39 is different from that illustrated in FIG. 37 in that image capture is performed without utilizing light whose wavelength is in the infrared (IR) region, the other points of each of the operation examples are the same. Therefore, the above description is to be referred to for explanation of things in common between the operation examples in FIG. 39 and FIG. 37.

Note that although image capture utilizing visible light is performed in the operation example illustrated in FIG. 39, such image capture is not necessarily performed. That is, the above-described liquid crystal display device which has the image-capture function can be utilized as a device specialized in performing display. For example, the above-described liquid crystal display device which has the image-capture function can be utilized as a device specialized in performing display in the case where signals that have high-level potentials are not input to the image sensor driver circuit 16 as the start pulse (ResetSP) for the reset signal line driver circuit and the start pulse (ReadSP) for the reading signal line driver circuit before the sampling period (t1) and in the sampling periods (t1) to (t3).

Operation Example 3

Figure 40:
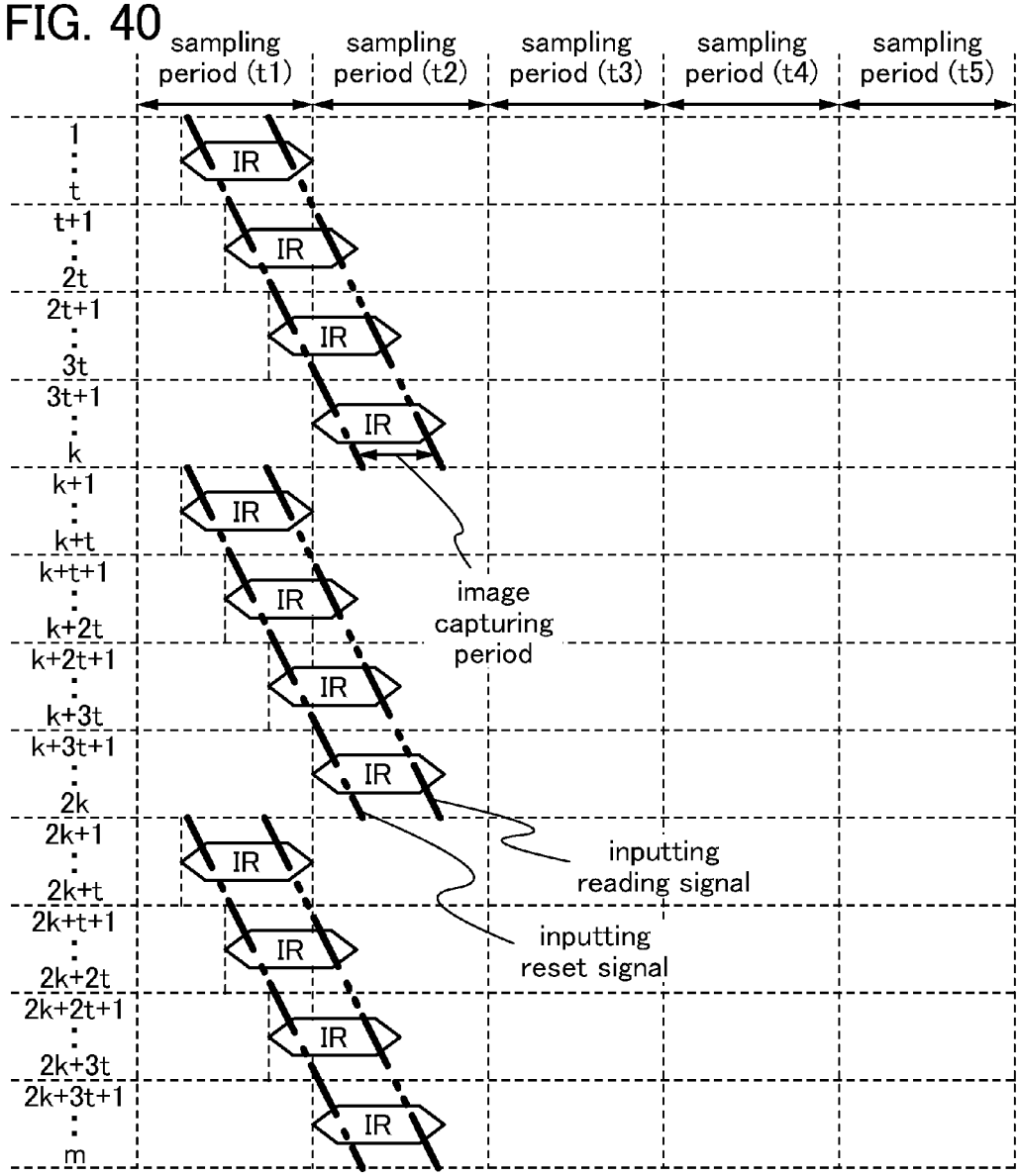
FIG. 40 illustrates an example of operation of a liquid crystal display device.

FIG. 40 illustrates an operation example in the case of performing only image capture utilizing light whose wavelength is in the infrared (IR) region. The operation illustrated in FIG. 40 can be performed, for example, in the following manner. A signal that has a high-level potential is not input to the scan line driver circuit 11 as the start pulse (GSP) for the scan line driver circuit before the sampling period (t1) and in the sampling periods (t1) to (t3), and the scan line driver circuit 16 is controlled so that only the following operations which start in the sampling period (t1) are performed: a shift of a signal that has a high-level potential starting from the reset signal line 18_1 provided in the first row; a shift of a signal that has a high-level potential starting from the reset signal line 18_$k$+1 provided in the (k+1)-th row; a shift of a signal that has a high-level potential starting from the reset signal line 18_2k+1 provided in the (2k+1)-th row; a shift of a signal that has a high-level potential starting from the reading signal line 19_1 provided in the first row; a shift of a signal that has a high-level potential starting from the reading signal line 19_$k$+1 provided in the (k+1)-th row; and a shift of a signal that has a high-level potential starting from the reading signal line 19_2k+1 provided in the (2k+1)-th row.

In the operation example illustrated in FIG. 40, image capture utilizing infrared rays is performed. Thus, image capture can be performed regardless of what image is displayed in the liquid crystal display device (even in a pixel where black display is performed).

Further, in the operation example illustrated in FIG. 40, time required for performing image capture in all the rows can be shorter than that in the operation example illustrated in FIG. 32. Therefore, an image of an object to be read can be accurately taken without image distortion in the case where the object to be read moves at a high speed, for example.

Operation Example 4

Figure 41:
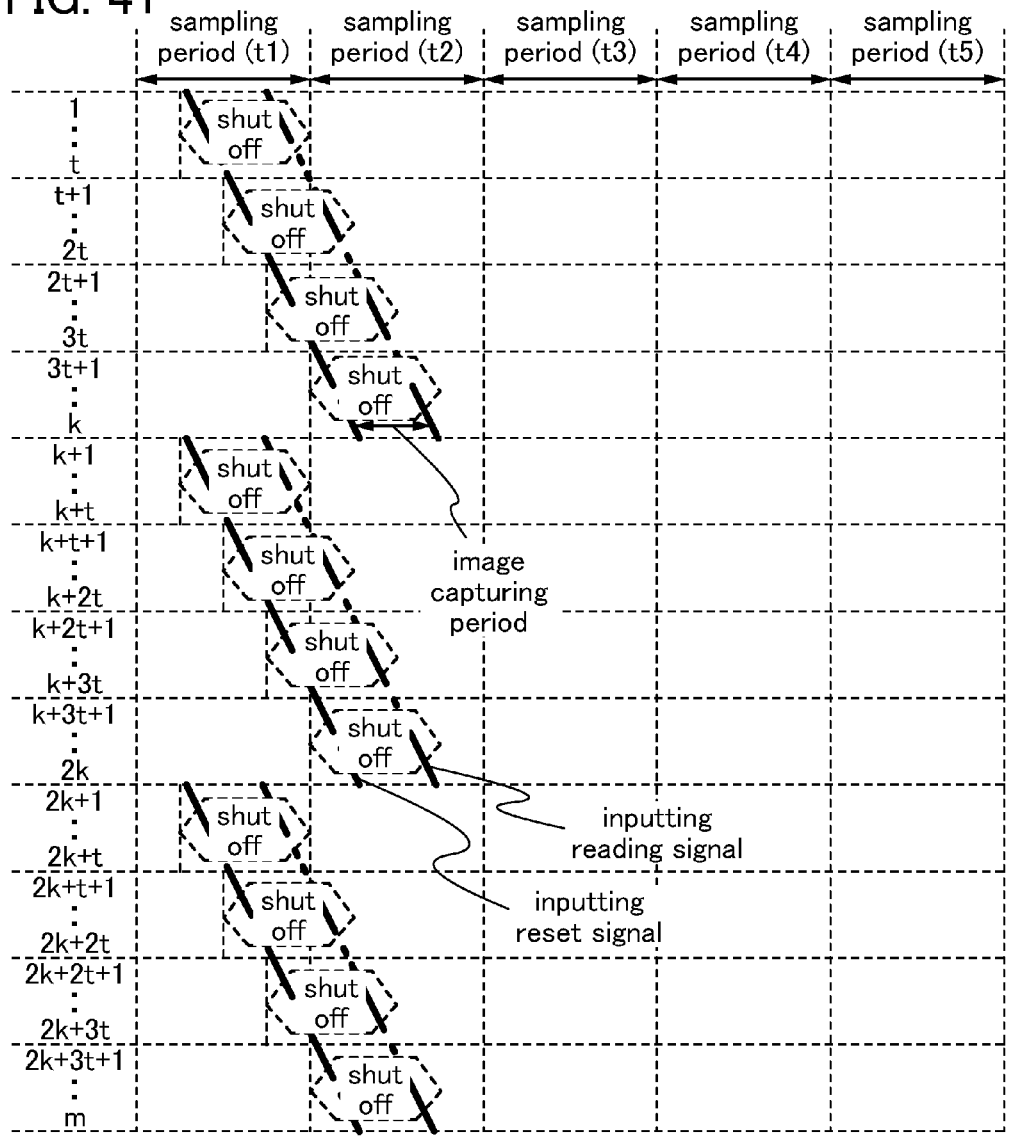
FIG. 41 illustrates an example of operation of a liquid crystal display device.

FIG. 41 illustrates an operation example in the case of performing only image capture with no light sources lit in the backlight. Note that although the operation example illustrated in FIG. 41 is different from that illustrated in FIG. 40 in that image capture is performed without utilizing light whose wavelength is in the infrared (IR) region, the other points of each of the operation examples are the same.

An image data obtained in the operation example illustrated in FIG. 41 reflects only external light.

Modification Example

The above-described liquid crystal display device is one embodiment of the present invention, and the present invention includes a liquid crystal display device which is different from the above-described liquid crystal display device.

For example, any of the structures which are described in Modification Examples in Embodiments 1 to 3 can be applied to the liquid crystal display device in this embodiment.

Figure 42:
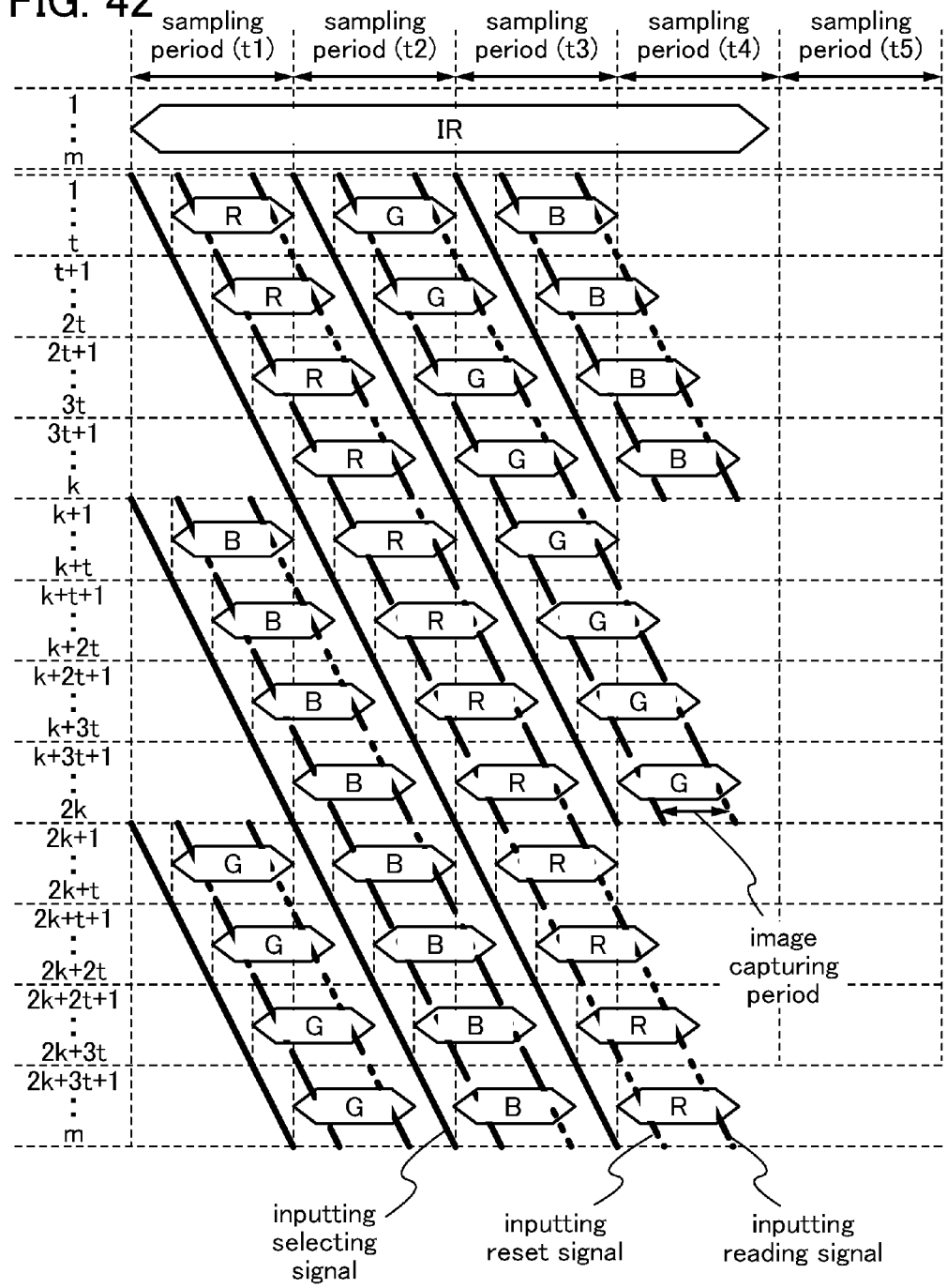
FIG. 42 illustrates an example of operation of a liquid crystal display device.
Figure 43:
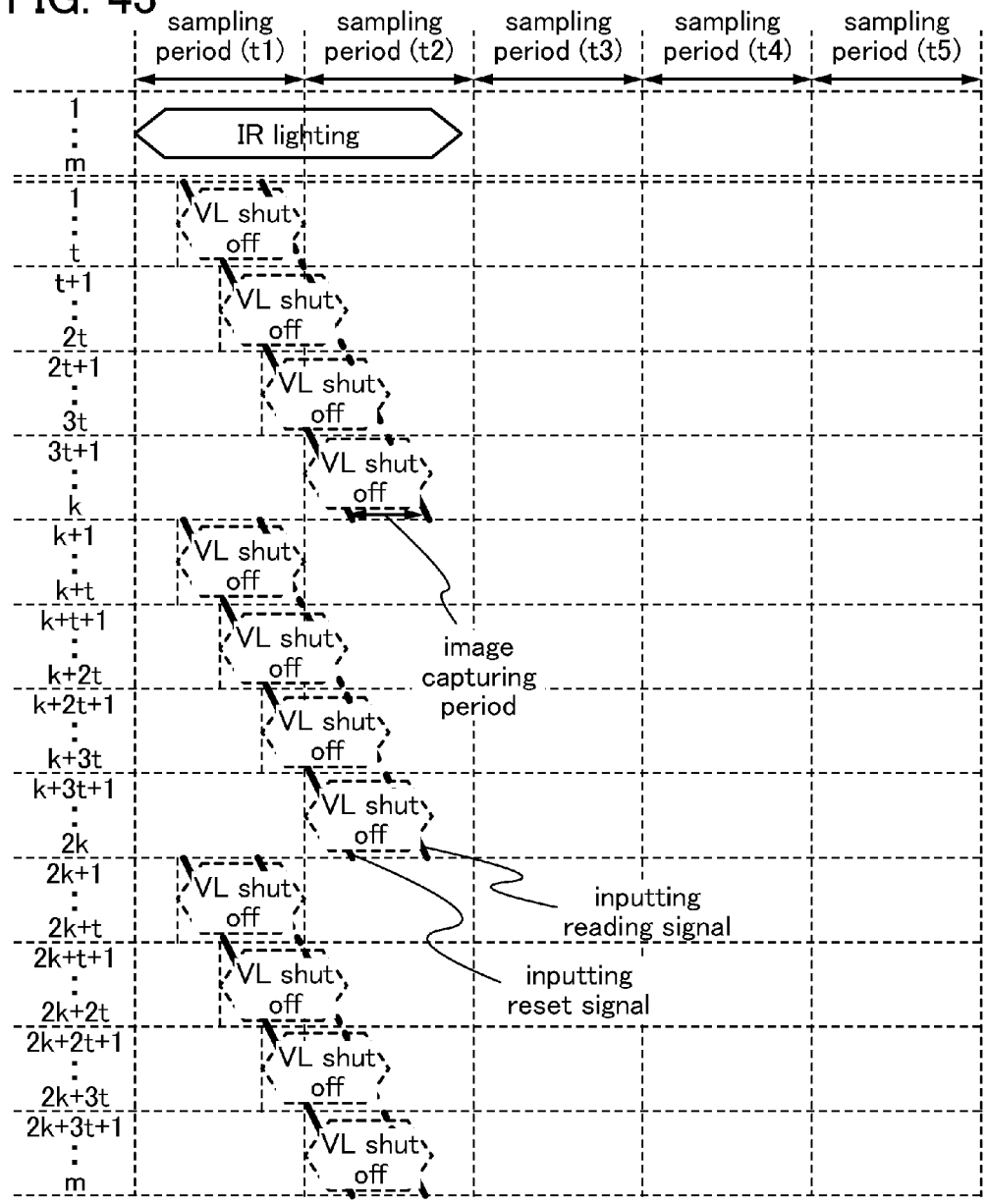
FIG. 43 illustrates an example of operation of a liquid crystal display device.

Furthermore, in the liquid crystal display device, blinking of the light source emitting light whose wavelength is in the infrared (IR) region is controlled per given region (see FIG. 37, FIG. 38, FIG. 39, FIG. 40, and FIG. 41); however, blinking of the light source emitting light whose wavelength is in the infrared (IR) region can be alternatively controlled in the whole region of the backlight. Specific examples of the case where blinking of the light source emitting light whose wavelength is in the infrared (IR) region is controlled in the whole region of the backlight are illustrated in FIG. 42 and FIG. 43. Note that in the operation examples in FIG. 42 and FIG. 43, blinking of the light sources emitting visible light are controlled per given region. FIG. 42 illustrates operation in the case where blinking of the light source emitting light whose wavelength is in the infrared (IR) region is controlled in the whole region of the backlight and display and image capture which are similar to those illustrated in FIG. 37 or FIG. 38 are performed. FIG. 43 illustrates operation in the case where blinking of the light source emitting light whose wavelength is in the infrared (IR) region is controlled in the whole region of the backlight and image capture which is similar to that illustrated in FIG. 42 is performed. Note that "VL" in FIG. 43 means the light source emitting visible light.

The structures in Modification Example can be applied in combination to the liquid crystal display device in this embodiment.

This embodiment or part of this embodiment can be freely combined with the other embodiments or part of the other embodiments.

(Specific Structure Example of Liquid Crystal Display Device Disclosed in this Specification)

A specific structure example of the above-described liquid crystal display device is described below.

<Specific Examples of Transistor>

First, specific examples of a transistor used in the pixel portion or any of the circuits in the liquid crystal display device is described with reference to FIGS. 15A to 15D. Note that in the liquid crystal display device, a transistor provided in the pixel portion and a transistor provided in any of the circuits may have the same structure or different structures.

Figure 15A:
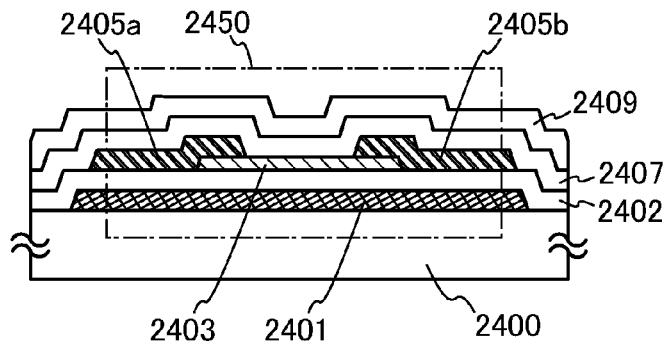
FIGS. 15A to 15D illustrate specific examples of transistors.

A transistor 2450 illustrated in FIG. 15A includes a gate layer 2401 over a substrate 2400, a gate insulating layer 2402 over the gate layer 2401, a semiconductor layer 2403 over the gate insulating layer 2402, and a source layer 2405a and a drain layer 2405b over the semiconductor layer 2403. An insulating layer 2407 is formed over the semiconductor layer 2403, the source layer 2405a, and the drain layer 2405b. A protective insulating layer 2409 may be formed over the insulating layer 2407. The transistor 2450 is a bottom-gate transistor, and is also an inverted staggered transistor.

Figure 15B:
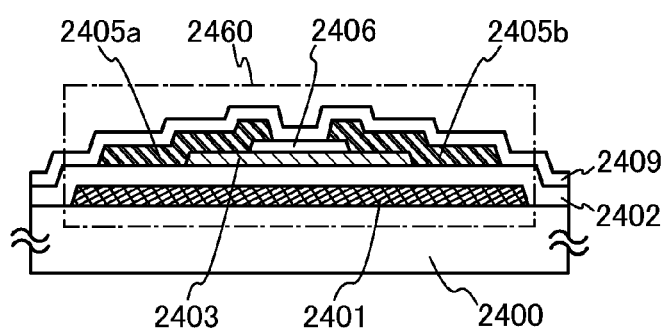

A transistor 2460 illustrated in FIG. 15B includes the gate layer 2401 over the substrate 2400, the gate insulating layer 2402 over the gate layer 2401, the semiconductor layer 2403 over the gate insulating layer 2402, a channel protective layer 2406 over the semiconductor layer 2403, and the source layer 2405a and the drain layer 2405b over the channel protective layer 2406 and the semiconductor layer 2403. The protective insulating layer 2409 may be formed over the source layer 2405a and the drain layer 2405b. The transistor 2460 is a bottom-gate transistor called a channel-protective type (also referred to as a channel-stop type) transistor and is also an inverted staggered transistor.

Figure 15C:
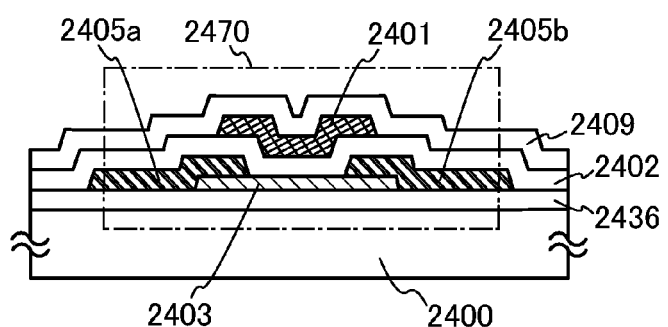

A transistor 2470 illustrated in FIG. 15C includes a base layer 2436 over the substrate 2400, the semiconductor layer 2403 over the base layer 2436, the source layer 2405a and the drain layer 2405b over the semiconductor layer 2403 and the base layer 2436, the gate insulating layer 2402 over the semiconductor layer 2403, the source layer 2405a, and the drain layer 2405b, and the gate layer 2401 over the gate insulating layer 2402. The protective insulating layer 2409 may be formed over the gate layer 2401. The transistor 2470 is a top-gate transistor.

Figure 15D:
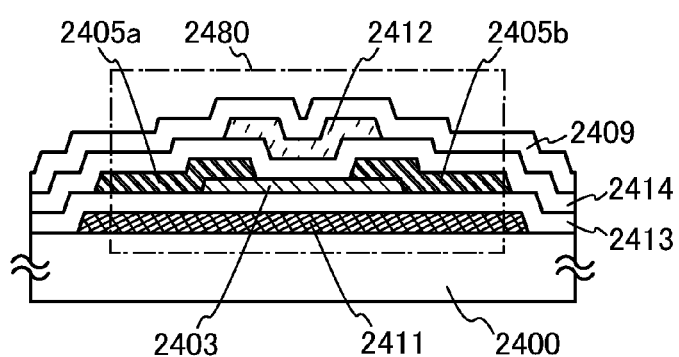

A transistor 2480 illustrated in FIG. 15D includes a first gate layer 2411 over the substrate 2400, a first gate insulating layer 2413 over the first gate layer 2411, the semiconductor layer 2403 over the first gate insulating layer 2413, and the source layer 2405a and the drain layer 2405b over the semiconductor layer 2403 and the first gate insulating layer 2413. A second gate insulating layer 2414 is formed over the semiconductor layer 2403, the source layer 2405a, and the drain layer 2405b, and a second gate layer 2412 is formed over the second gate insulating layer 2414. The protective insulating layer 2409 may be formed over the second gate layer 2412.

The transistor 2480 has a structure combining the transistor 2450 and the transistor 2470. The first gate layer 2411 and the second gate layer 2412 can be electrically connected to each other so as to function as one gate layer. Further, one of the first and second gate layers 2411 and 2412 may be referred to simply as a "gate" and the other may be referred to as a "back gate". Note that by changing the potential of the back gate of the transistor 2480, threshold voltage of the transistor 2480 at a time of controlling switching with the potential of the gate can be changed.

Examples of the substrate 2400 are a semiconductor substrate (e.g., a single crystal substrate and a silicon substrate), an SOI substrate, a glass substrate, a quartz substrate, a conductive substrate having a surface on which an insulating layer is formed, and a flexible substrate such as a plastic substrate, a bonding film, paper containing a fibrous material, and a base film. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic.

For the gate layer 2401 and the first gate layer 2411, an element selected from aluminum (Al), copper (Cu), titanium (Ti), tantalum (Ta), tungsten (W), molybdenum (Mo), chromium (Cr), neodymium (Nd), and scandium (Sc); an alloy containing any of these elements; or a nitride containing any of these elements can be used. A stacked structure of these materials can also be used.

For the gate insulating layer 2402, the first gate insulating layer 2413, and the second gate insulating layer 2414, an insulator such as silicon oxide, silicon nitride, silicon oxynitride, silicon nitride oxide, aluminum oxide, tantalum oxide, or gallium oxide can be used. A stacked structure of these materials can also be used. Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, the silicon nitride oxide film refers to a film which contains more nitrogen than oxygen and contains oxygen, nitrogen, silicon, and hydrogen at given concentrations ranging from 15 atomic % to 30 atomic %, 20 atomic % to 35 atomic %, 25 atomic % to 35 atomic %, and 15 atomic % to 25 atomic %, respectively, where the total percentage of atoms is 100 atomic %.

The semiconductor layer 2403 can be formed using any of the following semiconductor materials, for example: a material containing an element belonging to Group 14 of the periodic table, such as silicon (Si) or germanium (Ge), as its main component; a compound such as silicon germanium (SiGe) or gallium arsenide (GaAs); an oxide such as zinc oxide (ZnO) or zinc oxide containing indium (In) and gallium (Ga); or an organic compound exhibiting semiconductor characteristics can be used. A stacked structure of layers formed using these semiconductor materials can also be used.

In the case of using silicon (Si) as the semiconductor layer 2403, there is no particular limitation of the crystal state of the semiconductor layer 2403. In other words, any of amorphous silicon, microcrystalline silicon, polycrystalline silicon, and single crystal silicon can be used as the semiconductor layer 2403. Note that the Raman spectrum of microcrystalline silicon is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor contains hydrogen or halogen of at least 1 atomic % to terminate a dangling bond. Further, the microcrystalline semiconductor may contain a rare gas element such as helium, argon, krypton, or neon to further promote lattice distortion, so that stability is increased and a favorable microcrystalline semiconductor can be obtained.

Moreover, in the case where an oxide (an oxide semiconductor) is used for the semiconductor layer 2403, any of the following can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are three-component metal oxides; an In—Ga—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor which are two-component metal oxides; and an In—O-based oxide semiconductor, a Sn—O-based oxide semiconductor, and a Zn—O-based oxide semiconductor which are single-component metal oxides. Further, $SiO_2$ may be contained in the above oxide semiconductor. Here, for example, the In—Ga—Zn—O-based oxide semiconductor means an oxide containing at least In, Ga, and Zn, and the composition ratio of the elements is not particularly limited. The In—Ga—Zn—O-based oxide semiconductor may contain an element other than In, Ga, and Zn.

As the oxide semiconductor, a thin film represented by the chemical formula, $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an In—Zn—O-based oxide semiconductor which has an atomic ratio of In:Zn:O=X:Y:Z, the relation of Z>1.5X+Y is satisfied.

For the source layer 2405*a*, the drain layer 2405*b*, and the second gate layer 2412, an element selected from aluminum (Al), copper (Cu), titanium (Ti), tantalum (Ta), tungsten (W), molybdenum (Mo), chromium (Cr), neodymium (Nd), and scandium (Sc); an alloy containing any of these elements; or a nitride containing any of these elements can be used. A stacked structure of these materials can also be used.

A conductive film to be the source layer 2405*a* and the drain layer 2405*b* (including a wiring layer formed using the same layer as the source and drain layers) may be formed using a conductive metal oxide. As conductive metal oxide, indium oxide ($In_2O_3$), tin oxide ($SnO_2$), zinc oxide (ZnO), an indium oxide-tin oxide alloy ($In_2O_3$—$SnO_2$; abbreviated to ITO), an indium oxide-zinc oxide alloy ($In_2O_3$—ZnO), or any of these metal oxide materials in which silicon oxide is contained can be used.

As the channel protective layer 2406, an insulator such as silicon oxide, silicon nitride, silicon oxynitride, silicon nitride oxide, aluminum oxide, tantalum oxide, or gallium oxide can be used. A stacked structure of these materials can also be used.

For the insulating layer 2407, an insulator such as silicon oxide, silicon oxynitride, aluminum oxide, aluminum oxynitride, or gallium oxide can be used. A stacked structure of these materials can also be used.

For the protective insulating layer 2409, an insulator such as silicon nitride, aluminum nitride, silicon nitride oxide, or aluminum nitride oxide can be used. A stacked structure of these materials can also be used.

For the base layer 2436, an insulator such as silicon oxide, silicon nitride, silicon oxynitride, silicon nitride oxide, aluminum oxide, tantalum oxide, or gallium oxide can be used. A stacked structure of these materials can also be used.

Note that in the case where an oxide semiconductor is used as the semiconductor layer 2403, the insulating layers (here, the gate insulating layer 2402, the insulating layer 2407, the channel protective layer 2406, the base layer 2436, the first gate insulating layer 2413, and the second gate insulating layer 2414) in contact with the oxide semiconductor are preferably formed using an insulating material that contains a Group 13 element and oxygen. Many of oxide semiconductor materials include a Group 13 element, and an insulating material including a Group 13 element works well with an oxide semiconductor. By using an insulating material including a Group 13 element for an insulating layer in contact with the oxide semiconductor, an interface with the oxide semiconductor can keep a favorable state.

An insulating material containing a Group 13 element refers to an insulating material including one or more Group 13 elements. As the insulating material containing a Group 13 element, gallium oxide, aluminum oxide, aluminum gallium oxide, and gallium aluminum oxide can be given for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating layer in contact with an oxide semiconductor layer containing gallium, a material containing gallium oxide may be used as an insulating layer, so that favorable characteristics can be kept at the interface between the oxide semiconductor layer and the insulating layer. When the oxide semiconductor layer and the insulating layer containing gallium oxide are provided in contact with each other, pileup of hydrogen at the interface between the oxide semiconductor layer and the insulating layer can be reduced, for example. Note that a similar effect can be obtained in the case where an element in the same group as a constituent element of the oxide semiconductor is used in an insulating layer. For example, it is effective to form an insulating layer with the use of a material containing aluminum oxide. Note that aluminum oxide has a property of not easily transmitting water. Thus, it is preferable to use a material containing aluminum oxide in terms of preventing entry of water to the oxide semiconductor layer.

In the case where an oxide semiconductor is used as the semiconductor layer 2403, the insulating material of the insulating layer in contact with the oxide semiconductor preferably includes oxygen in a proportion higher than that in the stoichiometric composition, by heat treatment under an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer is formed of gallium oxide, the composition of gallium oxide can be set to be $Ga_2O_x$ ($x=3+\alpha$, $0<\alpha<1$) by heat treatment under an oxygen atmosphere or oxygen doping.

In the case where the insulating layer is formed of aluminum oxide, the composition of aluminum oxide can be set to be $Al_2O_x$ ($x=3+\alpha$, $0<\alpha<1$) by heat treatment under an oxygen atmosphere or oxygen doping.

In the case where the insulating layer is formed of gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment under an oxygen atmosphere or oxygen doping.

By oxygen doping, an insulating layer which includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency defects in the oxide semiconductor layer or at an interface between the oxide semiconductor layer and the insulating layer are reduced. Thus, the oxide semiconductor layer can be formed to an i-type or substantially i-type oxide semiconductor.

In the case where an oxide semiconductor is used as the semiconductor layer 2403, only one of the insulating layer on the upper side and that on the lower side of the semiconductor layer 2403 can include a region where the proportion of oxygen is higher than that in the stoichiometric composition; however, it is preferable that both of the insulating layers include such regions. The above-described effect can be enhanced with a structure where the semiconductor layer 2403 is sandwiched between the insulating layers which each include a region where the proportion of oxygen is higher than that in the stoichiometric composition, which are used as the insulating layers in contact with the semiconductor layer 2403 and located on the upper side and the lower side of the semiconductor layer 2403.

In the case where an oxide semiconductor is used as the semiconductor layer 2403, the insulating layers on the upper side and the lower side of the semiconductor layer 2403 may contain the same constituent element or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of $Ga_2O_x$ ($x=3+\alpha$, $0<\alpha<1$) and the other may be formed of aluminum oxide whose composition is $Al_2O_x$ ($x=3+\alpha$, $0<\alpha<1$).

In the case where an oxide semiconductor is used as the semiconductor layer 2403, the insulating layer in contact with the semiconductor layer 2403 may be formed by stacking insulating layers which each include a region where the proportion of oxygen is higher than that in the stoichiometric composition. For example, the insulating layer on the upper side of the semiconductor layer 2403 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) may be formed thereover. Note that the insulating layer on the lower side of the semiconductor layer 2403 may be formed by stacking insulating layers which each include a region where the proportion of oxygen is higher than that in the stoichiometric composition. Further, both of the insulating layers on the upper side and the lower side of the semiconductor layer 2403 may be formed by stacking insulating layers which each include a region where the proportion of oxygen is higher than that in the stoichiometric composition.

Here, a transistor 951 in which an oxide semiconductor was used as a semiconductor layer and a transistor 952 having a back gate in which an oxide semiconductor was used as a semiconductor layer were formed and the amount of change in threshold voltage ($V_{th}$) before and after a light negative bias test was evaluated, the results of which are described below.

Figure 19A:
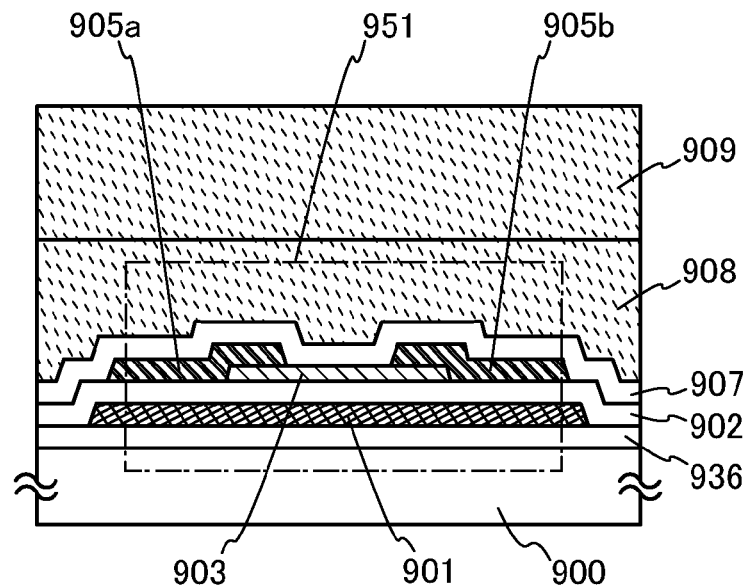
FIGS. 19A and 19B illustrate structures of transistors.

First, a stacked structure and a manufacturing method of the transistor 951 are described with reference to FIG. 19A. A stacked-layer film of a silicon nitride film (thickness: 200 nm) and a silicon oxynitride film (thickness: 400 nm) was formed as a base layer 936 over a substrate 900 by a CVD method. After that, a stacked-layer film of a tantalum nitride film (thickness: 30 nm) and a tungsten film (thickness: 100 nm) was formed over the base layer 936 by a sputtering method and selectively etched, so that a gate layer 901 was formed.

Then, a silicon oxynitride layer (thickness: 30 nm) was formed as a gate insulating layer 902 over the gate layer 901 by a high density plasma CVD method.

Then, with the use of an In—Ga—Zn—O-based metal oxide target, an oxide semiconductor film (thickness: 30 nm) was formed over the gate insulating layer 902 by a sputtering method. After that, an island-shaped oxide semiconductor layer 903 was formed by selectively etching the oxide semiconductor film.

Then, first heat treatment was performed at 450° C. under a nitrogen atmosphere for 60 minutes.

After that, a stacked-layer film of a titanium film (thickness: 100 nm), an aluminum film (thickness: 200 nm), and a titanium film (thickness: 100 nm) was formed over the oxide semiconductor layer 903 by a sputtering method and selectively etched, so that a source layer 905a and a drain layer 905b were formed.

Then, second heat treatment was performed at 300° C. under a nitrogen atmosphere for 60 minutes.

Then, as an insulating layer 907 which is in contact with part of the oxide semiconductor layer 903 and provided over the source and drain layers 905a and 905b, a silicon oxide film (thickness: 300 nm) was formed by a sputtering method and a polyimide resin layer (thickness: 1.5 μm) was formed as an insulating layer 908 over the insulating layer 907.

Then, third heat treatment was performed at 250° C. under a nitrogen atmosphere for 60 minutes.

After that, a polyimide resin layer (thickness: 2.0 μm) was formed as an insulating layer 909 over the insulating layer 908.

Then, fourth heat treatment was performed at 250° C. under a nitrogen atmosphere for 60 minutes.

Figure 19B:
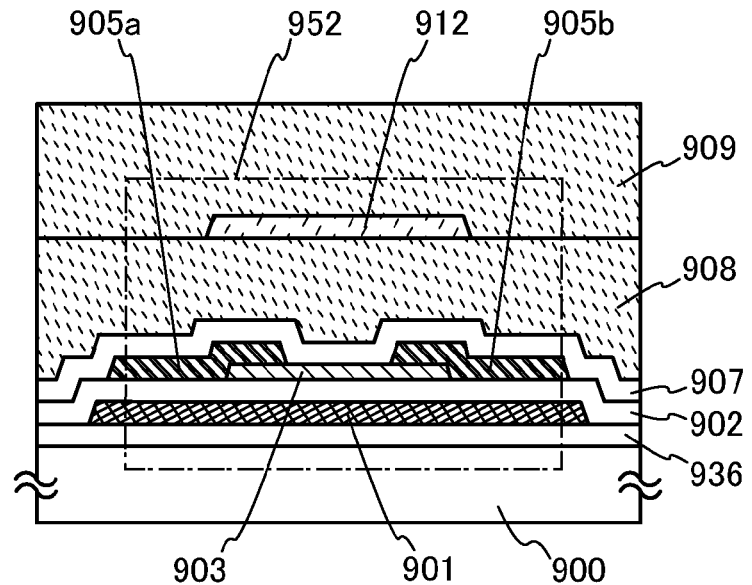

The transistor 952 illustrated in FIG. 19B can be formed in a manner similar to that of the transistor 951. Note that the transistor 952 is different from the transistor 951 in that a back gate layer 912 was formed between the insulating layer 908 and the insulating layer 909. The back gate layer 912 was formed in such a manner that a stacked-layer film of a titanium film (thickness: 100 nm), an aluminum film (thickness: 200 nm), and a titanium film (thickness: 100 nm) was formed over the insulating layer 908 by a sputtering method and selectively etched. Note that the back gate layer 912 was electrically connected to the source layer 905a.

In each of the transistors 951 and 952, the channel length was 3 μm and the channel width was 20 μm.

Next, the light negative bias test which was performed on the transistors 951 and 952 is described.

A light negative bias test is one of accelerated tests and can evaluate a change in characteristics of transistors which are irradiated with light, in a short time. In particular, the amount of change in threshold voltage ($V_{th}$) before and after a light negative bias test is an important factor in testing reliability. As the amount of change in $V_{th}$ before and after the light negative bias test is smaller, the transistor has higher reliability. The amount of change in $V_{th}$ before and after a light negative bias test is preferably 1 V or less and further preferably 0.5 V or less.

Specifically, a light negative bias test is performed in such a manner that the temperature of a substrate over which a transistor is formed (substrate temperature) is kept at fixed temperature, a source and a drain of the transistor are set at the same potential, and a gate is supplied with potential lower than those of the source and the drain for a certain period while light irradiation is performed.

The stress conditions for a light negative bias test can be determined by setting light irradiation conditions, the substrate temperature, electric field intensity applied to a gate insulating layer, or a time period of application of electric field. The intensity of the electric field applied to the gate insulating layer is determined in accordance with a value obtained by dividing a potential difference between the gate and the source and drain by the thickness of the gate insulating layer. For example, in the case where the intensity of the electric field applied to the gate insulating layer with a thickness of 100 nm is to be 2 MV/cm, the potential difference may be set to 20 V.

Note that although there is also a test called a light positive bias test in which a gate is supplied with potential higher than those of a source and a drain in a transistor which is irradiated with light, evaluation was conducted utilizing the light negative bias test here because a change in transistor characteristics is more likely to be caused in a light negative bias test than in a light positive bias test.

The substrate temperature in the light negative bias test here was room temperature (25° C.), the intensity of the electric field applied to the gate insulating layer 902 was 2 MV/cm, and each of a time period of light irradiation and a time period of application of electric field was one hour. The light irradiation conditions were as follows: MAX-302, a xenon light source manufactured by Asahi Spectra Co., Ltd., was used; peak wavelength was 400 nm (half width: 10 nm); and irradiance was 326 μW/cm².

Before the light negative bias test, initial characteristics of the transistors on which the test was performed were measured. Here, a change in characteristics of a current that flows between the source and the drain (hereinafter referred to as a drain current or $I_d$), i.e., $V_g$-$I_d$ characteristics, were measured under the conditions where the substrate temperature was set to room temperature (25° C.), the voltage between the source and the drain (hereinafter referred to as a drain voltage or $V_d$) was set to 3 V, and the voltage between the source and the gate (hereinafter referred to as a gate voltage or $V_g$) was changed from −5 V to +5 V.

After that, light irradiation from the insulating layer 908 side was performed, the potential of the source and drain of each of the transistors was set to 0 V, and a negative voltage was applied to the gate so that the intensity of the electric field applied to the gate insulating layer 902 of each of the transistors was 2 MV/cm. Since the thickness of the gate insulating layer 902 in each of the transistors of was 30 nm here, a voltage of −6 V kept being applied to the gate for one hour. The time period of voltage application was one hour here; however, the time period may be determined as appropriate in accordance with the purpose.

After application of voltage was stopped, $V_g$-$I_d$ characteristics after the light negative bias test were measured with light irradiation still performed, in the same conditions as the measurement of the initial characteristics.

Figure 20:
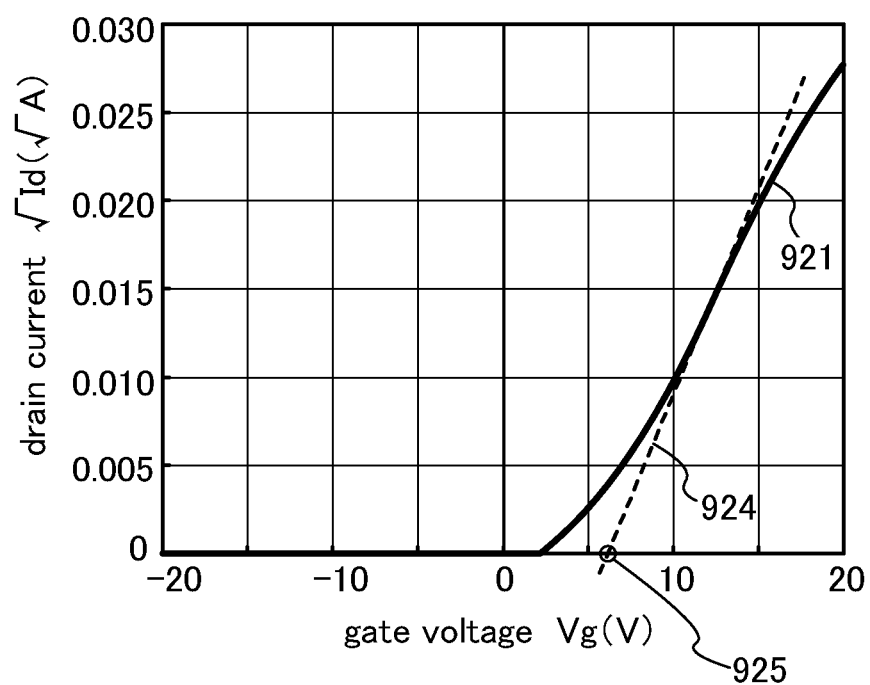
FIG. 20 illustrates a method for calculating $V_{th}$.

Here, a method for calculating $V_{th}$ is described with reference to FIG. 20 as an example. In FIG. 20, gate voltage is plotted on a linear scale on the horizontal axis, and a square root of drain current (hereinafter also referred to as $\sqrt{I_d}$) is plotted on a linear scale on the vertical axis. A curve 921 represents a square root of $I_d$ of $V_g$-$I_d$ characteristics (such a curve is hereinafter also referred to as a $\sqrt{I_d}$ curve).

First, a $\sqrt{I_d}$ curve (the curve 921) is obtained from the $V_g$-$I_d$ curve obtained by measurement. Then, a tangent line 924 of a point on the $\sqrt{I_d}$ curve at which a differential value of the $\sqrt{I_d}$ curve becomes maximum is obtained. Then, the tangent line 924 is extended, and $V_g$ at a point where $I_d$ is 0 A on the tangent line 924, that is, a value at an intercept 925 of the tangent line 924 and the gate voltage axis is defined as $V_{th}$.

Figure 21A:
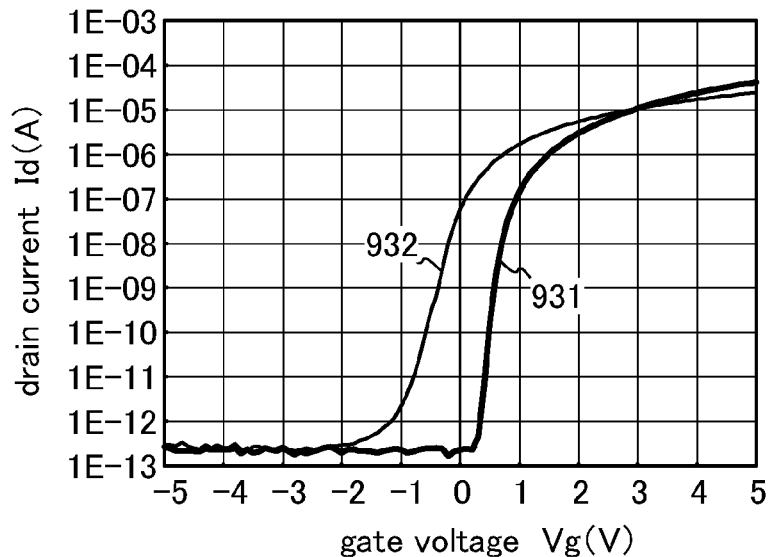
FIGS. 21A to 21C illustrate results of a light negative bias test.
Figure 21B:
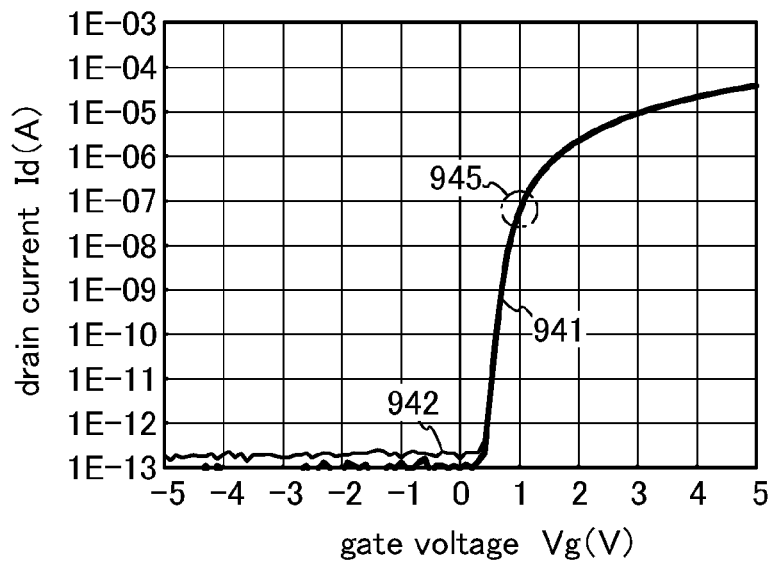
Figure 21C:
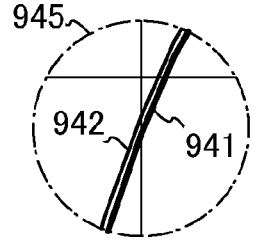

FIGS. 21A to 21C illustrate the $V_g$-$I_d$ characteristics of the transistors 951 and 952 before and after the light negative bias test. In each of FIGS. 21A and 21B, the horizontal axis indicates a gate voltage ($V_g$) and the vertical axis indicates a drain current ($I_d$) which is shown with a logarithmic scale.

FIG. 21A shows the $V_g$-$I_d$ characteristics of the transistor 951 before and after the light negative bias test. Initial characteristics 931 are the $V_g$-$I_d$ characteristics of the transistor 951 before the light negative bias test and characteristics 932 after the test are the $V_g$-$I_d$ characteristics of the transistor 951 after the light negative bias test. The threshold voltage $V_{th}$ of the initial characteristics 931 was 1.01 V and $V_{th}$ of the characteristics 932 after the test was 0.44 V.

FIG. 21B shows the $V_g$-$I_d$ characteristics of the transistor 952 before and after the light negative bias test. In FIG. 21C, a part 945 in FIG. 21B is enlarged. Initial characteristics 941 are the $V_g$-$I_d$ characteristics of the transistor 952 before the light negative bias test and characteristics 942 after the test are the $V_g$-$I_d$ characteristics of the transistor 952 after the light negative bias test. The threshold voltage $V_{th}$ of the initial characteristics 941 was 1.16 V and $V_{th}$ of the characteristics 942 after the test was 1.10 V. Note that since the back gate layer 912 of the transistor 952 is electrically connected to the source layer 905a, the potential of the back gate layer 912 is the same as that of the source layer 905a.

In FIG. 21A, $V_{th}$ of the characteristics 932 after the test shifted by 0.57 V in the negative direction as compared to that of the initial characteristics 931; in FIG. 21B, $V_{th}$ of the characteristics 942 after the test shifted by 0.06 V in the negative direction as compared to the initial characteristics 941. The amount of shift of $V_{th}$ was as small as 1 V or less in both the transistor 951 and the transistor 952; accordingly, it can be confirmed that the transistors were highly reliable. Further, the amount of shift of $V_{th}$ is 0.1 V or less in the transistor 952 which was provided with the back gate layer 912, and it can be confirmed that the transistor 952 has higher reliability than the transistor 951.

<Specific Example of Layout of Pixel>

Figure 16:
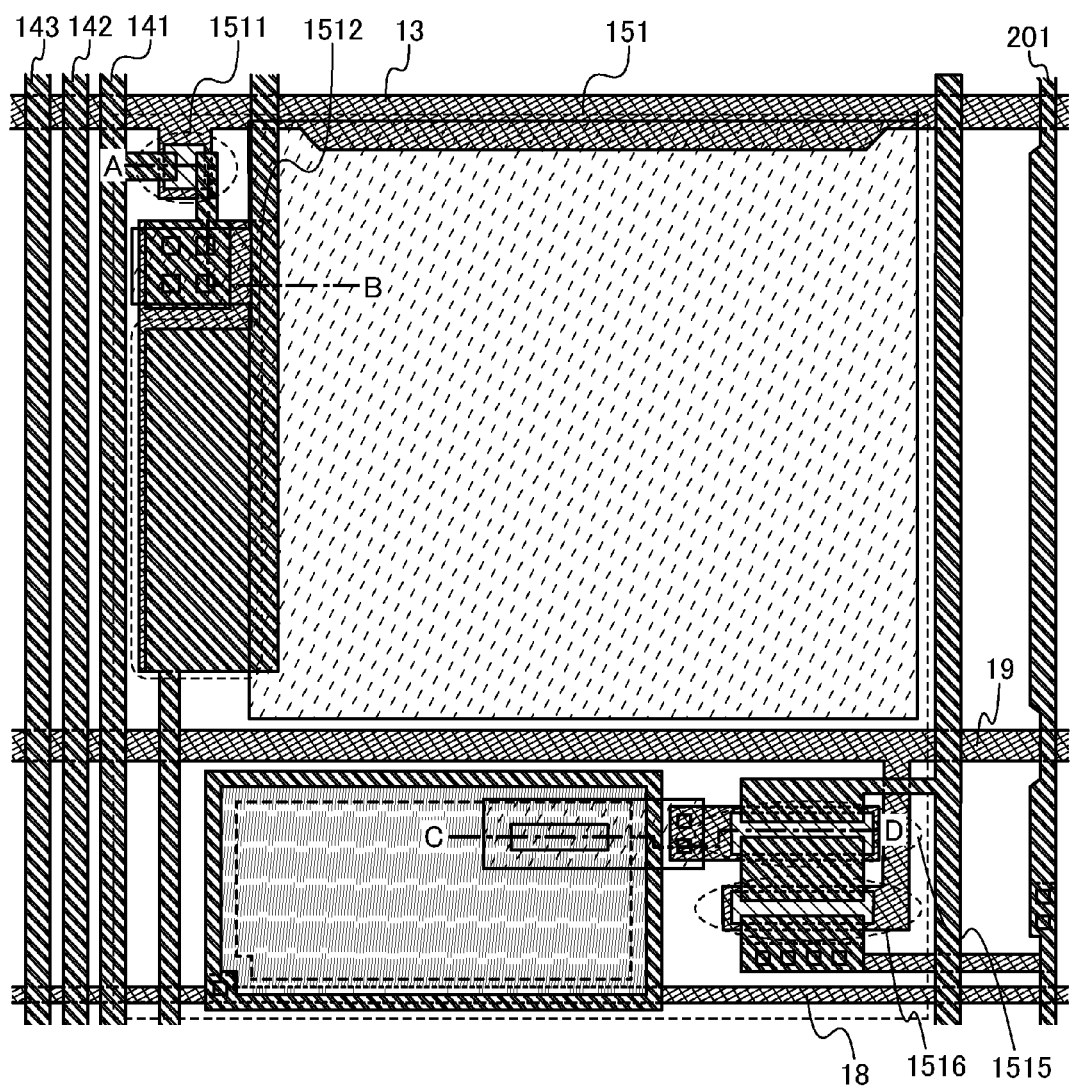
FIG. 16 is a plan view illustrating a specific example of a layout of a pixel.
Figure 17:
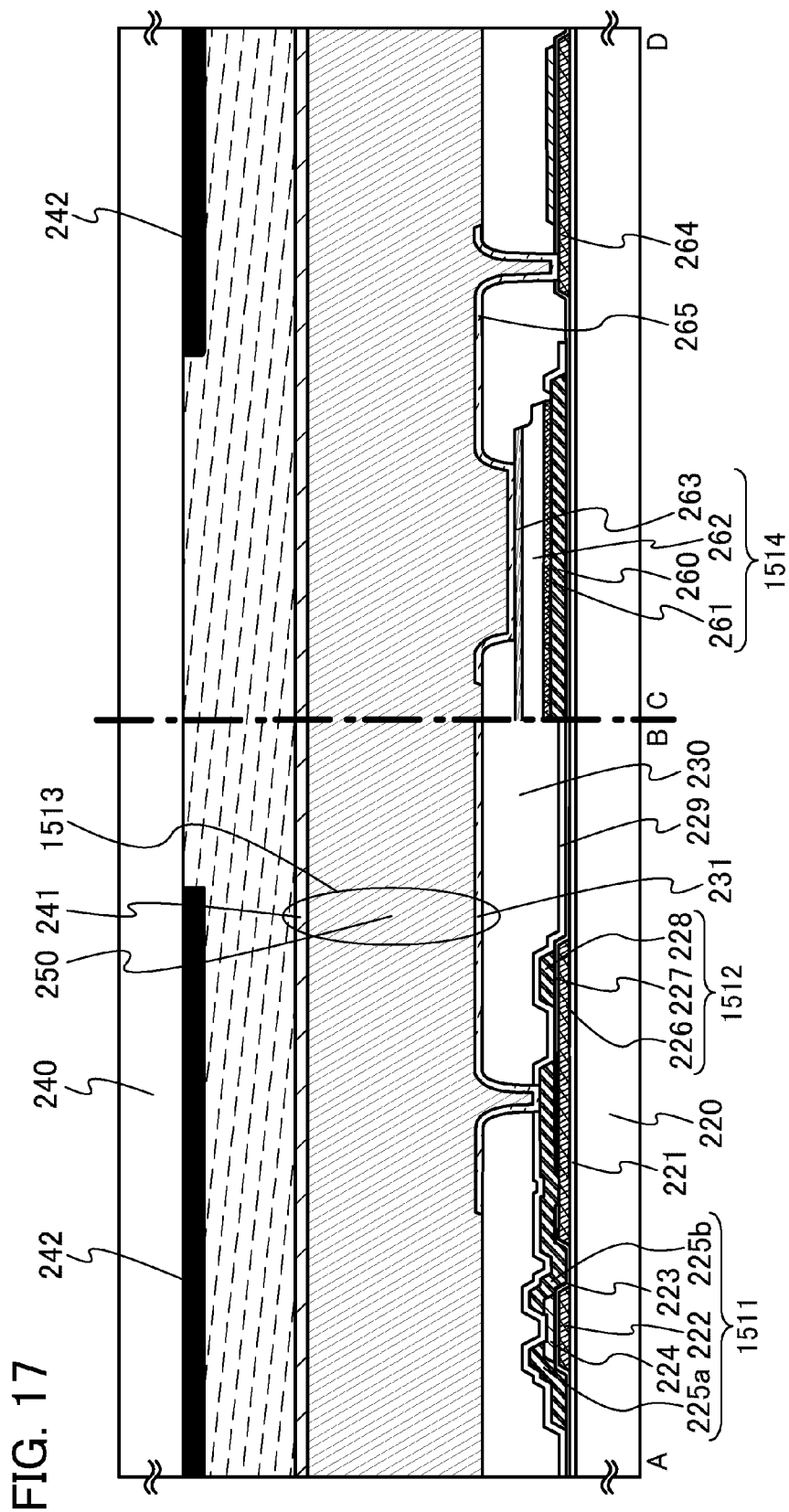
FIG. 17 is a cross-sectional view illustrating a specific example of a layout of a pixel.

Next, a specific example of a layout of a pixel in the liquid crystal display device is described with reference to FIG. 16 and FIG. 17. Note that FIG. 16 is a plan view illustrating a layout of the pixel illustrated in FIG. 2A; FIG. 17 is a cross-sectional view taken along a line A-B and a line C-D in FIG. 16. Note that in the pixel 151 illustrated in FIG. 16, the display element is provided in an upper portion and the image sensor is provided in a lower portion. In FIG. 16, components such as the liquid crystal layer and the counter electrode are omitted. Hereinafter, a specific structure is described with reference to FIG. 17.

The transistor 1511 includes a conductive layer 222 formed over a substrate 220 with an insulating layer 221 provided therebetween, an insulating layer 223 formed over the conductive layer 222, a semiconductor layer 224 formed over the conductive layer 222 with the insulating layer 223 provided therebetween, a conductive layer 225a formed over one edge of the semiconductor layer 224, and a conductive layer 225b formed over the other edge of the semiconductor layer 224. Note that the conductive layer 222 functions as a gate layer; the insulating layer 223 functions as a gate insulating layer; one of the conductive layers 225a and 225b functions as a source layer; and the other functions as a drain layer.

The capacitor 1512 includes a conductive layer 226 formed over the substrate 220 with the insulating layer 221 provided therebetween, an insulating layer 227 formed over the conductive layer 226, and a conductive layer 228 formed over the conductive layer 226 with the insulating layer 227 provided therebetween. The conductive layer 226 functions as one electrode of the capacitor 1512; the insulating layer 227 functions as a dielectric of the capacitor 1512; and the conductive layer 228 functions as the other electrode of the capacitor 1512. Further, the conductive layer 226 is formed from the same material as the conductive layer 222; the insulating layer 227 is formed from the same material as the insulating layer 223; and the conductive layer 228 is formed from the same material as the conductive layers 225a and 225b. In addition, the conductive layer 226 is electrically connected to the conductive layer 225b.

Note that an insulating layer 229 and a planarizing insulating layer 230 are provided over the transistor 1511 and the capacitor 1512.

The liquid crystal element 1513 includes a transparent conductive layer 231 formed over the planarizing insulating layer 230, a transparent conductive layer 241 provided on a counter substrate 240, and a liquid crystal layer 250 sandwiched between the transparent conductive layers 231 and 241. Note that the transparent conductive layer 231 functions as the pixel electrode of the liquid crystal element 1513 and the transparent conductive layer 241 functions as the counter electrode of the liquid crystal element 1513. Further, the transparent conductive layer 241 is electrically connected to the conductive layers 225b and 226.

The photodiode 1514 includes a conductive layer 260 formed over the substrate 220 with the insulating layers 221 and 227 provided therebetween, a p-type semiconductor layer 261 formed over the conductive layer 260, an i-type semiconductor layer 262 formed over the p-type semiconductor layer 261, and an n-type semiconductor layer 263 formed over the i-type semiconductor layer 262. Note that the conductive layer 260 is formed from the same material as the conductive layers 225a, 225b, and 228.

The transistors 1515 and 1516 each have the same structure as the transistor 1511. Note that a conductive layer 264 that functions as the gate layer of the transistor 1515 is electrically connected to the n-type semiconductor layer 263 via a transparent conductive layer 265. Note that the conductive layer 264 is formed from the same material as the conductive layers 222 and 226; the transparent conductive layer 265 is formed from the same material as the transparent conductive layer 231.

Note that an alignment film may be provided between the transparent conductive layer 231 and the liquid crystal layer 250 or between the transparent conductive layer 241 and the liquid crystal layer 250, as appropriate. The alignment film can be formed using an organic resin such as polyimide or polyvinyl alcohol. An alignment treatment such as rubbing is performed on a surface of the alignment film in order to align liquid crystal molecules in a certain direction. Rubbing can be performed by rolling a roller wrapped with cloth of nylon or the like while being in contact with the alignment film and the surface of the alignment film is rubbed in a certain direction. Note that it is also possible to form the alignment film that has alignment characteristics with the use of inorganic materials such as silicon oxide by evaporation, without alignment treatment.

Injection of the liquid crystal for formation of the liquid crystal layer 250 may be performed by a dispenser method (dripping method) or a dipping method (pumping method).

In order to prevent disclination caused by alignment disorder of the liquid crystals between the pixels from being observed, or in order to prevent diffused light from entering a plurality of adjacent pixels, the counter substrate 240 is provided with a light-blocking layer 242 which can block light. The light-blocking layer 242 can be formed using an organic resin containing a black pigment such as a carbon black or titanium lower oxide whose oxidation number is smaller than that of titanium dioxide. Alternatively, a film of chromium can be used as the light-blocking layer 242.

The transparent conductive layers 231, 241, and 265 can be formed using a light-transmitting conductive material such as indium tin oxide containing silicon oxide (ITSO), indium tin oxide (ITO), zinc oxide (ZnO), indium zinc oxide (IZO), or gallium-doped zinc oxide (GZO), for example.

Although the liquid crystal element 1513 has a structure in which the liquid crystal layer 250 is sandwiched between the transparent conductive layers 231 and 241 in FIG. 17, the liquid crystal display device of one embodiment of the present invention is not limited to this example. A pair of electrodes may be formed over one substrate as in an IPS liquid crystal element or a liquid crystal element using a blue phase.

<Various Kinds of Electronic Devices Having Liquid Crystal Display Device>

Examples of electronic devices each having the above-described liquid crystal display device are described below with reference to FIGS. 18A to 18F.

Figure 18A:
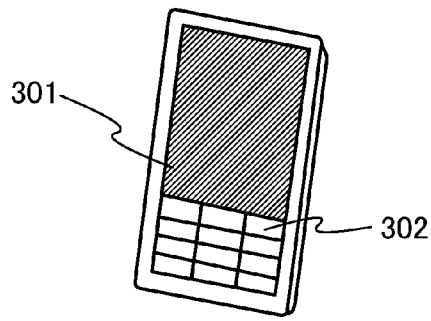
FIGS. 18A to 18F illustrate examples of electronic devices.

FIG. 18A is a drawing illustrating a personal digital assistant. The personal digital assistant in FIG. 18A includes at least a display-and-imaging portion 301. In the personal digital assistant in FIG. 18A, for example, the display-and-imaging portion 301 can be provided with an operation portion 302. For example, when the above-described liquid crystal display device is used for the display-and-imaging portion 301, operation of the personal digital assistant or input of a data to the personal digital assistant can be performed with a finger or a pen.

Figure 18B:
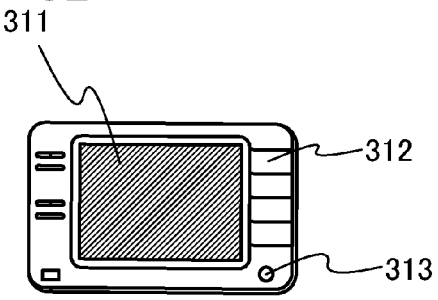

FIG. 18B is a drawing illustrating an information guide terminal including an automotive navigation system. The information guide terminal in FIG. 18B includes a display-and-imaging portion 311, operation buttons 312, and an external input terminal 313. For example, when the above-described liquid crystal display device is used for the displayand-imaging portion 311, operation of the information guide terminal or input of a data to the information guide terminal can be performed with a finger or a pen.

Figure 18C:
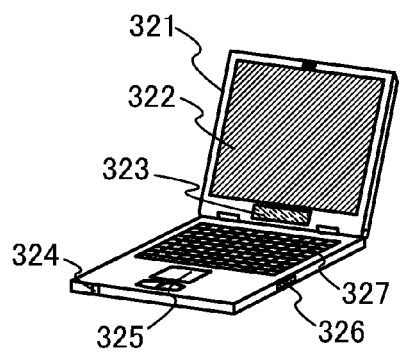

FIG. 18C is a drawing illustrating a laptop personal computer. The laptop personal computer illustrated in FIG. 18C includes a housing 321, a display-and-imaging portion 322, a speaker 323, an LED lamp 324, a pointing device 325, a connection terminal 326, and a keyboard 327. For example, when the above-described liquid crystal display device is used for the display-and-imaging portion 322, operation of the laptop personal computer or input of a data to the laptop personal computer can be performed with a finger or a pen.

Figure 18D:
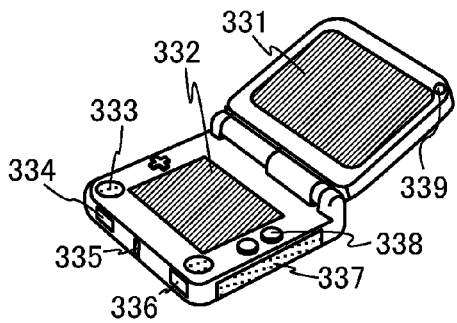

FIG. 18D is a drawing illustrating a portable game machine. The portable game machine in FIG. 18D includes a display-and-imaging portion 331, a display-and-imaging portion 332, a speaker 333, a connection terminal 334, an LED lamp 335, a microphone 336, a recording medium reading portion 337, operation buttons 338, and a sensor 339. For example, when the above-described liquid crystal display device is used for either or both the display-and-imaging portion 331 or/and the display-and-imaging portion 332, operation of the portable game machine or input of a data to the portable game machine can be performed with a finger or a pen.

Figure 18E:
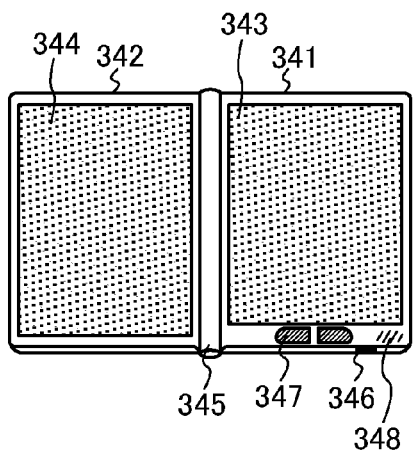

FIG. 18E is a drawing illustrating an e-book reader. The e-book reader in FIG. 18E includes at least a housing 341, a housing 342, a display-and-imaging portion 343, a display-and-imaging portion 344, and a hinge 345.

The housing 341 and the housing 342 are connected with the hinge 345. The e-book reader illustrated in FIG. 18E can be opened and closed with the hinge 345 as an axis. With such a structure, the e-book reader can be handled like a paper book. The display-and-imaging portion 343 and the display-and-imaging portion 344 are incorporated in the housing 341 and the housing 342, respectively. The display-and-imaging portion 343 and the display-and-imaging portion 344 can display different images; alternatively, one image can be displayed across both the display-and-imaging portions. In the case where different images are displayed on the display-and-imaging portion 343 and the display-and-imaging portion 344, for example, text may be displayed on the display-and-imaging portion on the right side (the display-and-imaging portion 343 in FIG. 18E) and graphics may be displayed on the display-and-imaging portion on the left side (the display-and-imaging portion 344 in FIG. 18E).

In the e-book reader in FIG. 18E, the housing 341 or the housing 342 may be provided with an operation portion or the like. For example, the e-book reader illustrated in FIG. 18E may include a power button 346, an operation key 347, and a speaker 348. In the case of the e-book reader in FIG. 18E, pages of an image with a plurality of pages can be turned with the operation key 347. Furthermore, in the e-book reader in FIG. 18E, a keyboard, a pointing device, or the like may be provided in either or both the display-and-imaging portion 343 or/and the display-and-imaging portion 344. Also in the e-book reader illustrated in FIG. 18E, an external connection terminal (an earphone terminal, a USB terminal, a terminal connectable to an AC adapter or a variety of cables such as a USB cable), a recording medium insertion portion, or the like may be provided on the back surface or side surface of the housing 341 and the housing 342. In addition, the e-book reader illustrated in FIG. 18E may have a function of an electronic dictionary.

For example, when the above-described liquid crystal display device is used for either or both the display-and-imaging portion 343 or/and the display-and-imaging portion 344, operation of the e-book reader or input of a data to the e-book reader can be performed with a finger or a pen.

Figure 18F:
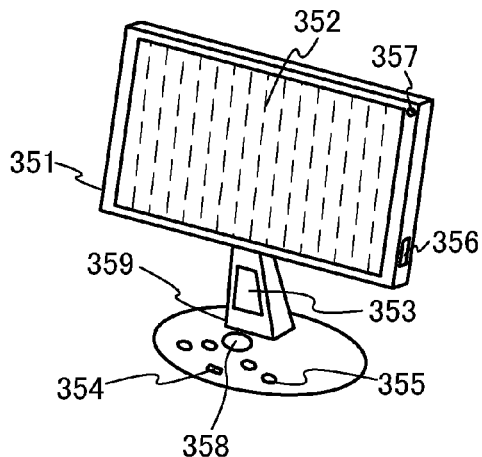

FIG. 18F is a drawing illustrating a display. The display in FIG. 18F includes a housing 351, a display-and-imaging portion 352, a speaker 353, an LED lamp 354, operation buttons 355, a connection terminal 356, a sensor 357, a microphone 358, and a supporting base 359. For example, when the above-described liquid crystal display device is used for the display-and-imaging portion 352, operation of the display or input of a data to the display can be performed with a finger or a pen.

This application is based on Japanese Patent Application serial no. 2010-150885 filed with Japan Patent Office on Jul. 1, 2010, Japanese Patent Application Serial No. 2010-150908 filed with Japan Patent Office on Jul. 1, 2010, and Japanese Patent Application Serial No. 2010-197806 filed with Japan Patent Office on Sep. 3, 2010, the entire contents of which are hereby incorporated by reference.

What is claimed is:

1. A method for driving a liquid crystal display device comprising first light sources, second light sources, a detection circuit, an image sensor driver circuit, a scan line driver circuit and a pixel portion, the pixel portion comprising display pixels in m rows and n columns and image-capture pixels in x rows and y columns (m, n, x and y are natural numbers of 4 or more), comprising the steps of:

performing first supply of an image signal of a first color for the display pixels in first to k-th rows sequentially (k is a natural number of less than m/2) in a period;

performing second supply of an image signal of a second color for the display pixels in (k+1)-th to 2k-th rows sequentially in the period;

emitting light of the first color for the display pixels in first to s-th rows and light of the second color for the display pixels in (k+1)-th to (k+s)-th rows (s is a natural number of k/2 or less) in the period and after the first supply for the display pixels in the first to s-th rows and the second supply for the display pixels in the (k+1)-th to (k+s)-th rows are finished;

performing a first image capture utilizing light of the first color in the image-capture pixels in first to v-th rows sequentially (v is a natural number of x/4 or less) while emitting the light of the first color to obtain an image of the first color; and performing a second image capture utilizing light of the second color in the image-capture pixels in (w+1)-th to (w+v)-th rows sequentially (w is a natural number greater than or equal to 2v and less than or equal to x/2) while emitting the light of the second color to obtain an image of the second color, wherein the first color and the second color are different from each other, wherein the first supply and the second supply are performed concurrently, wherein the first image capture and the second image capture are performed concurrently, wherein the first light sources emit light of the first color, wherein the second light sources emit light of the second color, wherein the liquid crystal display device further comprises a first image-capture signal line and a second image-capture signal line which are parallel to each other and provided for each column of the image-capture pixels, wherein in each column, the image-capture pixels in the first to v-th rows are connected to the first image-capture signal line and the image-capture pixels in the (w+1)-th to (w+v)-th rows are connected to the second image-capture signal line, wherein the first image capture is performed by determining a potential of the first image-capture signal line by the detection circuit and the second image capture is performed by determining a potential of the second image-capture signal line by the detection circuit, wherein the pixel portion comprises a first region which includes the display pixels in the first to k-th rows and the image-capture pixels in the first to v-th rows and a second region which includes the display pixels in the (k+1)-th to 2k-th rows and the image-capture pixels in the (w+1)-th to (w+v)-th rows, and wherein the second region includes the first image-capture signal line and the second image-capture signal line.

2. A method for driving a liquid crystal display device comprising first light sources, second light sources, infrared light sources, a detection circuit, an image sensor driver circuit, a scan line driver circuit and a pixel portion, the pixel portion comprising display pixels in m rows and n columns and image-capture pixels in x rows and y columns (m, n, x and y are natural numbers of 4 or more), comprising the steps of:

performing first supply of an image signal of a first color for the display pixels in first to k-th rows sequentially (k is a natural number of less than m/2) in a period;

performing second supply of an image signal of a second color for the display pixels in (k+1)-th to 2k-th rows sequentially in the period;

emitting light of the first color for the display pixels in first to s-th rows and light of the second color for the display pixels in (k+1)-th to (k+s)-th rows (s is a natural number of k/2 or less) in the period and after the first supply for the display pixels in the first to s-th rows and the second supply for the display pixels in the (k+1)-th to (k+s)-th rows are finished;

performing a first image capture utilizing light of the first color and light whose wavelength is in infrared region in the image-capture pixels in first to v-th rows sequentially (v is a natural number of x/4 or less) while lighting the first light sources and the infrared light sources; and performing a second image capture utilizing light of the second color and light whose wavelength is in infrared region in the image-capture pixels in (w+1)-th to (w+v)-th rows sequentially (w is a natural number greater than or equal to 2v and less than or equal to x/2) while lighting the second light sources and the infrared light sources, wherein the first color and the second color are different from each other, wherein an image of the first color is obtained by the first image capture and an image of the second color is obtained by the second image capture, wherein the first supply and the second supply are performed concurrently, wherein the first light sources emit light of the first color, wherein the second light sources emit light of the second color, wherein the first image capture and the second image capture are performed concurrently, wherein the liquid crystal display device further comprises a first image-capture signal line and a second image-capture signal line which are parallel to each other and provided for each column of the image-capture pixels, wherein in each column, the image-capture pixels in the first to v-th rows are connected to the first image-capture signal line and the image-capture pixels in the (w+1)-th to (w+v)-th rows are connected to the second image-capture signal line, wherein the first image capture is performed by determining a potential of the first image-capture signal line by the detection circuit and the second image capture is performed by determining a potential of the second image-capture signal line by the detection circuit, wherein the pixel portion comprises a first region which includes the display pixels in the first to k-th rows and the image-capture pixels in the first to v-th rows and a second region which includes the display pixels in the (k+1)-th to 2k-th rows and the image-capture pixels in the (w+1)-th to (w+v)-th rows, and wherein the second region includes the first image-capture signal line and the second image-capture signal line.

3. The method for driving the liquid crystal display device according to claim 2, further comprising the steps of:

performing a third image capture in the image-capture pixels in the first to v-th rows sequentially while light of the first light sources, the second light sources and the infrared light sources is not emitted;

performing a fourth image capture in the image-capture pixels in the (w+1)-th to (w+v)-th rows sequentially while light of the first light sources, the second light sources and the infrared light sources is not emitted;

generating a data of a difference between an image data of the first image capture and an image data of the third image capture; and generating a data of a difference between an image data of the second image capture and an image data of the fourth image capture.

4. The method for driving the liquid crystal display device according to claim 3, wherein the third image capture and the fourth image capture are concurrently performed.

5. The method for driving the liquid crystal display device according to claim 1, further comprising the steps of:

performing a third image capture in the image-capture pixels in the first to v-th rows sequentially while light of the first light sources and the second light sources is not emitted;

performing a fourth image capture in the image-capture pixels in the (w+1)-th to (w+v)-th rows sequentially while light of the first light sources and the second light sources is not emitted;

generating a data of a difference between an image data of the first image capture and an image data of the third image capture; and generating a data of a difference between an image data of the second image capture and an image data of the fourth image capture.

6. The method for driving the liquid crystal display device according to claim 5, wherein the third image capture and the fourth image capture are concurrently performed.

7. The method for driving the liquid crystal display device according to claim 1, wherein the liquid crystal display device further comprises a first image signal line and a second image signal line provided for each n columns of the display pixels, wherein in each column, the display pixels in the first to k-th rows are connected to the first image signal line and the display pixels in (k+1)-th to 2k-th rows are connected to the second image signal line, and wherein the first supply of the image signal of the first color is performed using the first image-capture signal line and the second supply of the image signal of the second color is performed using the second image signal line.

8. The method for driving the liquid crystal display device according to claim 2, wherein the liquid crystal display device further comprises a first image signal line and a second image signal line provided for each column of the display pixels, wherein in each column, the display pixels in the first to k-th rows are connected to the first image signal line and the display pixels in (k+1)-th to 2k-th rows are connected to the second image signal line, and wherein the first supply of the image signal of the first color is performed using the first image-capture signal line and the second supply of the image signal of the second color is performed using the second image signal line.

9. The method for driving the liquid crystal display device according to claim 1, wherein each of the display pixels includes a first transistor whose gate is connected to the scan line driver circuit, and wherein each of the image-capture pixels includes a photodiode electrically connected to the image sensor driver circuit, a second transistor whose gate is electrically connected to the photodiode, and a third transistor one of a source and a drain of which is electrically connected to one of a source and a drain of the second transistor, the other of the source and the drain of which is electrically connected to the detection circuit and a gate of which is electrically connected to the image sensor driver circuit.

10. The method for driving the liquid crystal display device according to claim 9, wherein at least one of the first transistor, the second transistor and the third transistor comprises an oxide semiconductor layer.

11. The method for driving the liquid crystal display device according to claim 2, wherein each of the display pixels includes a first transistor whose gate is connected to the scan line driver circuit, and wherein each of the image-capture pixels includes a photodiode electrically connected to the image sensor driver circuit, a second transistor whose gate is electrically connected to the photodiode, and a third transistor one of a source and a drain of which is electrically connected to one of a source and a drain of the second transistor, the other of the source and the drain of which is electrically connected to the detection circuit and a gate of which is electrically connected to the image sensor driver circuit.

12. The method for driving the liquid crystal display device according to claim 11, wherein at least one of the first transistor, the second transistor and the third transistor comprises an oxide semiconductor layer.

* * * * *